(12) United States Patent
Cheng et al.

(10) Patent No.: US 12,107,087 B2
(45) Date of Patent: Oct. 1, 2024

(54) SEMICONDUCTOR DEVICE WITH GATE ISOLATION STRUCTURE AND METHOD FOR FORMING THE SAME

(71) Applicant: Taiwan Semiconductor Manufacturing Company, Ltd., Hsin-Chu (TW)

(72) Inventors: Jung-Chien Cheng, Tainan (TW); Kuo-Cheng Chiang, Hsinchu County (TW); Shi Ning Ju, Hsinchu (TW); Guan-Lin Chen, Hsinchu County (TW); Chih-Hao Wang, Hsinchu (TW); Kuan-Lun Cheng, Hsin-Chu (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 392 days.

(21) Appl. No.: 17/364,500

(22) Filed: Jun. 30, 2021

(65) Prior Publication Data
US 2022/0139914 A1    May 5, 2022

Related U.S. Application Data

(60) Provisional application No. 63/107,630, filed on Oct. 30, 2020.

(51) Int. Cl.
*H01L 21/306* (2006.01)
*H01L 21/8234* (2006.01)
(Continued)

(52) U.S. Cl.
CPC ............ *H01L 27/0924* (2013.01); *H01L 21/823418* (2013.01); *H01L 21/823431* (2013.01);
(Continued)

(58) Field of Classification Search
None
See application file for complete search history.

(56) References Cited

U.S. PATENT DOCUMENTS

| 8,772,109 B2 | 7/2014 | Colinge |
| 8,785,285 B2 | 7/2014 | Tsai et al. |

(Continued)

FOREIGN PATENT DOCUMENTS

| KR | 20190112910 A | 10/2019 |
| KR | 20190140647 A | 12/2019 |

*Primary Examiner* — Joseph C. Nicely
*Assistant Examiner* — Lamont B Koo
(74) *Attorney, Agent, or Firm* — HAYNES AND BOONE, LLP

(57) ABSTRACT

Semiconductor structures and the manufacturing method thereof are disclosed. An exemplary manufacturing method includes providing a workpiece including a substrate, an isolation feature over the substrate, a first fin-shaped structure protruding through the isolation feature, and a second fin-shaped structure protruding through the isolation feature, forming a dielectric fin between the first and second fin-shaped structures, and forming first and second gate structures over the first and second fin-shaped structures, respectively. The exemplary manufacturing method also includes etching the isolation feature from the backside of the workpiece to form a trench exposing the dielectric fin, etching the dielectric fin from the backside of the workpiece to form an extended trench, and depositing a seal layer over the extended trench. The seal layer caps an air gap between the first and second gate structures.

20 Claims, 64 Drawing Sheets

(51) Int. Cl.
*H01L 27/092* (2006.01)
*H01L 29/06* (2006.01)
*H01L 29/66* (2006.01)
*H01L 29/78* (2006.01)

(52) U.S. Cl.
CPC .. *H01L 21/823481* (2013.01); *H01L 29/0649* (2013.01); *H01L 29/66795* (2013.01); *H01L 29/7851* (2013.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2018/0308743 A1 | 10/2018 | Cheng et al. |
| 2019/0378903 A1 | 12/2019 | Jeon et al. |
| 2020/0044045 A1 | 2/2020 | Wang |
| 2020/0105869 A1 | 4/2020 | Loubet et al. |
| 2020/0126798 A1 | 4/2020 | Lin et al. |
| 2020/0219970 A1 | 7/2020 | Mannebach et al. |
| 2020/0235013 A1* | 7/2020 | Lilak ............. H01L 21/30604 |
| 2020/0243666 A1 | 7/2020 | Ching et al. |
| 2020/0328208 A1 | 10/2020 | Chiang et al. |

\* cited by examiner

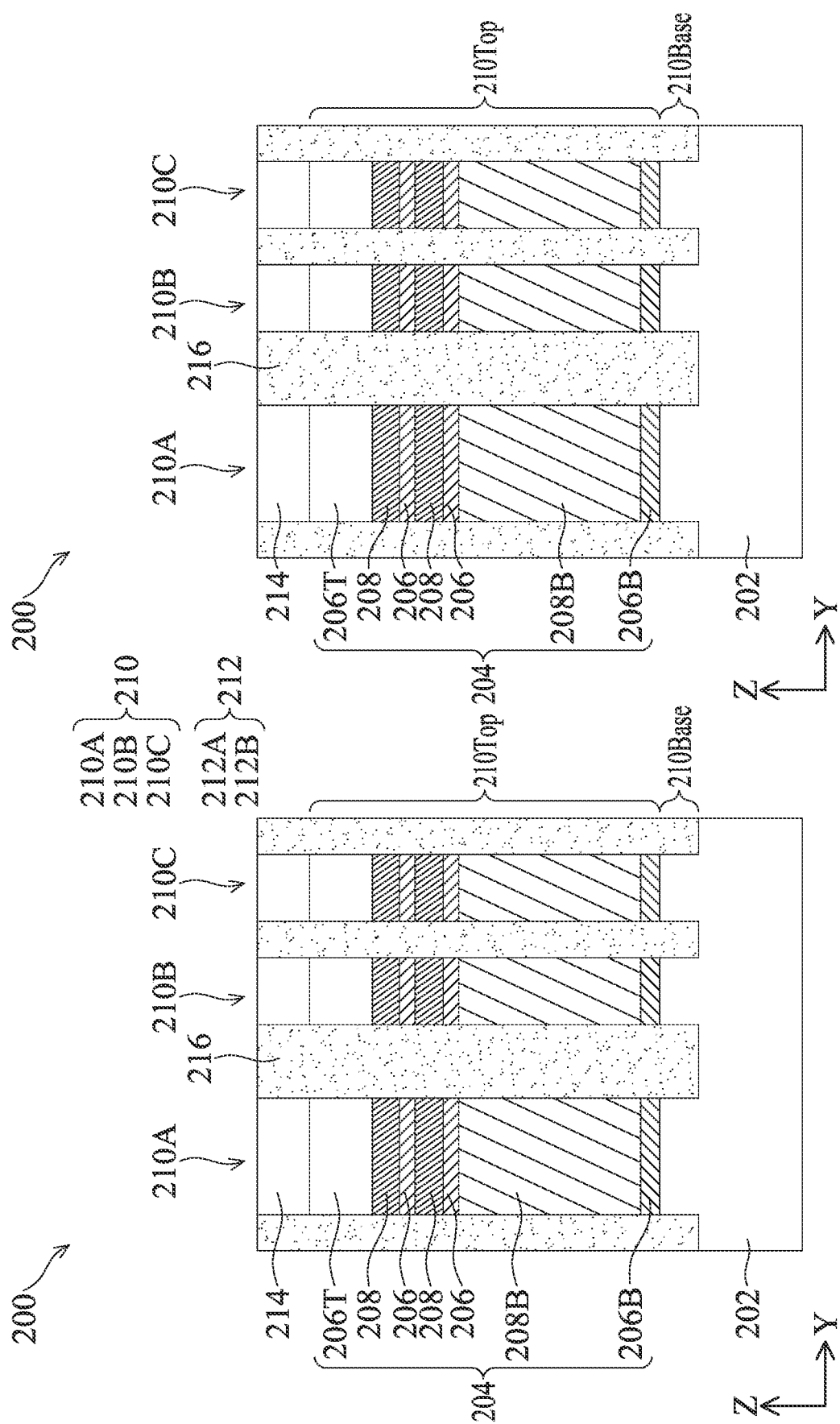

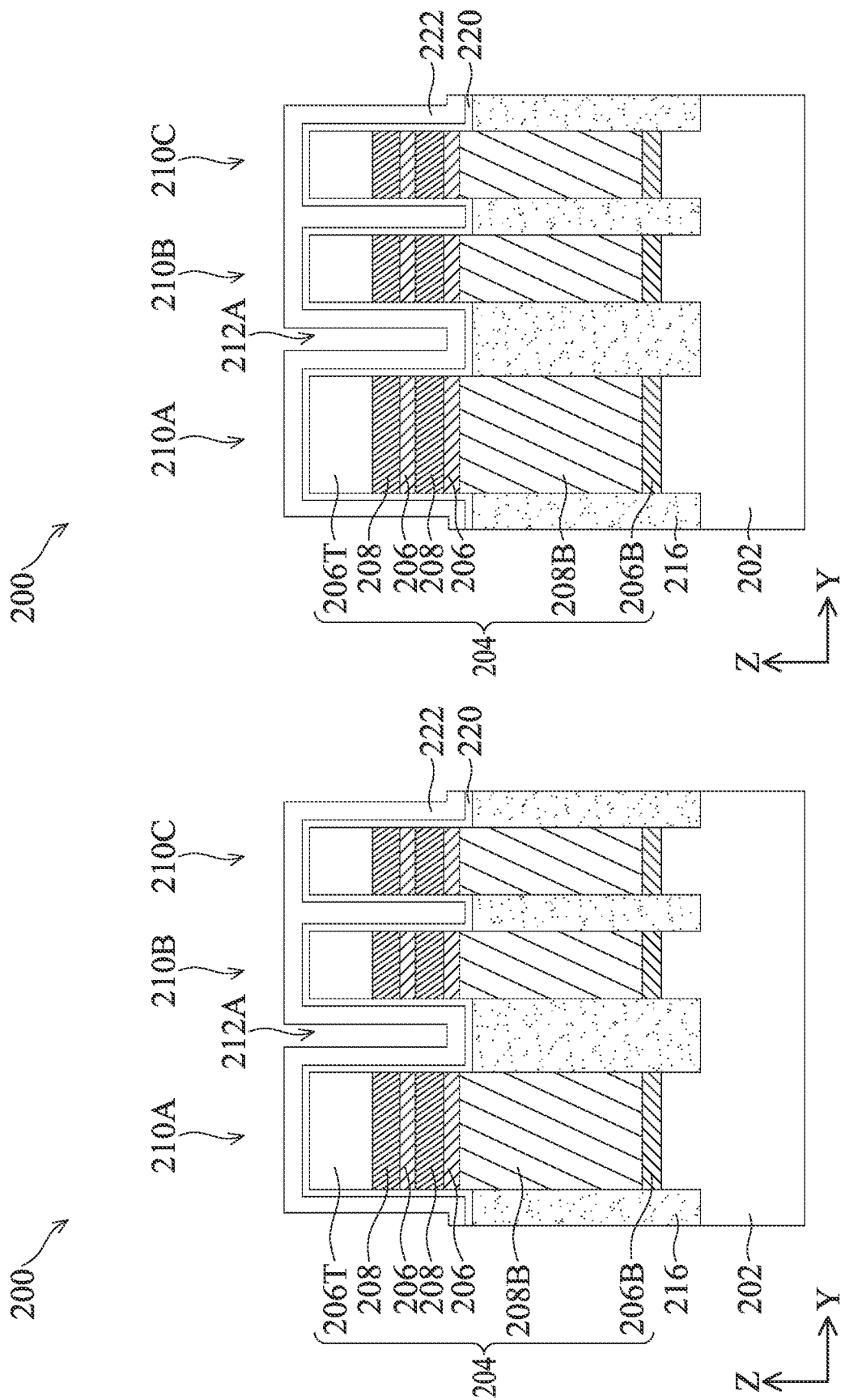

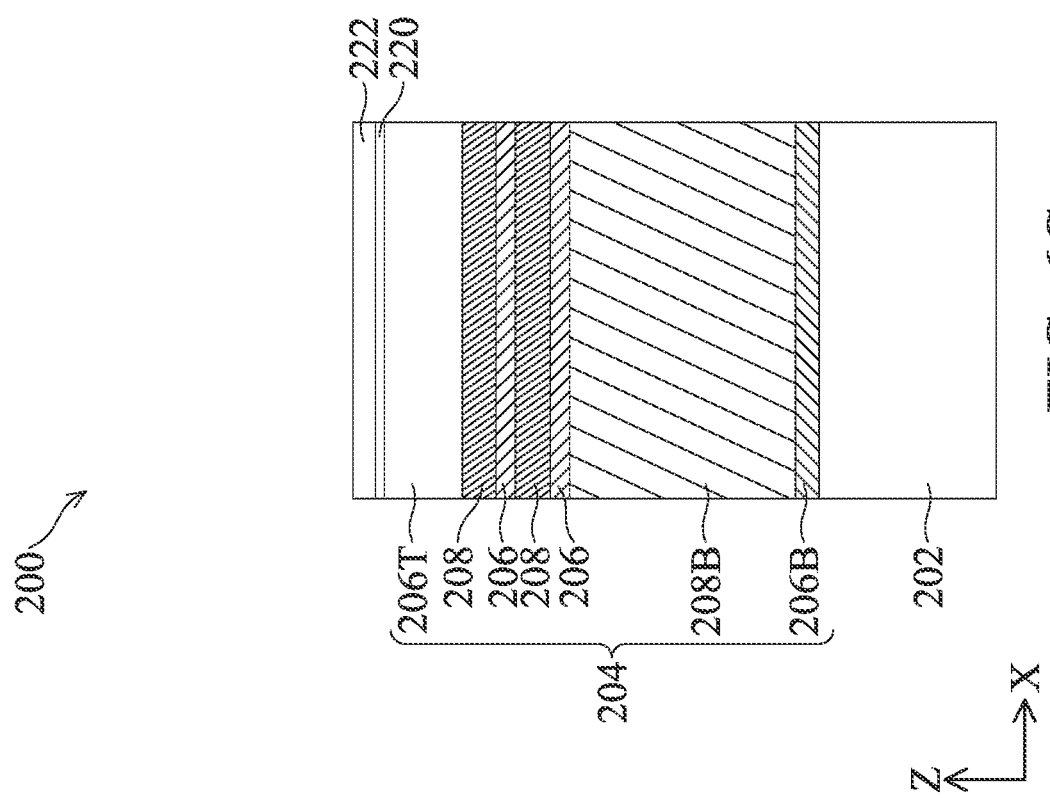

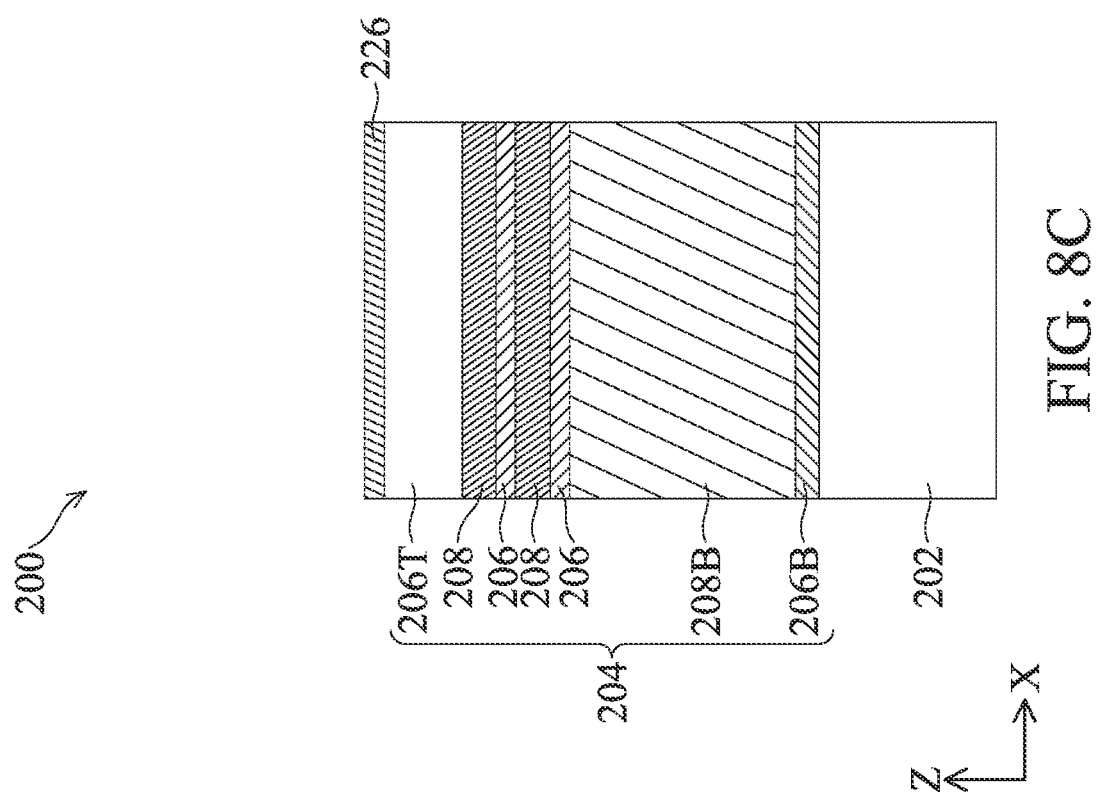

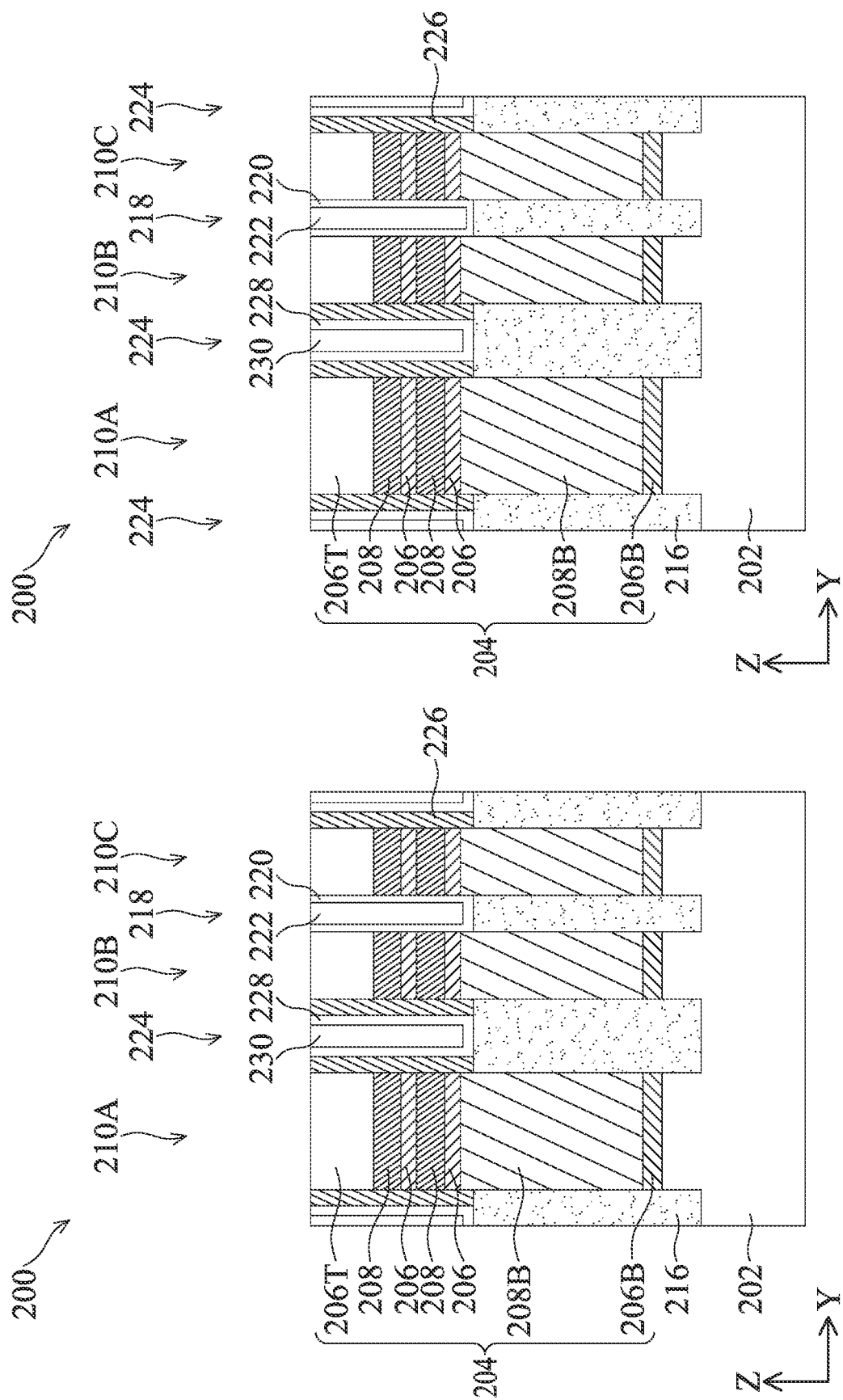

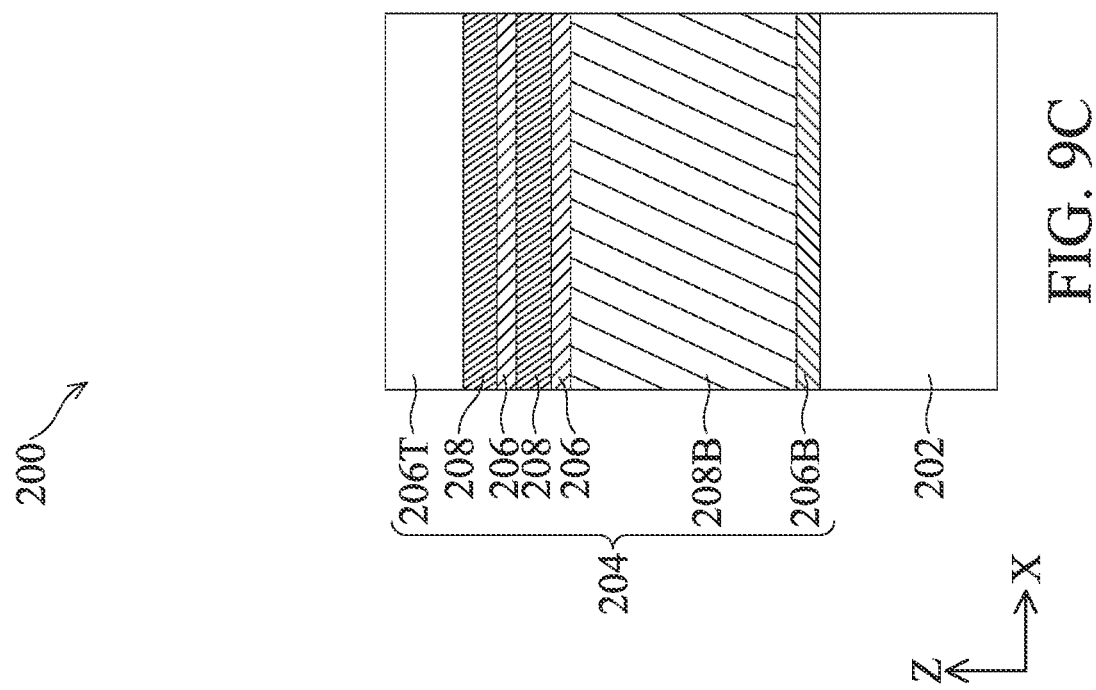

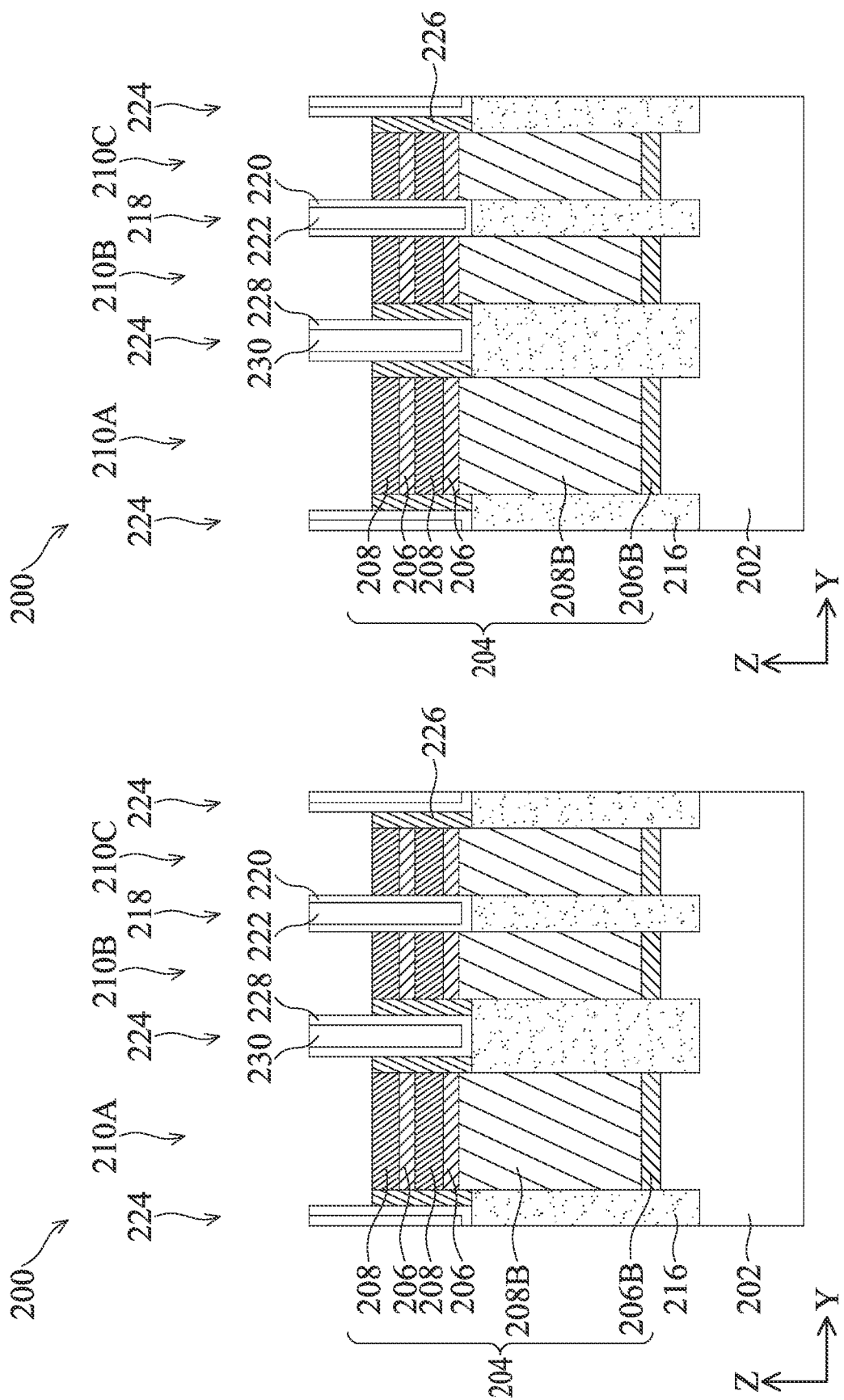

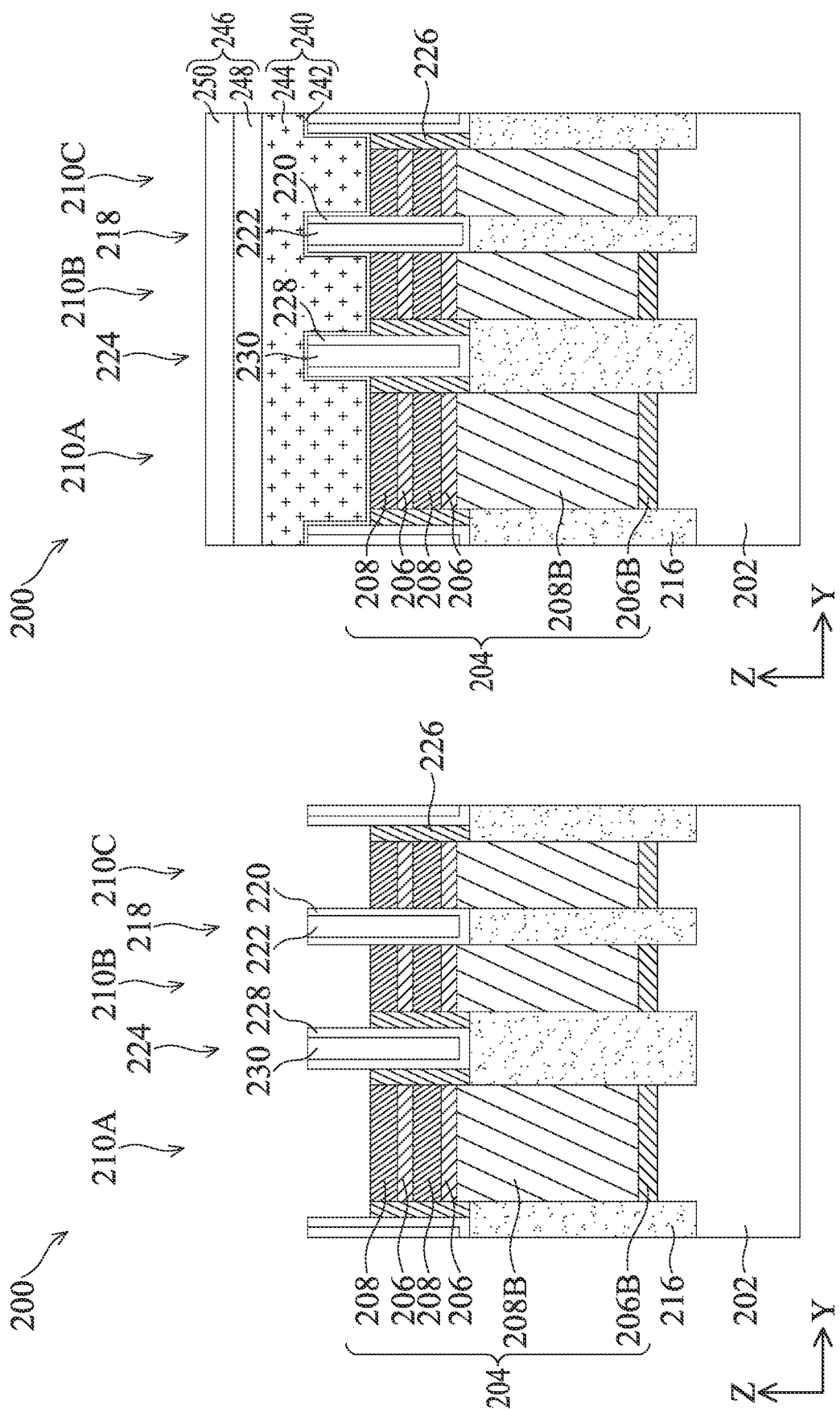

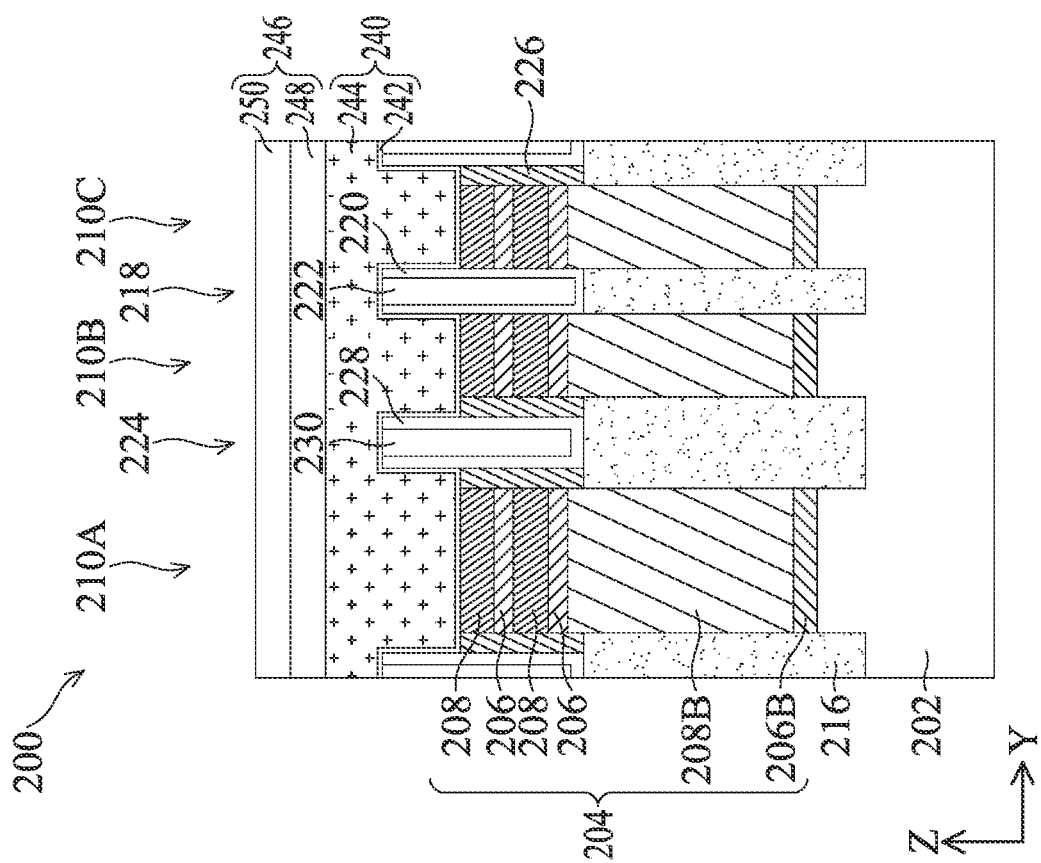
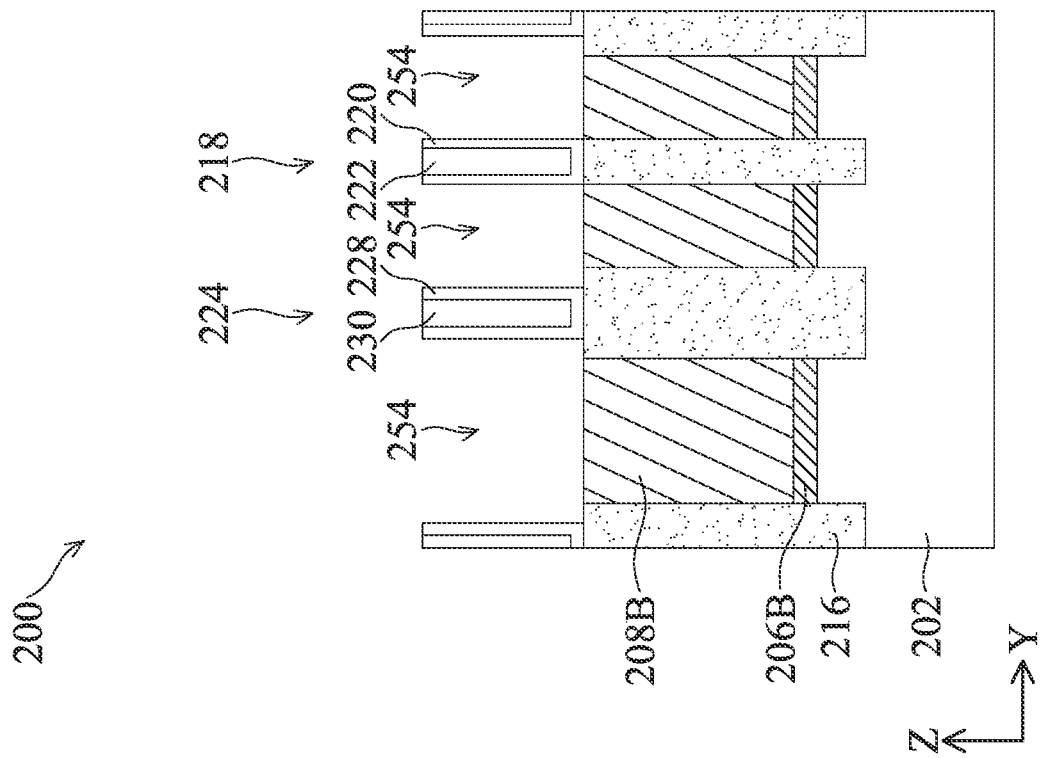
FIG. 12B
FIG. 12A

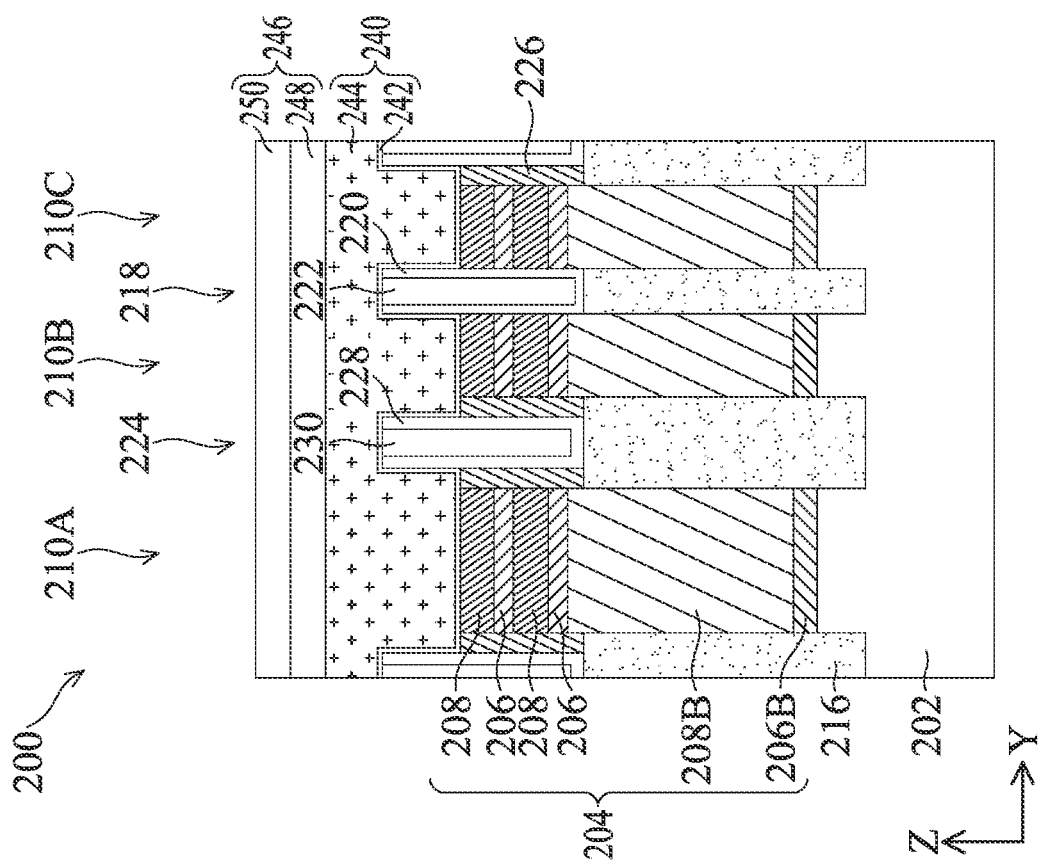
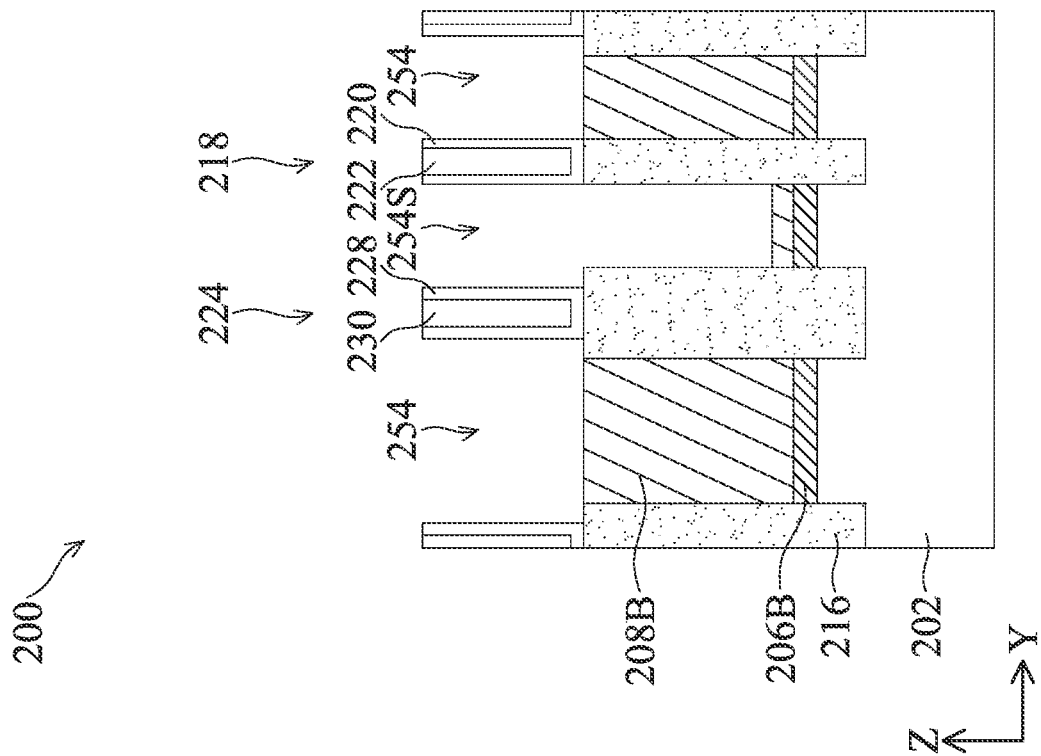
FIG. 13B
FIG. 13A

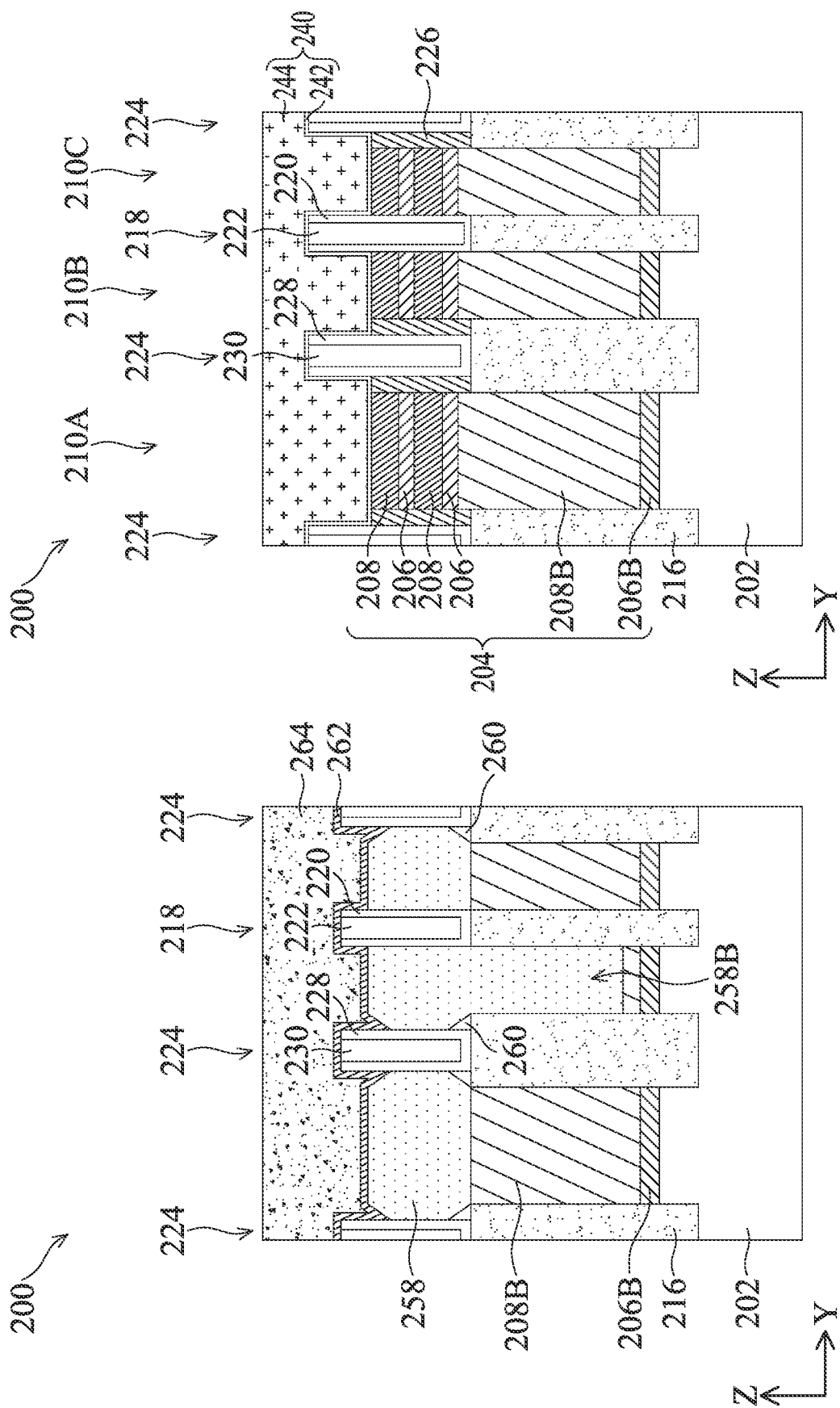

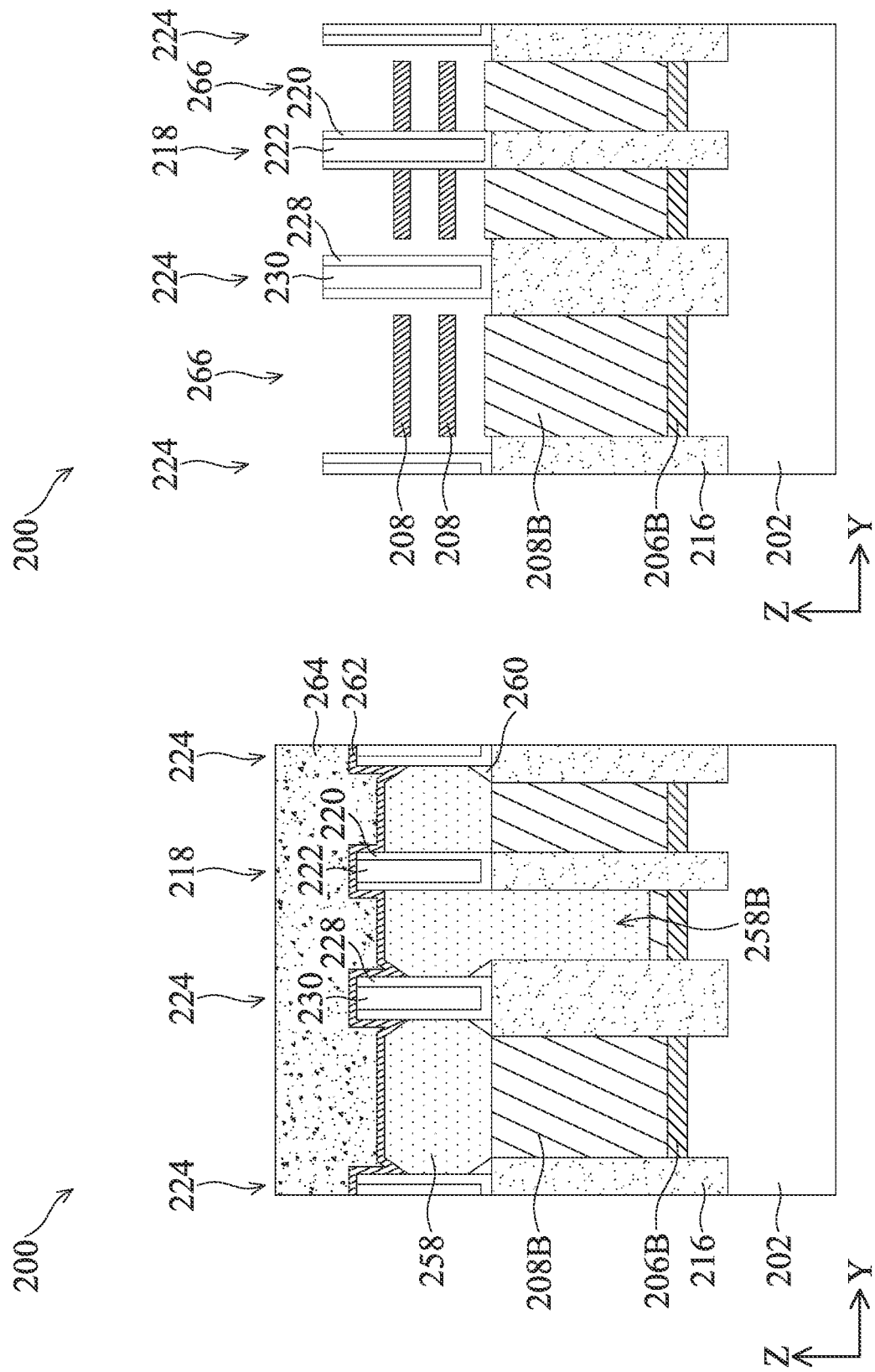

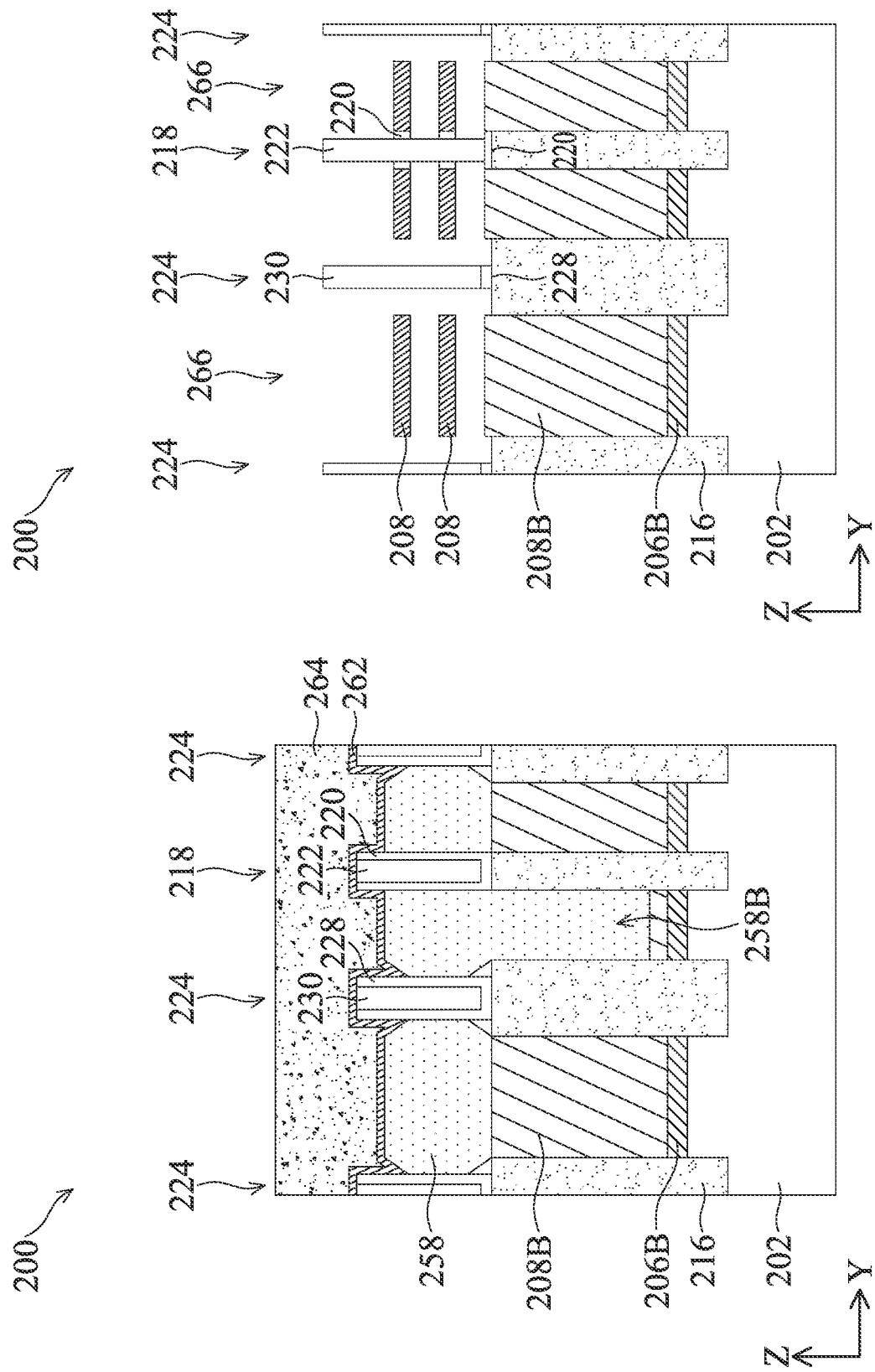

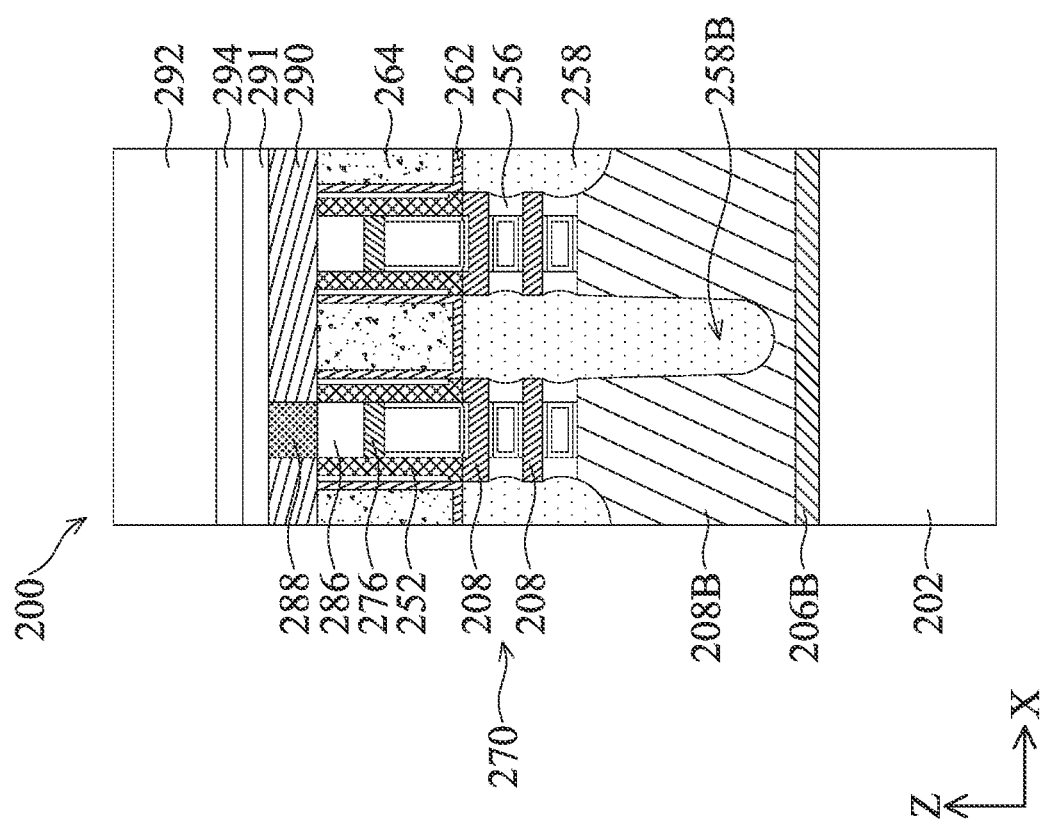

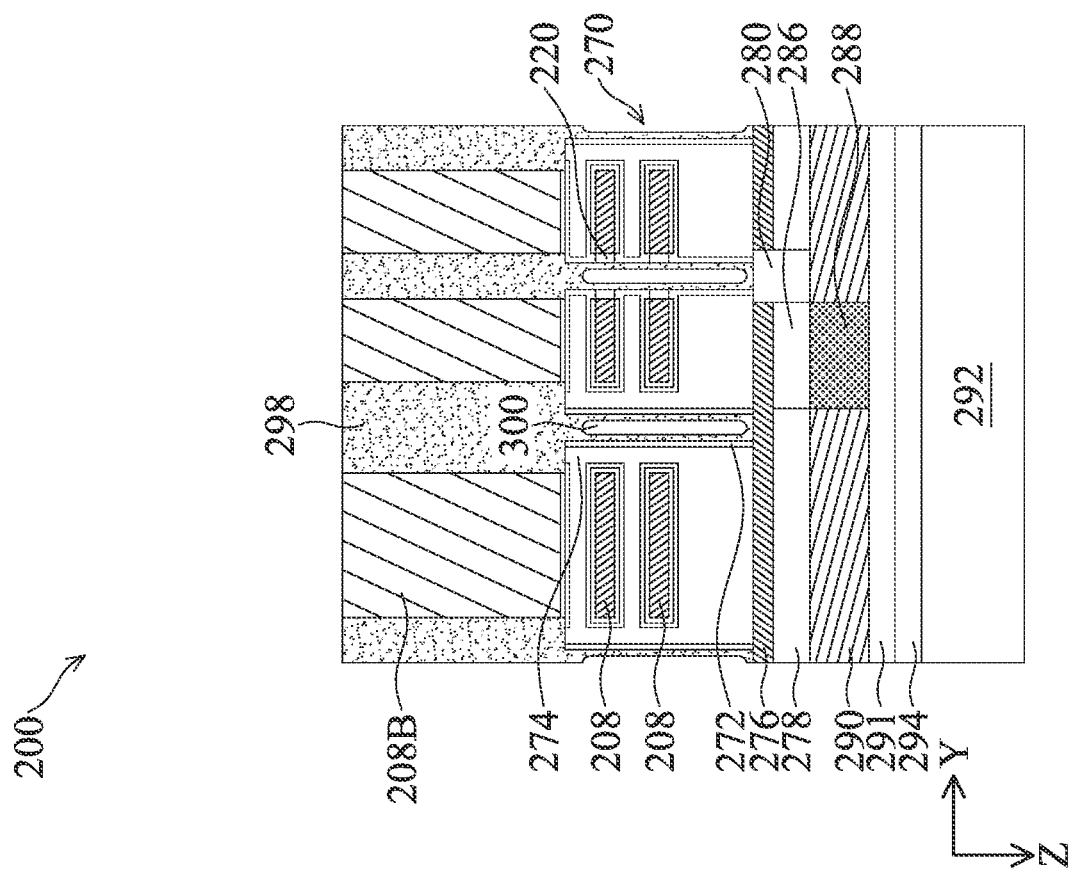
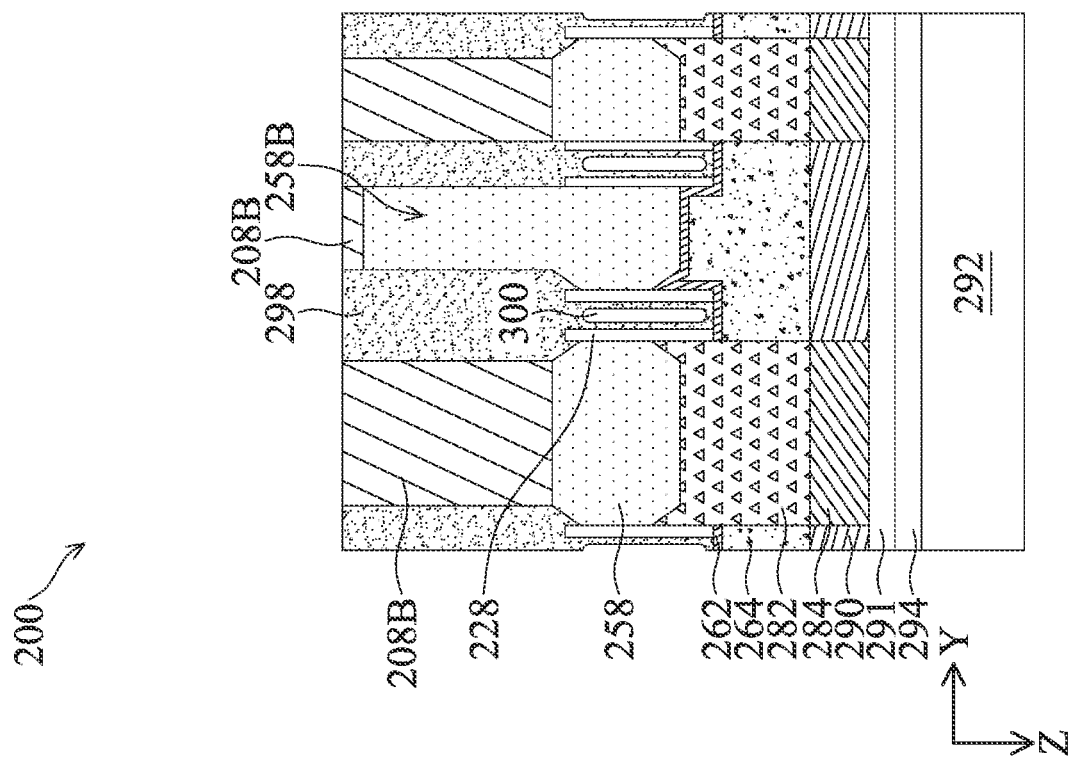
FIG. 24B
FIG. 24A

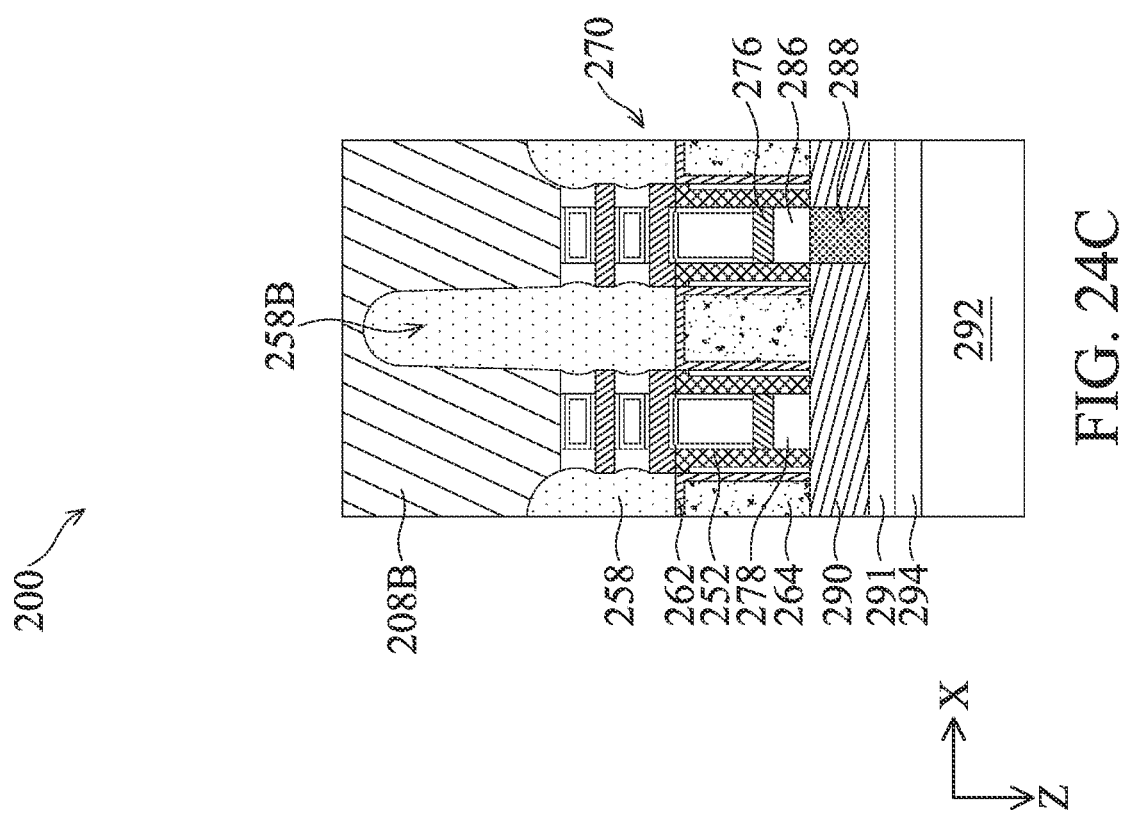

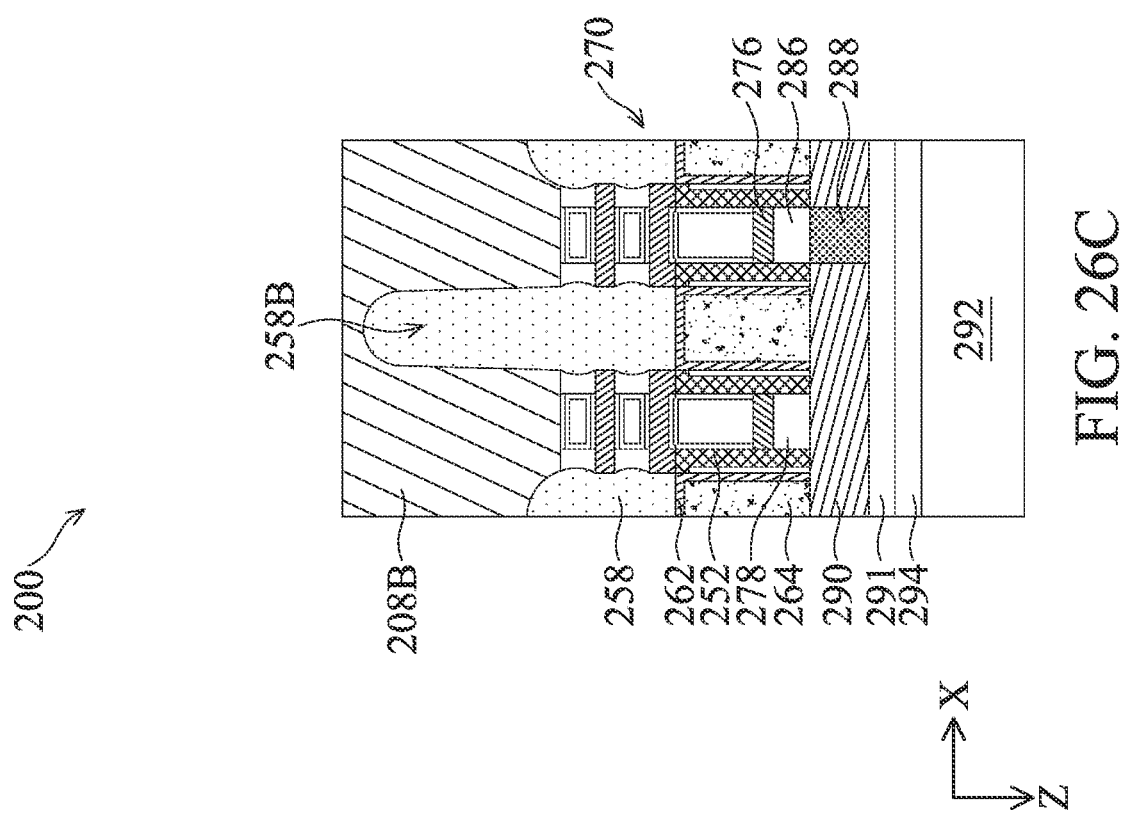

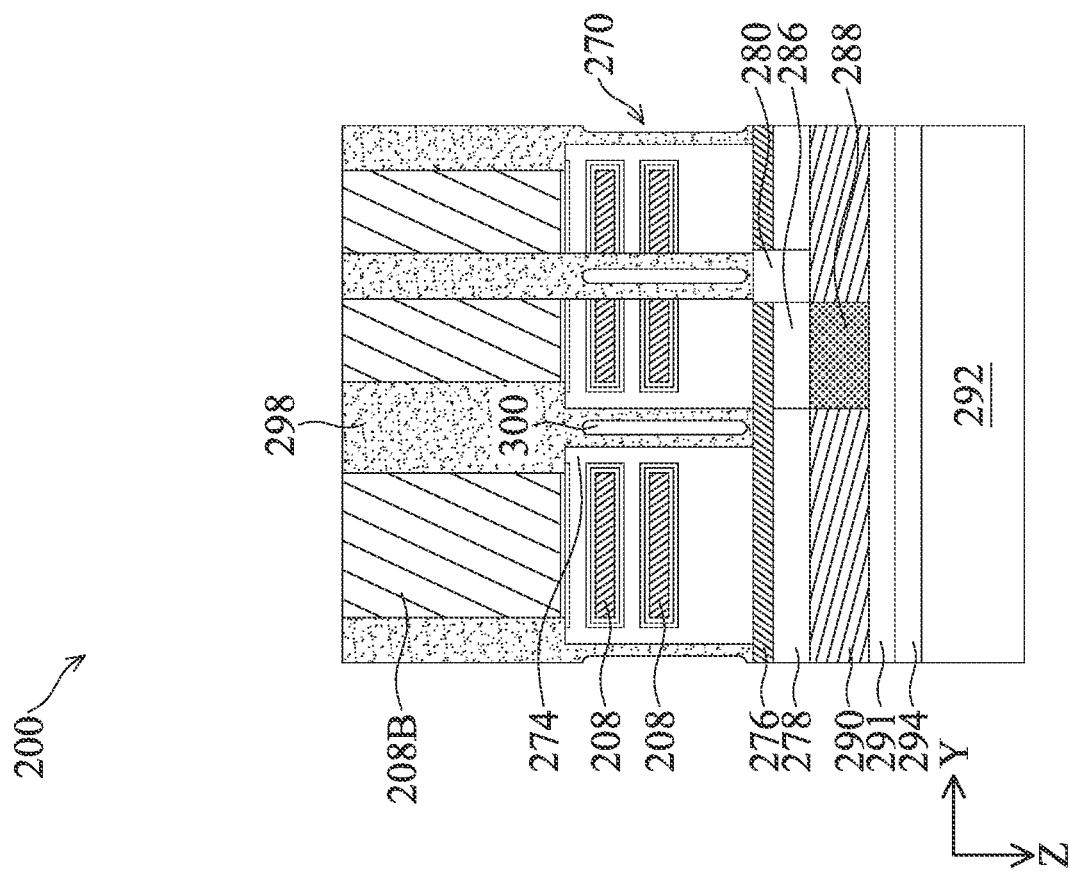
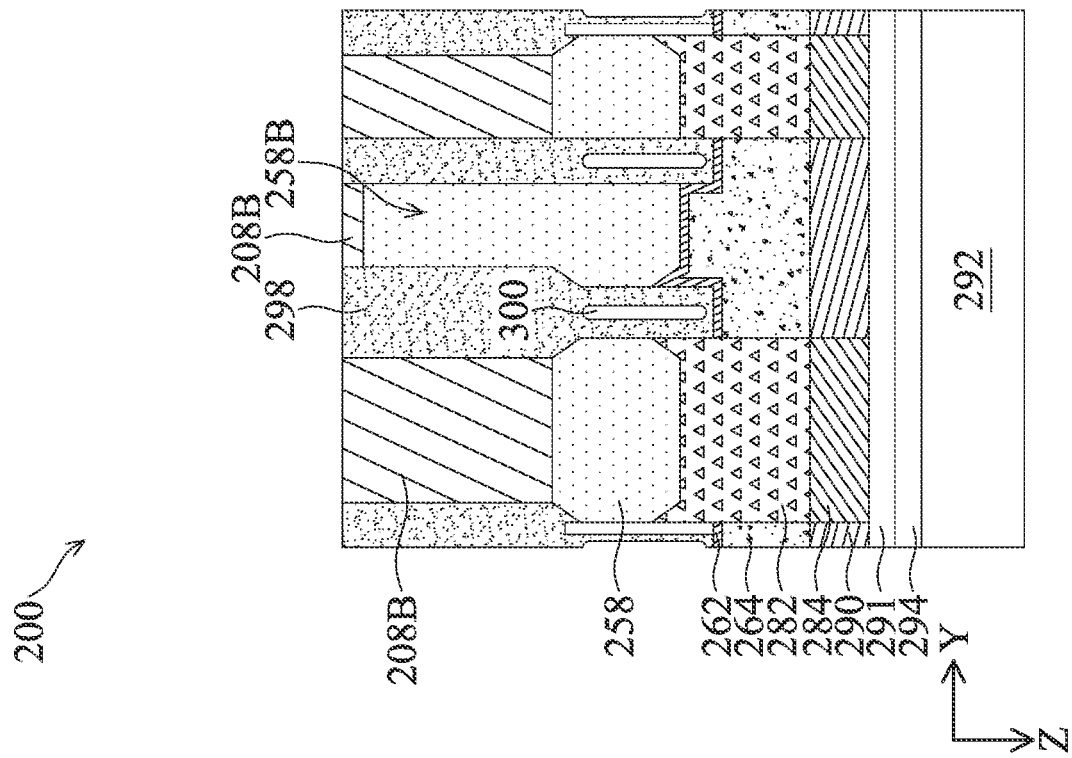
FIG. 27B
FIG. 27A

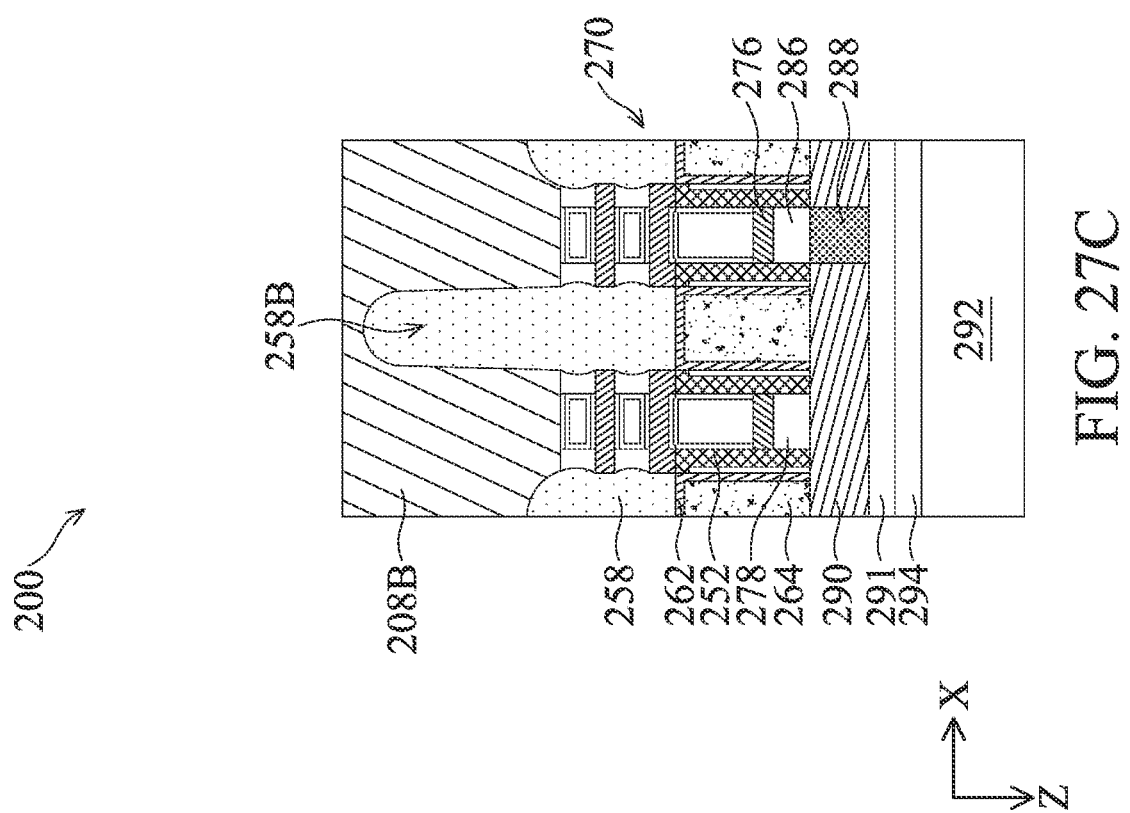

SEMICONDUCTOR DEVICE WITH GATE ISOLATION STRUCTURE AND METHOD FOR FORMING THE SAME

PRIORITY DATA

This application claims priority to U.S. Provisional Patent Application No. 63/107,630, filed on Oct. 30, 2020, entitled "Semiconductor Device With Gate Isolation Structure And Method For Forming The Same", the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as IC technologies progress towards smaller technology nodes, multi-gate metal-oxide-semiconductor field effect transistors (multi-gate MOSFETs, or multi-gate devices) have been introduced to improve gate control by increasing gate-channel coupling, reducing off-state current, and reducing short-channel effects (SCEs). A multi-gate device generally refers to a device having a gate structure (also known as gate stack), or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate structure on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

To continue to provide the desired scaling and increased density for MBC transistors in smaller technology nodes, dielectric fins (also known as hybrid dielectric fins or hybrid fins) have been introduced to provide isolation between gate structures. With further reducing gate critical dimensions (CDs), parasitic capacitance between gate structures may degrade device performance, such as circuit speed and cross-talk coupling, even with dielectric fins made of low-k dielectric material. Measures to improve isolation between gate structures of MBC transistors may face challenges in forming isolation structures while further reducing parasitic capacitance. While existing semiconductor devices are generally adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A, 2B, 2C, 3A, 3B, 3C, 4A, 4B, 4C, 5A, 5B, 5C, 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, 21C, 22A, 22B, 22C, 23A, 23B, 23C, 24A, 24B, 24C, 25A, 25B, 25C, 26A, 26B, 26C, 27A, 27B, 27C, 28A, 28B, 28C, 29A, 29B, 29C, 30A, 30B, 30C, 31A, 31B, 31C, 32A, 32B, 32C illustrate fragmentary cross-sectional views of a workpiece during various fabrication stages in the method of FIGS. 1A and 1B, according to one or more aspects of the present disclosure.

DETAILED DESCRIPTION

Figure 1A:
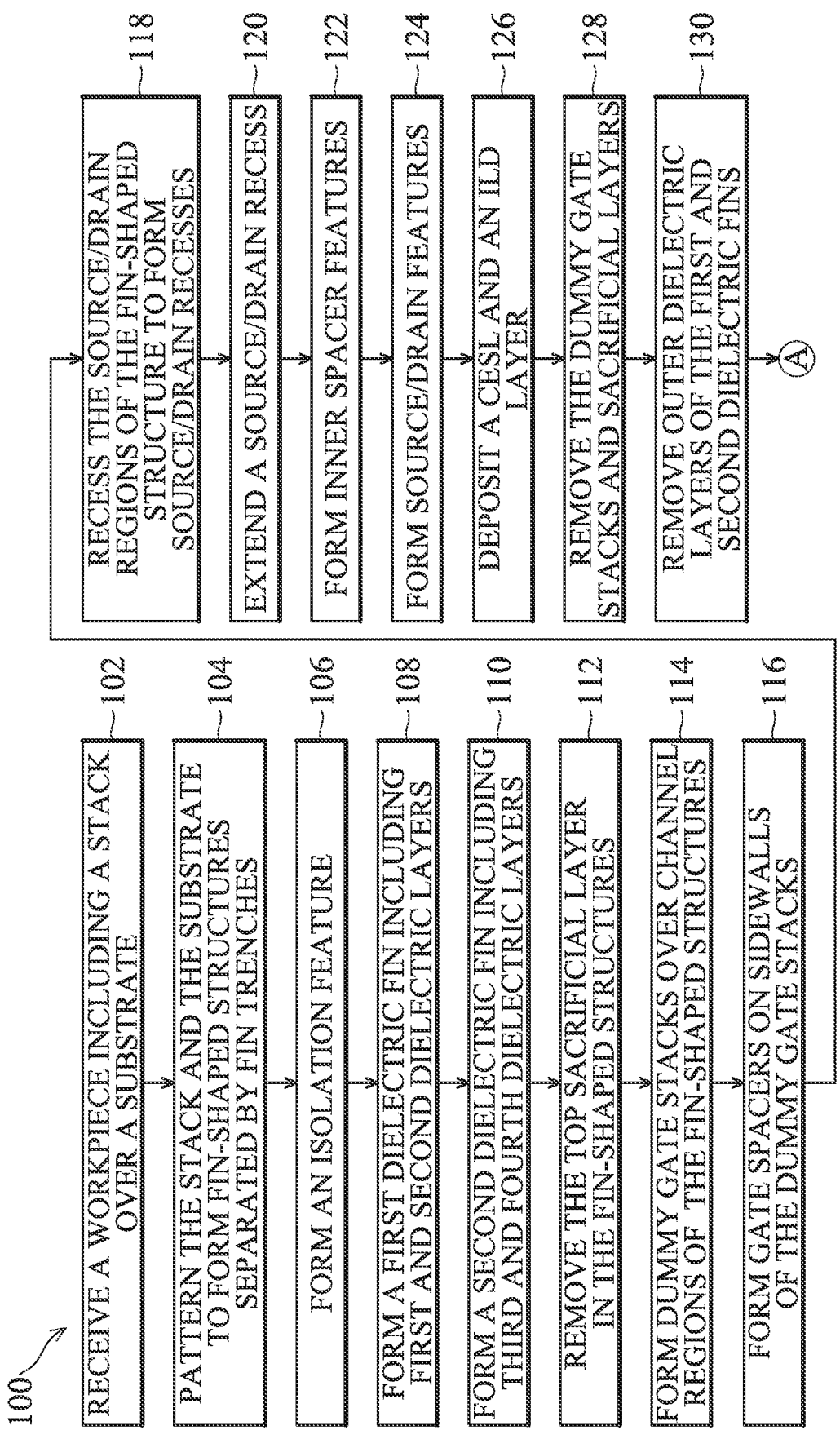
FIGS. 1A and 1B illustrate a flowchart of an example method for making a semiconductor device, according to one or more aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to an air-gap-containing isolation structure to improve isolation between gate structures with reduced parasitic capacitance.

To improve drive current to meet design needs, MBC transistors may include nanoscale channel members that are thin and wide. Such MBC transistors may also be referred to as nanosheet transistors. While nanosheet transistors are able to provide satisfactory drive current and channel control, their wide nanosheet channel members may make it challenging to reduce cell sizes. In some example structures, fish-bone structures or fork-sheet structures may be implemented to reduce cell dimensions. In a fish-bone structure or a fork-sheet structure, adjacent stacks of channel members may be divided by dielectric fins (also known as hybrid dielectric fins or hybrid fins). Regardless of the fish-bone or fork-sheet structures, close proximity between the channel members leads to close proximity between the gate structures (also known as gate stacks) engaging respective channel members and thus high parasitic capacitance between gate structures.

Even though low-k dielectric material or extreme low-k dielectric material has been introduced to form dielectric fins as gate isolation structures, with further reducing gate CDs, parasitic capacitance still imposes a challenge to further device performance, such as circuit speed and cross-talk coupling. Besides using a low-k or extreme low-k dielectric material, another approach is to implement air gap(s), which is provided in the form of an air-gap-containing gate isolation structure. Even a small air gap near metal features may result in a significant improvement in an overall effective dielectric constant (k); for example, an air gap from about 35% to about 40% in volume between adjacent metal features may reduce parasitic capacitance by approximately 15%. As used herein, the term "air gap" is used to describe a void defined by surrounding substantive features, where a void may contain air, nitrogen, ambient gases, gaseous chemicals used in fabrication processes, or combinations thereof.

Figure 1B:
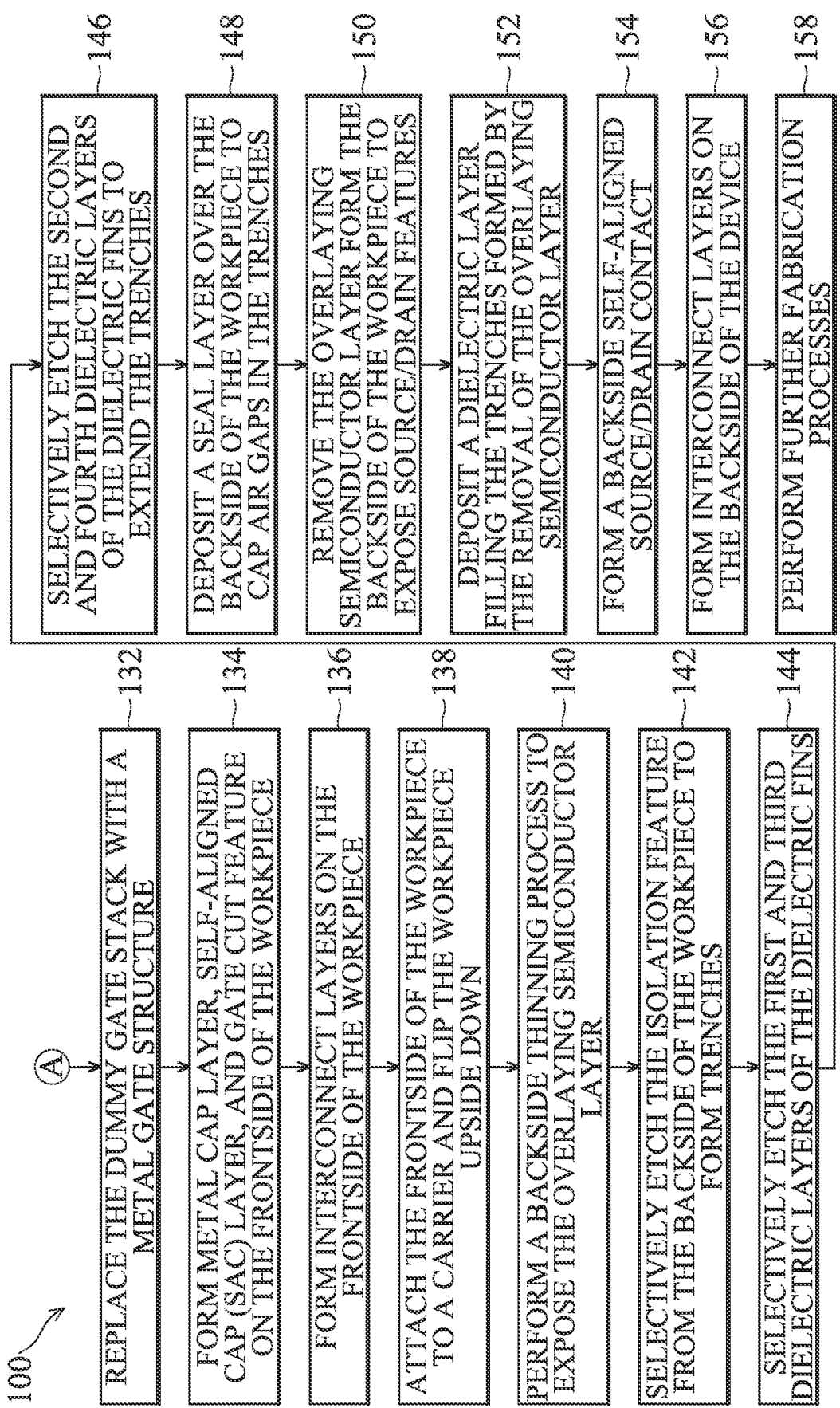

The various aspects of the present disclosure will now be described in more detail with reference to the figures. FIGS. 1A and 1B collectively illustrate a flowchart of a method 100 of forming a semiconductor device. The method 100 is merely an example and is not intended to limit the present disclosure to what is explicitly illustrated in the method 100. Additional steps may be provided before, during and after the method 100, and some steps described can be replaced, eliminated, or moved around for additional embodiments of the method. Not all steps are described herein in detail for reasons of simplicity. The method 100 is described below in conjunction with FIGS. 2A-32C, which illustrate fragmentary cross-sectional views of a workpiece 200 at different stages of fabrication according to embodiments of the method 100. Because a semiconductor device will be formed from the workpiece 200, the workpiece 200 may be referred to as a semiconductor device 200 or a device 200 as the context requires. For better illustration of various aspects of the present disclosure, each of the figures ending with the capital letter A illustrates a fragmentary cross-sectional view of a source/drain region (i.e., a cut in a Y-Z plane in a source region or a drain region that is perpendicular to the lengthwise direction of channel members) of the to-be-formed transistor(s), each of the figures ending with the capital letter B illustrates a fragmentary cross-sectional view in a channel region (i.e., a cut in a Y-Z plane in a channel region along the lengthwise direction of gate structures and perpendicular to the lengthwise direction of channel members) of the to-be-formed transistor(s), and each of the figures ending with the capital letter C illustrates a fragmentary cross-sectional view along the lengthwise direction of channel members (i.e., a cut in an X-Z plane along the lengthwise direction of channel members and through a channel region and abutting source/drain regions) of the to-be-formed transistor(s). Throughout FIGS. 2A-32C, the X direction, the Y direction, and the Z direction are perpendicular to one another and are used consistently. Additionally, throughout the present disclosure, like reference numerals are used to denote like features. Although embodiments that include fish-bone or fork-sheet transistors are illustrated in the figures, the present disclosure is not so limited and may be applicable to other multi-gate devices, such as other types of MBC transistors or FinFETs.

Figure 2B:
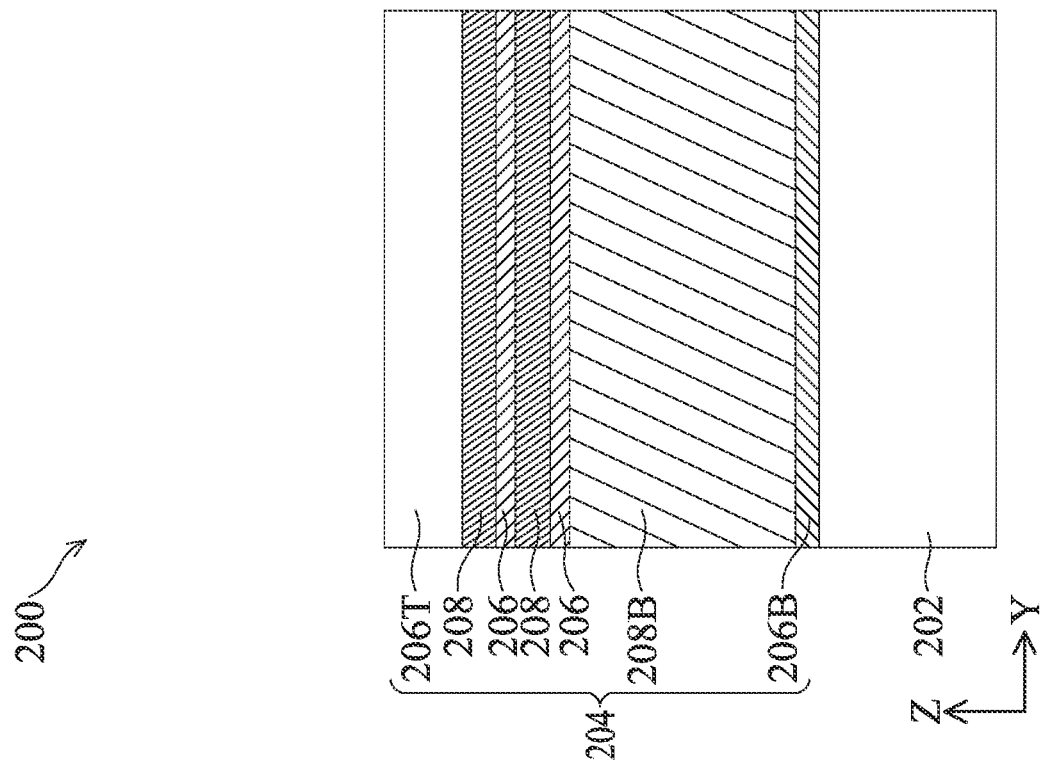
Figure 2A:
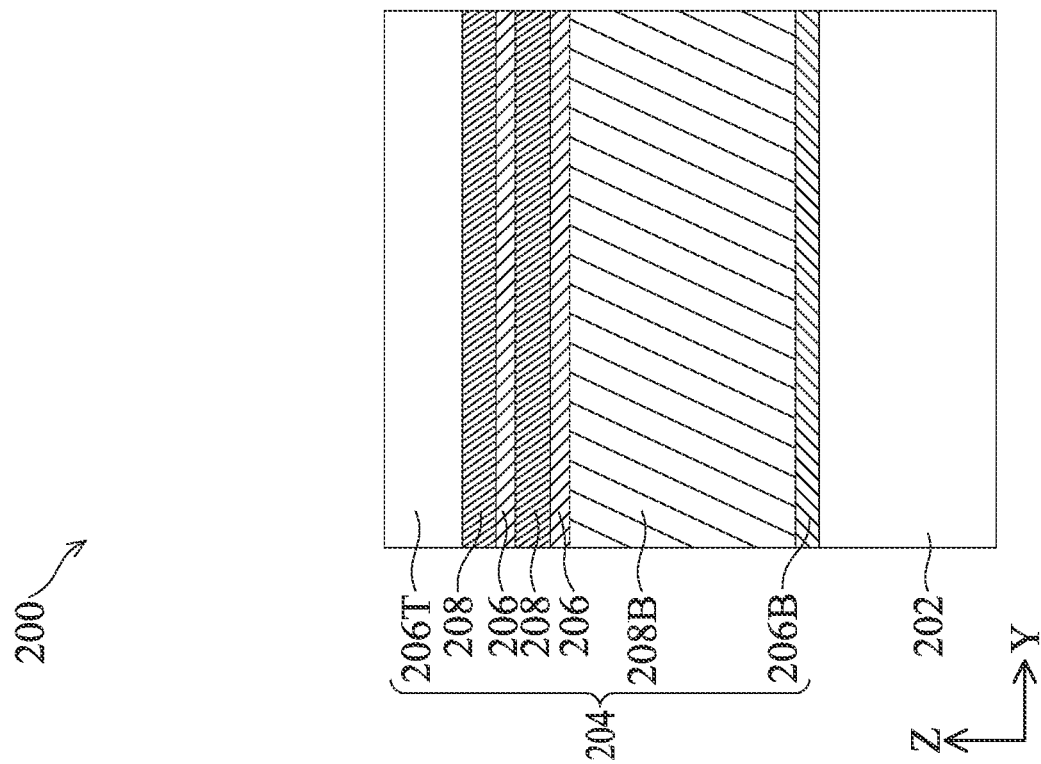
Figure 2C:
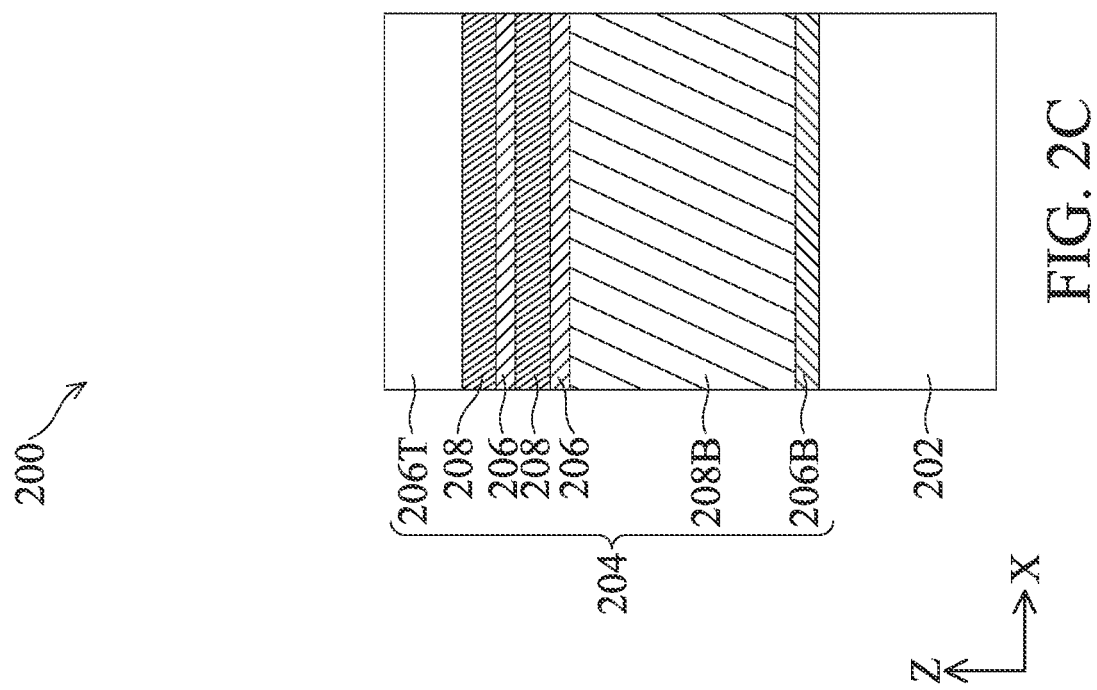

Referring to FIGS. 2A-2C, the method 100 includes a block 102 (FIG. 1A) where a workpiece 200 is received. The workpiece 200 includes a substrate 202 and a stack 204 disposed on the substrate 202. In one embodiment, the substrate 202 may be a silicon (Si) substrate. In some other embodiments, the substrate 202 may include other semiconductor materials such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may include multiple n-type well regions and multiple p-type well regions. A p-type well region may be doped with a p-type dopant (i.e., boron (B)). An n-type well region may be doped with an n-type dopant (i.e., phosphorus (P) or arsenic (As)).

In some embodiments represented in FIGS. 2A-2C, the stack 204 may include a bottom sacrificial layer 206B over the substrate 202, an overlaying semiconductor layer 208B over the bottom sacrificial layer 206B, alternating channel layers 208 and sacrificial layers 206 over the overlaying semiconductor layer 208B, and a top sacrificial layer 206T over the sacrificial layers 206 and the channel layers 208. The bottom sacrificial layer 206B, the overlaying semiconductor layer 208B, the top sacrificial layer 206T, the sacrificial layers 206, and the channel layers 208 may be deposited using an epitaxial process. Example epitaxial process may include vapor-phase epitaxy (VPE), ultra-high vacuum CVD (UHV-CVD)), molecular beam epitaxy (MBE), and/or other suitable processes. The channel layers 208 and the sacrificial layers 206 may have different semiconductor compositions. In some implementations, the channel layers 208 are formed of silicon (Si) and sacrificial layers 206 are formed of silicon germanium (SiGe). The additional germanium (Ge) content in the sacrificial layers 206 allow selective removal or recess of the sacrificial layers 206 without substantial damages to the channel layers 208. The sacrificial layers 206 and the channel layers 208 are disposed alternatingly such that the sacrificial layers 206 interleave the channel layers 208. FIGS. 2A-2C illustrate that two (2) layers of the sacrificial layers 206 and two (2) layers of the channel layers 208 are alternately and vertically arranged, which is for illustrative purposes only and not intended to be limiting beyond what is specifically recited in the claims. The number of layers depends on the desired number of channel members 208 for the semiconductor device 200. In some embodiments, the number of the channel layers 208 is between 1 and 6.

The bottom sacrificial layer 206B may be formed of silicon germanium (SiGe). In one embodiment, a germanium content of the bottom sacrificial layer 206B may be the same as a germanium content of the sacrificial layer 206. In another embodiment, different from the sacrificial layers 206, a germanium content of the bottom sacrificial layer 206B may be smaller than a germanium content of the sacrificial layers 206. For example, the germanium content of the sacrificial layers 206 may be between about 20% and about 30% in molar ratio and the germanium content of the bottom sacrificial layer 206B may be about 80% to about 90% of the germanium content of the sacrificial layer 206. In some instances, the germanium content of the bottom sacrificial layer 206B may be between about 16% and about 27% in molar ratio. The bottom sacrificial layer 206B may be thicker than each of the sacrificial layers 206 along the Z direction. In some instances, each of the sacrificial layers 206 may have a thickness between about 4 nm and about 15 nm while the bottom sacrificial layer 206B may have a thickness between about 8 and about 30 nm. As will be described below, the bottom sacrificial layer 206B functions as an etch stop layer or a mechanical grinding stop layer in a device backside thinning process later on.

The overlaying semiconductor layer 208B and the substrate 202 may both include bulk single-crystalline silicon (Si). Alternatively, the overlaying semiconductor layer 208B and the substrate 202 may include the same or different semiconductor compositions, each of which may include but not limited to Si, Ge, SiGe, GaAs, InSb, GaP, GaSb, InAlAs, InGaAs, GaSbP, GaAsSb, InP, or combinations thereof.

Like the sacrificial layers 206, the top sacrificial layer 206T may be formed of silicon germanium (SiGe). In some instances, compositions of the sacrificial layers 206 and the top sacrificial layer 206T are substantially the same. The top sacrificial layer 206T may be thicker than the sacrificial layers 206 and functions to protect the stack 204 from damages during fabrication processes. In some instances, a thickness of the top sacrificial layer 206T may be between about 20 nm and about 40 nm while a thickness of a sacrificial layer 206 may be between about 4 nm and about 15 nm.

Figures 3A, 3B:
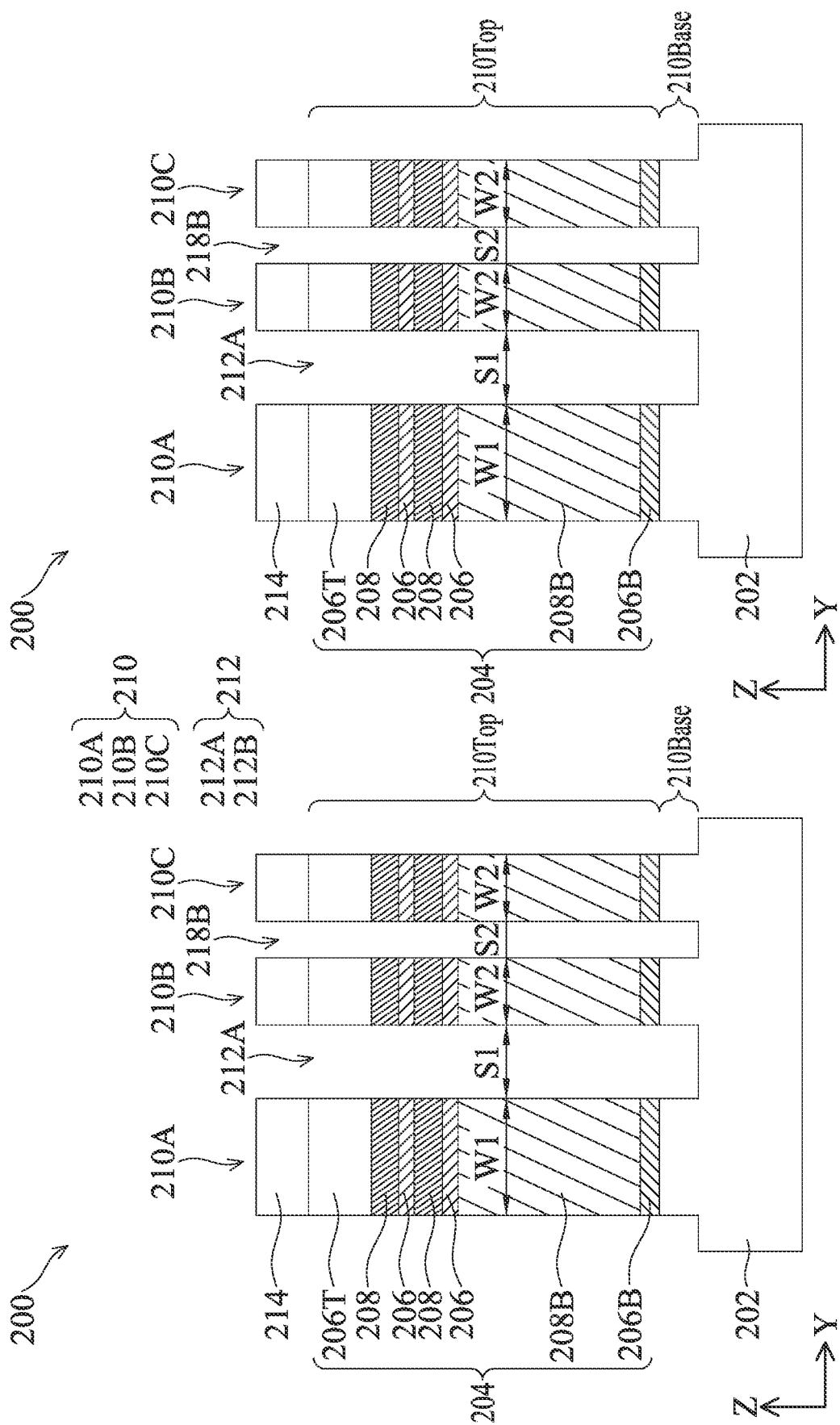
Figure 3C:
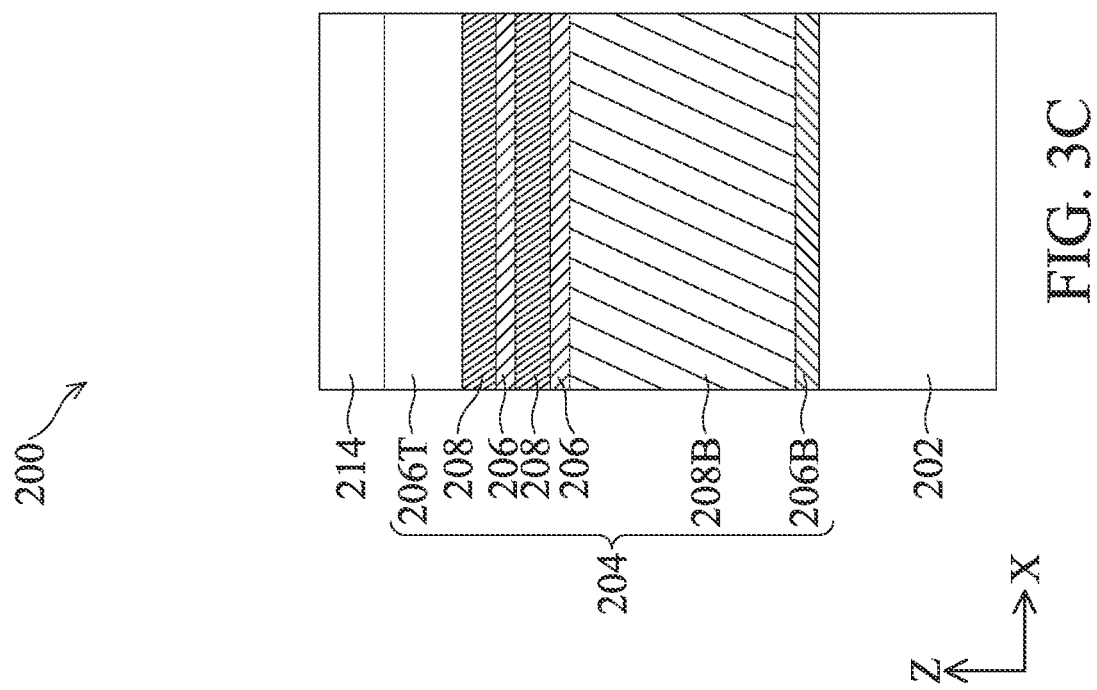

Referring to FIGS. 3A-3C, the method 100 includes a block 104 (FIG. 1A) where the stack 204 and the substrate 202 are patterned to form fin-shaped structures 210 separated by fin trenches 212. To pattern the stack 204 and the substrate 202, a hard mask layer 214 is deposited over the top sacrificial layer 206T. The hard mask layer 214 is then patterned to serve as an etch mask to pattern the top sacrificial layer 206T, the stack 204, and a top portion of the substrate 202. In some embodiments, the hard mask layer 214 may be deposited using CVD, plasma-enhanced CVD (PECVD), atomic layer deposition (ALD), plasma-enhanced ALD (PEALD), or a suitable deposition method. The hard mask layer 214 may be a single layer or a multi-layer. When the hard mask layer 214 is a multi-layer, the hard mask layer 214 may include a pad oxide and a pad nitride layer. In an alternative embodiment, the hard mask layer 214 may include silicon (Si). The fin-shaped structures 210 may be patterned using suitable processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the hard mask layer 214 and then the patterned hard mask layer 214 may be used as an etch mask to etch the stack 204 and the substrate 202 to form fin-shaped structures 210. The etching process can include dry etching, wet etching, reactive ion etching (RIE), and/or other suitable processes.

As shown in FIGS. 3A-3C, each of the fin-shaped structures 210 includes a base portion 210Base formed from a portion of the substrate 202 and a top portion 210Top formed from the stack 204. The top portion 210Top is disposed over the base portion 210Base. The fin-shaped structures 210 extend lengthwise along the X direction and extend vertically along the Z direction from the substrate 202. Along the Y direction, the fin-shaped structures 210 are separated by fin trenches 212. Each of the fin trenches 212 (such as the fin trenches 212A and 212B in the illustrated embodiment) may define the same or different spacings between adjacent fin-shaped structures 210. In the illustrated embodiment, the fin trench 212A is wider than the fin trench 212B along the Y direction to provide a greater spacing. As shown in FIGS. 3A and 3B, the fin trench 212A defines a first spacing S1 and the fin trench 212B defines a second spacing S2. The first spacing S1 is greater than the second spacing S2. In some instances, the first spacing S1 is between about 25 nm and about 40 nm and the second spacing S2 is between about 10 nm and about 25 nm. In various embodiments, a difference between S1 and S2 (S1−S2) is at least 8 nm, which facilitates forming of fish-bone or fork-sheet structures. Similarly, each of the fin-shaped structures 210 (such as the fin-shaped structures 210A, 210B, and 210C in the illustrated embodiment) may have the same or different width. As shown in FIGS. 3A and 3B, the fin-shaped structure 210A has a first width W1 and the fin-shaped structures 210B/210C have a second width W2. The first width W1 is greater than the second width W2. In some instances, the first width W1 is between about 10 nm and about 100 nm and the second width W2 is between about 10 nm and about 40 nm. As will be described below, the narrower fin trenches 212B and the narrower fin-shaped structures 210B/210C jointly allow forming MBC transistors with stacks of channel members in fish-bone structures or fork-sheet structures, while the wider fin trenches 212A and the wider fin-shaped structure 210A jointly allow forming MBC transistors with nanosheet channel members.

Figure 4C:
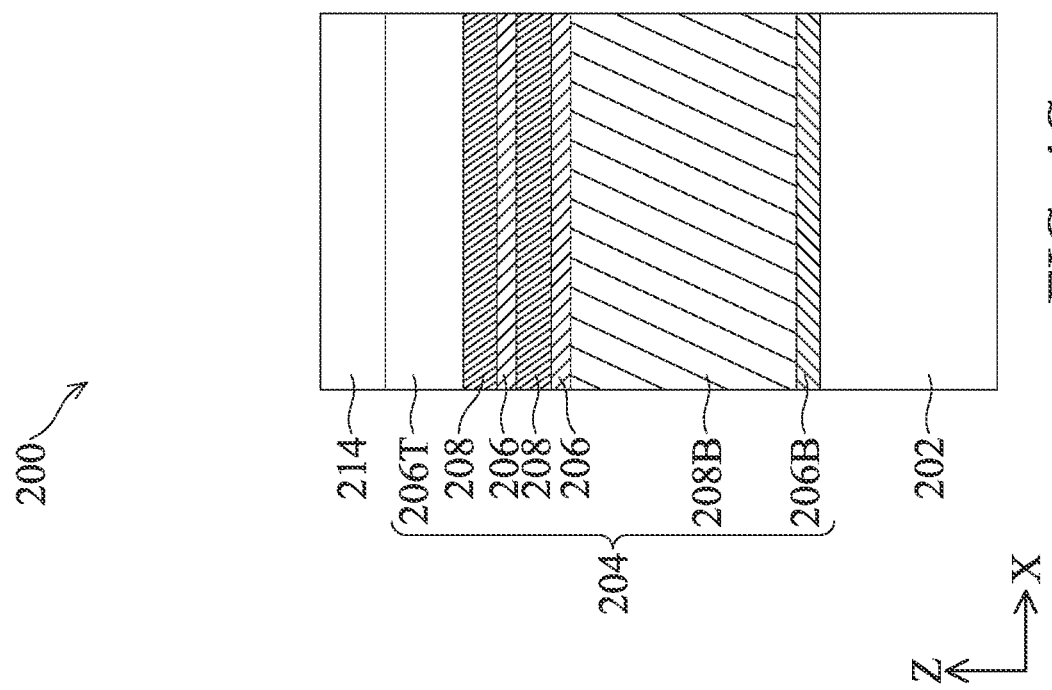
Figures 5A, 5B:
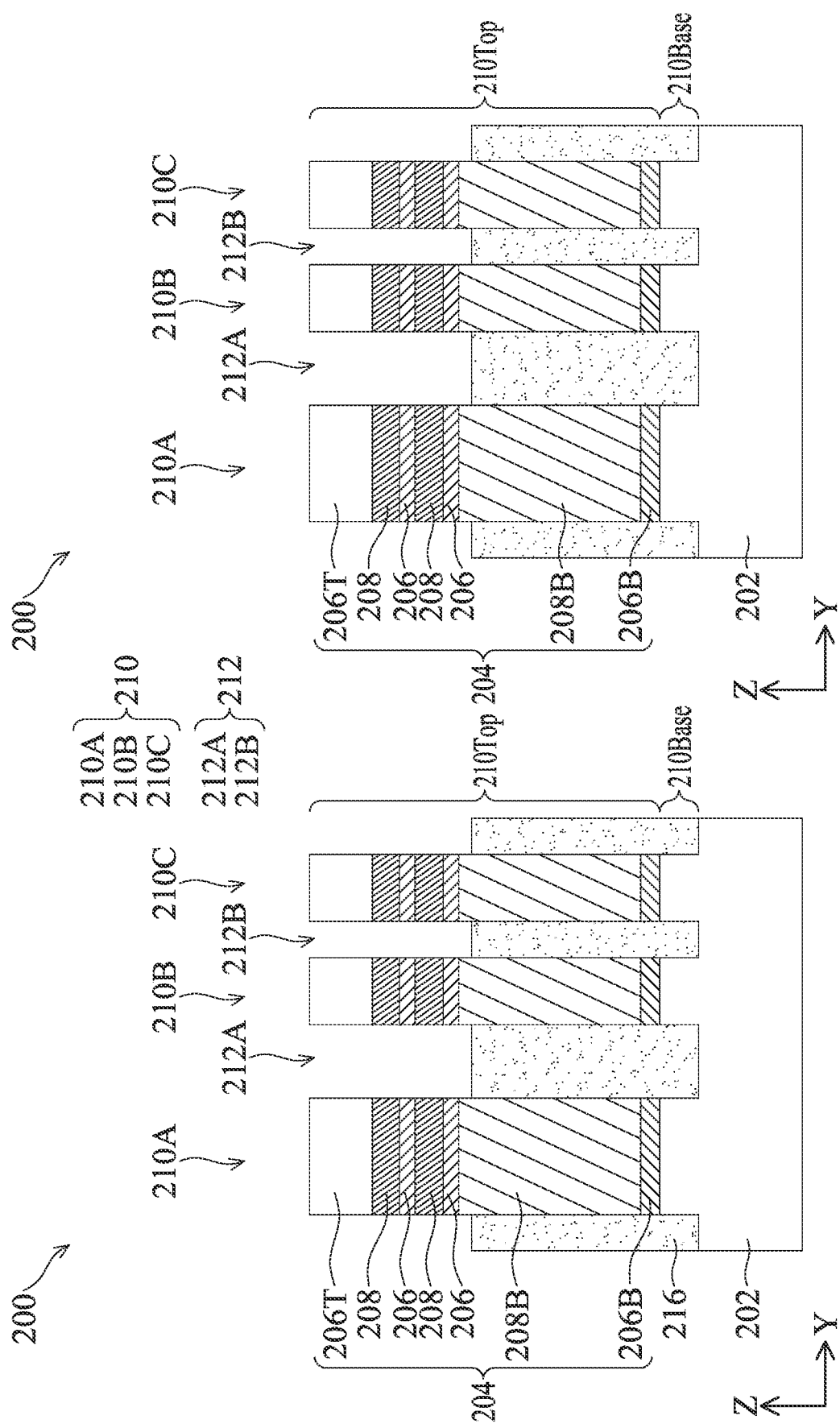
Figure 5C:
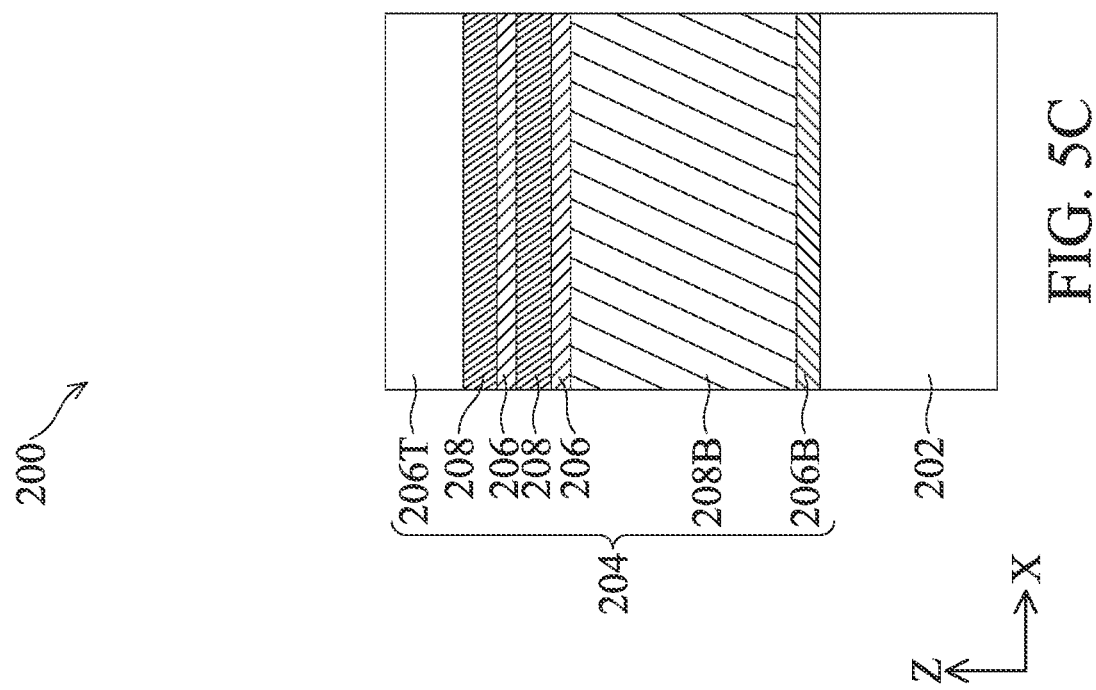

Referring to FIGS. 4A-4C and 5A-5C, the method 100 includes a block 106 (FIG. 1A) where an isolation feature 216 is formed in the fin trenches 212. The isolation feature 216 may be referred to as a shallow trench isolation (STI) feature 216. In an example process to form the isolation feature 216, a dielectric material is deposited over the workpiece 200, filling the fin trenches 212 with the dielectric material. In some embodiments, the dielectric material may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In various examples, at block 106, the dielectric material may be deposited by flowable CVD (FCVD), spin-on coating, and/or other suitable process. The deposited dielectric material is then thinned and planarized, for example by a chemical mechanical polishing (CMP) process, until the hard mask layer 214 is exposed, as shown in FIGS. 4A-4C. After the planarization, the deposited dielectric material is recessed in an etching-back process until the top portions 210Top of the fin-shaped structures 210, particularly the sacrificial layers 206 and the channel layers 208, rise above the isolation feature 216. The hard mask layer 214 may also be removed in the etching-back process. In the illustrated embodiment, a top portion of the overlaying semiconductor layer 208B may also rise above the isolation feature 216, as shown in FIGS. 5A-5C. At this point, the base portions 210Base, the bottom sacrificial layer 206B and a bottom portion of the overlaying semiconductor layer 208B, are surrounded by the isolation features 216. The isolation feature 216 reduces the depths of the fin trenches 212.

Figures 7A, 7B:
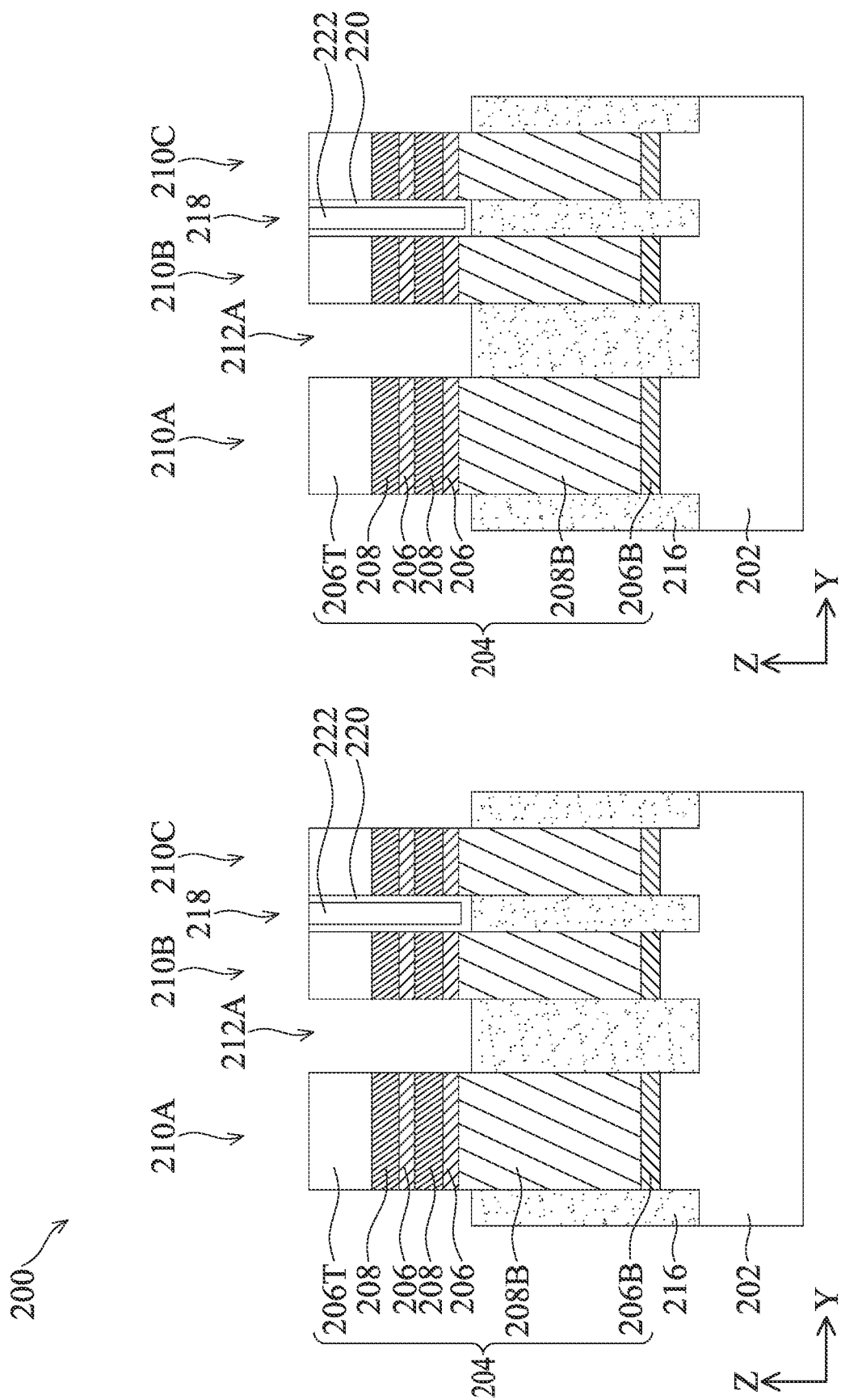
Figure 7C:
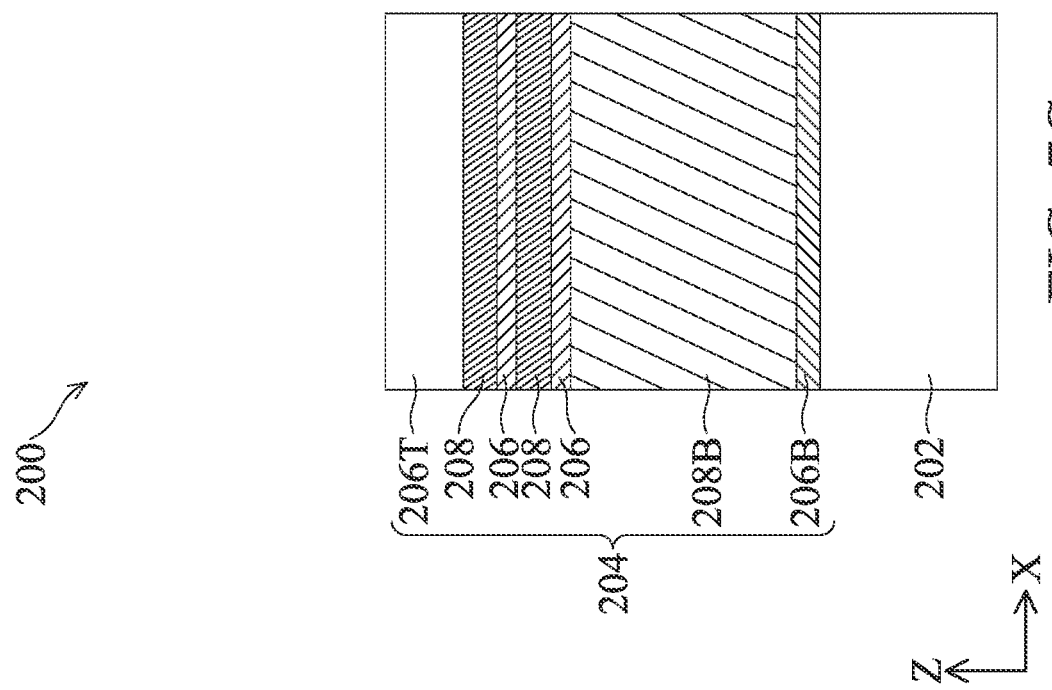

Referring to FIGS. 6A-6C and 7A-7C, the method 100 includes a block 108 (FIG. 1A) where a first dielectric fin 218 is formed. In the illustrated embodiment, at block 108, the first dielectric fin 218 is formed in the narrower fin trench 212B. An example process to form the first dielectric fin 218 includes conformally depositing a first dielectric layer 220 and a second dielectric layer 222 over the workpiece 200 in sequence, including in the wider fin trenches 212A. The second dielectric layer 222 is surrounded by the first dielectric layer 220. The first dielectric layer 220 may be conformally deposited using CVD, ALD, or a suitable method. The first dielectric layer 220 lines the sidewalls and the bottom surfaces of the fin trenches 212A and 212B. The second dielectric layer 222 is then conformally deposited over the first dielectric layer 220 using CVD, high density plasma CVD (HDPCVD), and/or other suitable process. In some instances, a dielectric constant of the second dielectric layer 222 is smaller than that of the first dielectric layer 220. The first dielectric layer 220 may include silicon, silicon nitride, silicon carbide, silicon carbonitride, silicon oxycarbonitride, aluminum oxide, aluminum nitride, aluminum oxynitride, zirconium oxide, zirconium nitride, zirconium aluminum oxide, hafnium oxide, or a suitable dielectric material. In one embodiment, the first dielectric layer 220 includes aluminum oxide. The second dielectric layer 222 may include silicon oxide, silicon carbide, silicon oxynitride, silicon oxycarbonitride, or a suitable dielectric material. In one embodiment, the second dielectric layer 222 includes silicon oxide. In some embodiments represented in FIGS. 6A-6C, due to width differences among fin trenches 212, the second dielectric layer 222 completely fills the narrower fin trench 212B but does not completely fill the wider fin trench 212A. Subsequently, the example process etches back the conformally deposited dielectric layers 220 and 222 to expose the top sacrificial layer 206T and remove the dielectric layers 220 and 222 from the wider fin trenches 212A. In some embodiments, the dielectric layers 220 and 222 may be etched back in a dry etching process that uses oxygen, nitrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some implementations, the etch back may include a first stage that is directed toward the second dielectric layer 222 and a second stage that is directed toward the first dielectric layer 220. Unlike the narrower fin trench 212B which is entirely filled by the dielectric layers 220 and 222, the wider fin trench 212A allows etchant to etch sidewalls and bottom surface of the dielectric layers 220 and 222 from inside the trench, such that the dielectric layers 220 and 222 are removed from the wider fin trench 212A in a faster rate than from the narrower fin trench 212B. As shown in FIGS. 7A-7C, upon the conclusion of the block 108, the dielectric layers 220 and 222 are removed from the wider fin trench 212A, while the dielectric layers 220 and 222 collectively define the first dielectric fin 218 in the narrower fin trench 212B.

Figure 8A:
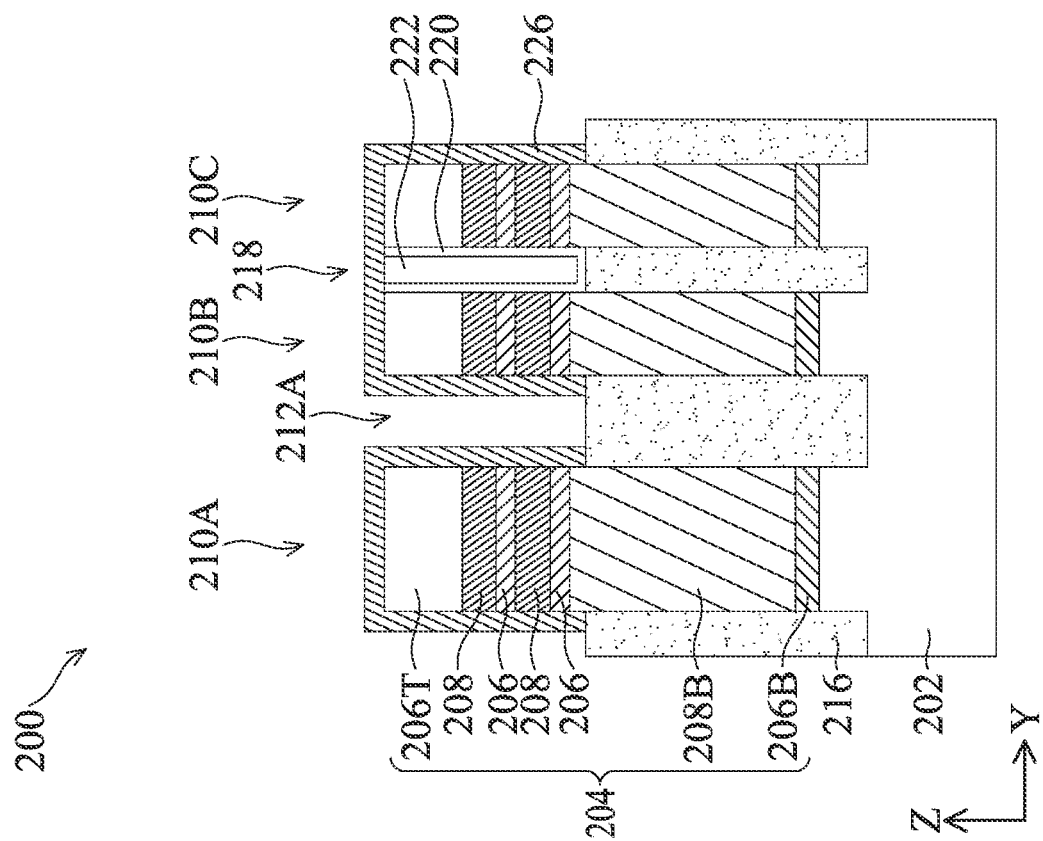
Figure 8B:
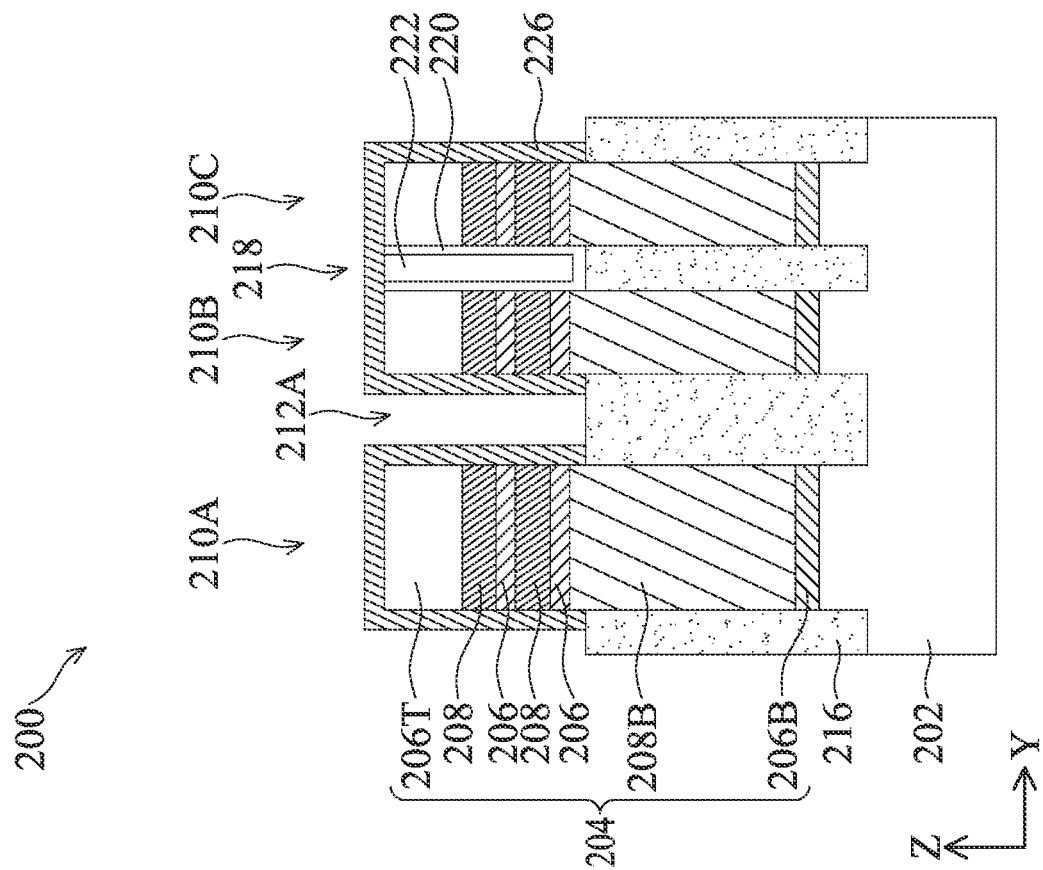

Referring to FIGS. 8A-8C and 9A-9C, the method 100 includes a block 110 (FIG. 1A) where second dielectric fins 224 are formed. In the illustrated embodiment, at the block 110, the second dielectric fins 224 are formed in the wider fin trenches 212A. An example process to form the second dielectric fin 224 includes, with the wider fin trenches 212A exposed at the conclusion of the block 108, a cladding layer 226 is deposited over the workpiece 200, including over the sidewalls of the wider fin trenches 212A. In some embodiments, the cladding layer 226 may have a composition similar to that of the sacrificial layers 206 or the top sacrificial layer 206T. In one example, the cladding layer 226 may be formed of silicon germanium (SiGe). Their common composition allows selective and simultaneous removal of the sacrificial layers 206 and the cladding layer 226 in a subsequent etching process. In some embodiments, the cladding layer 226 may be conformally and epitaxially grown using vapor phase epitaxy (VPE) or molecular beam epitaxy (MBE). As shown in FIGS. 8A-8C, the cladding layer 226 is selectively disposed on exposed sidewall surfaces in the wider fin trenches 212A. Depending on the extent of the selective growth of the cladding layer 226, an etching-back process may be performed to expose the isolation feature 216. Subsequently, the example process conformally deposits a third dielectric layer 228 and a fourth dielectric layer 230 into the trenches 212A, as shown in FIGS. 9A-9B. The fourth dielectric layer 230 is surrounded by the third dielectric layer 228. The composition and the formation of the third dielectric layer 228 may be the same or substantially similar to those of the first dielectric layer 220, while the composition and the formation of the fourth dielectric layer 230 may be the same or substantially similar to those of the second dielectric layer 222. Alternatively, the composition and the formation of the third dielectric layer 228 may be different from those of the first dielectric layer 220, while the composition and the formation of the fourth dielectric layer 230 may be different with those of the second dielectric layer 222. In some embodiments, the third dielectric layer 228 may be deposited using CVD, HDPCVD, or flowable CVD (FCVD) and the fourth dielectric layer 230 may be deposited using FCVD. After the deposition of the dielectric layers 228 and 230, the workpiece 200 is planarized using a chemical mechanical polishing (CMP) process to expose the top sacrificial layer 206T. As shown in FIGS. 9A-9C, upon conclusion of the CMP process, the dielectric layers 228 and 230 collectively define the second dielectric fins 224 in the wider fin trenches 212A. In various embodiments, a width of the second dielectric fins 224 may be the same or wider than that of the first dielectric fin 218.

Figure 10C:
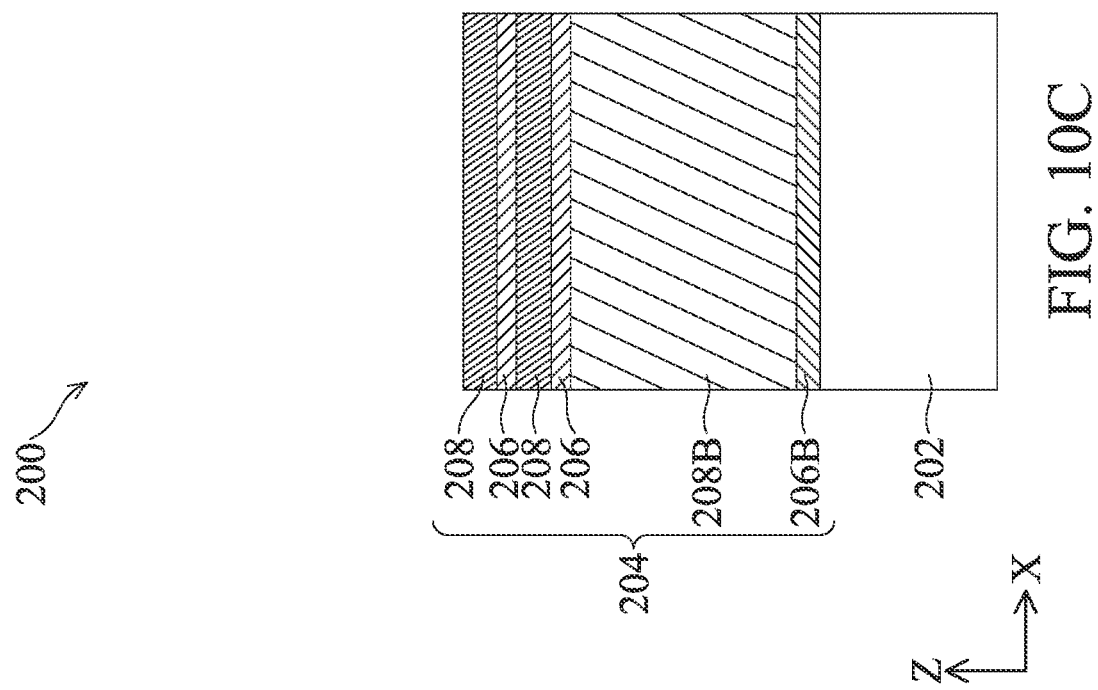

Referring to FIGS. 10A-10C, the method 100 includes a block 112 (FIG. 1A) where the top sacrificial layer 206T in the fin-shaped structures 210 are removed. At the block 112, the workpiece 200 is etched to selectively remove the top sacrificial layer 206T and a portion of the cladding layer 226 to expose the topmost channel layer 208, without substantially damaging the dielectric fins 218 and 224. In some instances, because the top sacrificial layer 206T and the cladding layer 226 are formed of silicon germanium (SiGe), the etching process at the block 112 may be selective to silicon germanium (SiGe). For example, the cladding layer 226 and the top sacrificial layer 206T may be etched using a selective wet etching process that includes ammonium hydroxide ($NH_4OH$), hydrogen fluoride (HF), hydrogen peroxide ($H_2O_2$), or a combination thereof. After the removal of the top sacrificial layer 206T and a portion of the cladding layer 226, the dielectric fins 218 and 224 rise above the topmost channel layer 208.

Figure 11C:
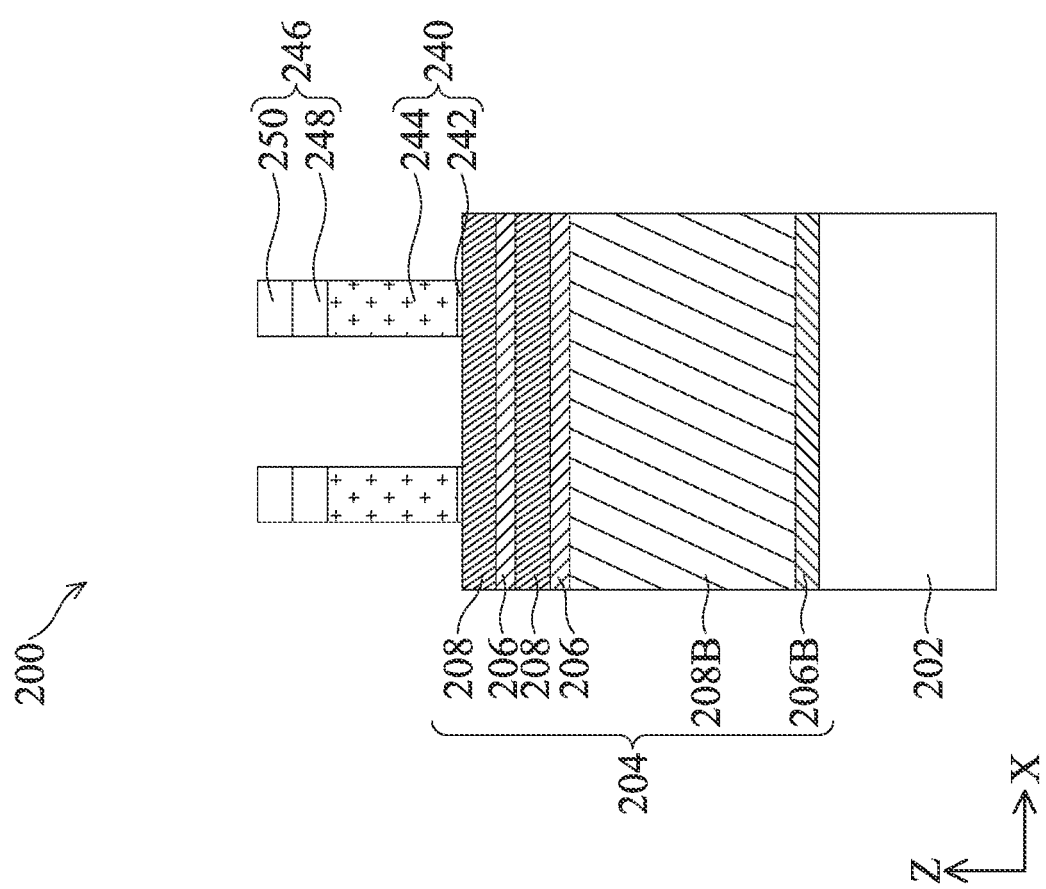

Referring to FIGS. 11A-11C, the method 100 includes a block 114 (FIG. 1A) where dummy gate stacks 240 are formed over the channel regions of the fin-shaped structures 210. In some embodiments, a gate replacement process (or gate-last process) is adopted where the dummy gate stacks 240 serve as a placeholder for functional gate structures. Other processes and configuration are possible. In the illustrated embodiment, the dummy gate stack 240 includes a dummy dielectric layer 242 and a dummy electrode 244 disposed over the dummy dielectric layer 242. For patterning purposes, a gate top hard mask 246 is deposited over the dummy gate stacks 240. The gate top hard mask 246 may be a multi-layer and include a silicon nitride mask layer 248 and a silicon oxide mask layer 250 over the silicon nitride mask layer 248. The regions of the fin-shaped structures 210 underlying the dummy gate stacks 240 may be referred to as channel regions. Each of the channel regions in a fin-shaped structure 210 is sandwiched between two source/drain regions for source/drain formation. In an example process, the dummy dielectric layer 242 is blanketly deposited over the workpiece 200 by CVD. A material layer for the dummy electrode 244 is then blanketly deposited over the dummy dielectric layer 242. The dummy dielectric layer 242 and the material layer for the dummy electrode 244 are then patterned using photolithography processes to form the dummy gate stacks 240. In some embodiments, the dummy dielectric layer 242 may include silicon oxide and the dummy electrode 244 may include polycrystalline silicon (polysilicon).

Figure 12C:
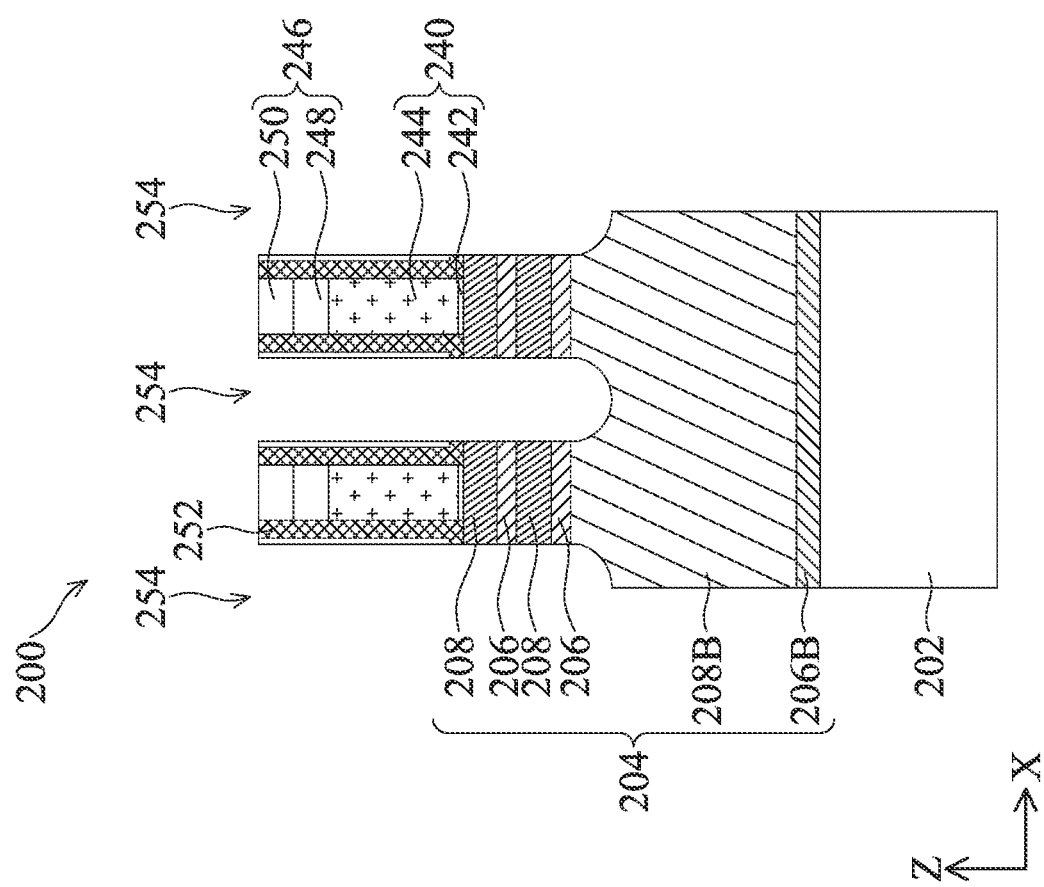

Referring to FIGS. 12A-12C, the method 100 includes a block 116 (FIG. 1A) where gate spacers 252 are formed along sidewalls of the dummy gate stacks 240. The gate spacers 252 may include two or more gate spacer layers. Dielectric materials for the gate spacers 252 may be selected to allow selective removal of the dummy gate stacks 240. Suitable dielectric materials may include silicon nitride, silicon oxycarbonitride, silicon carbonitride, silicon oxide, silicon oxycarbide, silicon carbide, silicon oxynitride, and/or combinations thereof. In an example process, the gate spacers 252 may be conformally deposited over the workpiece 200 using CVD, subatmospheric CVD (SACVD), or ALD, and then be anisotropically etched to remove horizontal portions while vertical portions of the gate spacers 252 remain on the sidewalls of the dummy gate stacks 240.

Still referring to FIGS. 12A-12C, the method 100 includes a block 118 (FIG. 1A) where the source/drain regions of the fin-shaped structures 210 are recessed to form source recesses and drain recesses, collectively as source/drain recesses 254 (or source/drain trenches 254). With the dummy gate stack 240 and the gate spacers 252 serving as an etch mask, the workpiece 200 is anisotropically etched to form the source/drain recesses 254 over the source/drain regions of the fin-shaped structures 210. In the illustrated embodiment, operations at the block 118 remove the sacrificial layers 206, the channel layers 208, the cladding layer 226, as well as a top portion of the overlaying semiconductor layer 208B from the source/drain regions, thereby exposing the isolation feature 216. In some embodiments, the source/drain recesses 254 may extend into the overlaying semiconductor layer 208B and be below a top surface of the isolation feature 216. The anisotropic etch at the block 118 may include a dry etching process. For example, the dry etching process may implement hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Figure 13C:
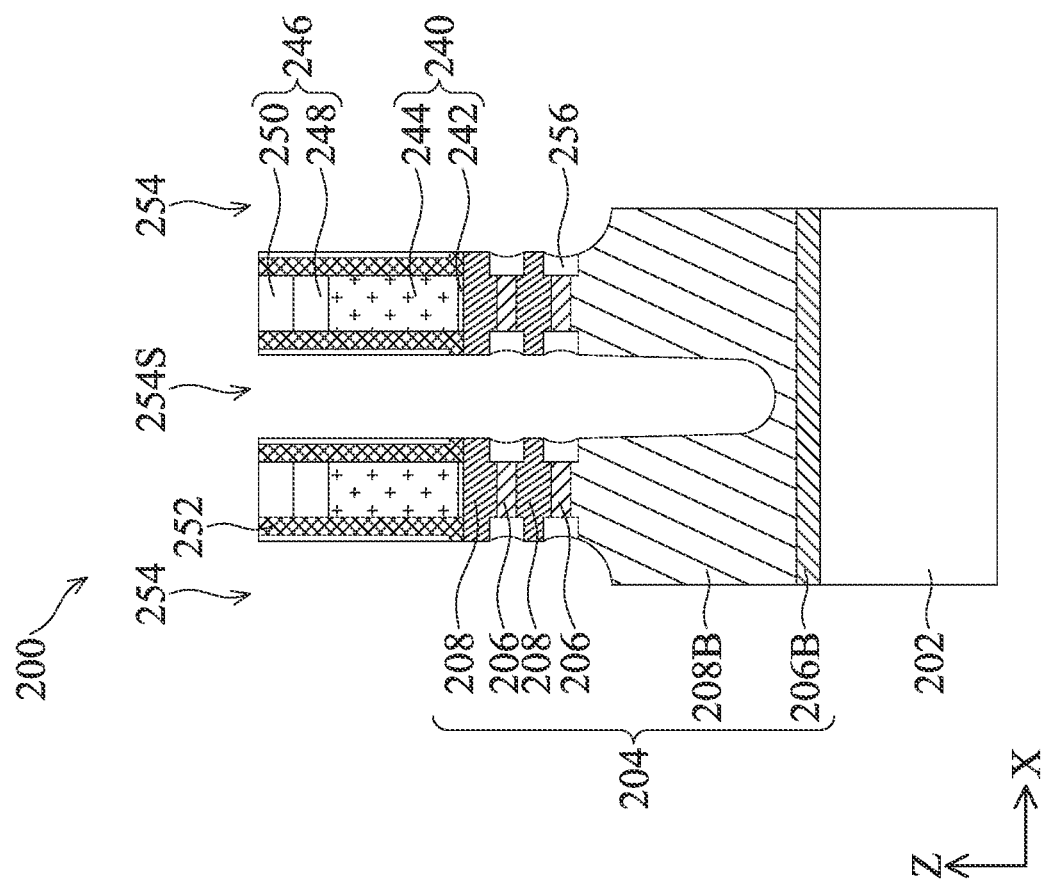

Referring to FIGS. 13A-13C, the method 100 includes a block 120 where a source/drain recess 254 in a source region is further extended into the overlaying semiconductor layer 208B by an etching process to form a deep source/drain recess 254S. In the illustrated embodiment, the deep source/drain recess 254S locates between the dielectric fins 218 and 224. A patterned mask (not shown) may be formed prior to the etching process at the block 120 to restrain the etching process in a source region. In other embodiments, operations at the block 120 may alternatively extend source/drain recess(es) in a drain region, or both source and drain regions. In the present disclosure, a source and a drain are interchangeably used. The etch at the block 120 may be performed using a dry etching process, which tends to be anisotropic, or a wet etching process, which tends to be isotropic. An example selective wet etching process may include use of ethylenediamine pyrocatechol (EDP), tetramethylammonium hydroxide (TMAH), nitric acid ($HNO_3$), hydrofluoric acid (HF), ammonia ($NH_3$), ammonium fluoride ($NH_4F$) or a suitable wet etchant. An example selective dry etching process may include sulfur hexafluoride ($SF_6$), hydrogen ($H_2$), ammonia ($NH_3$), hydrogen fluoride (HF), carbon tetrafluoride ($CF_4$), argon (Ar), or a mixture thereof. In the illustrated embodiment, the deep source/drain recess 254S is disposed in a level above the bottom sacrificial layer 206B. In some alternatively embodiments, the bottom sacrificial layer 206B functions as an etch stop layer to the etching process at the block 120 and the deep source/drain recess 254S exposes a top surface of the bottom sacrificial layer 206B. Also as shown in FIG. 13A, since sidewalls of the first dielectric fin 218 and the underneath isolation feature 216 are substantially flushed, the deep source/drain recess 254S has a straight sidewall on the side of the first dielectric fin 218 and a step sidewall on the side of the second dielectric fin 224.

Still referring to FIGS. 13A-13C, the method 100 includes a block 122 where inner spacer features 256 are formed. In some embodiments, at the block 122, the sacrificial layers 206 exposed in the source/drain recesses 254 and the deep source/drain recess 254S are first selectively and partially recessed to form inner spacer recesses, while the exposed channel layers 208 are substantially unetched. Because the cladding layer 226 and the sacrificial layers 206 share a similar composition, the cladding layer 226 may also be recessed at the block 122. In an embodiment where the channel layers 208 consist essentially of silicon (Si), the sacrificial layers 206 consist essentially of silicon germanium (SiGe), and the cladding layer 226 consists essentially of silicon germanium (SiGe), the selective and partial recess of the sacrificial layers 206 and the cladding layer 226 may include a SiGe oxidation process followed by a SiGe oxide removal. In that embodiments, the SiGe oxidation process may include use of ozone. In some other embodiments, the partial recess may include a selective etching process (e.g., a selective dry etching process or a selective wet etching process), and the extent at which the sacrificial layers 206 and the cladding layer 226 are recessed is controlled by duration of the etching process. The selective dry etching process may include use of one or more fluorine-based etchants, such as fluorine gas or hydrofluorocarbons. The selective wet etching process may include ammonium hydroxide ($NH_4OH$), hydrogen fluoride (HF), hydrogen peroxide ($H_2O_2$), or a combination thereof (e.g. an APM etch that includes an ammonia hydroxide-hydrogen peroxide-water mixture). After the formation of the inner spacer recesses, an inner spacer material layer is then conformally deposited using CVD or ALD over the workpiece 200, including over and into the inner spacer recesses and the space left behind by the removed portion of the cladding layer 226. The inner spacer material may include silicon nitride, silicon oxycarbonitride, silicon carbonitride, silicon oxide, silicon oxycarbide, silicon carbide, or silico oxynitride. After the deposition of the inner spacer material layer, the inner spacer material layer is etched back to form inner spacer features 256, as illustrated in FIGS. 13A-13C.

Figure 14C:
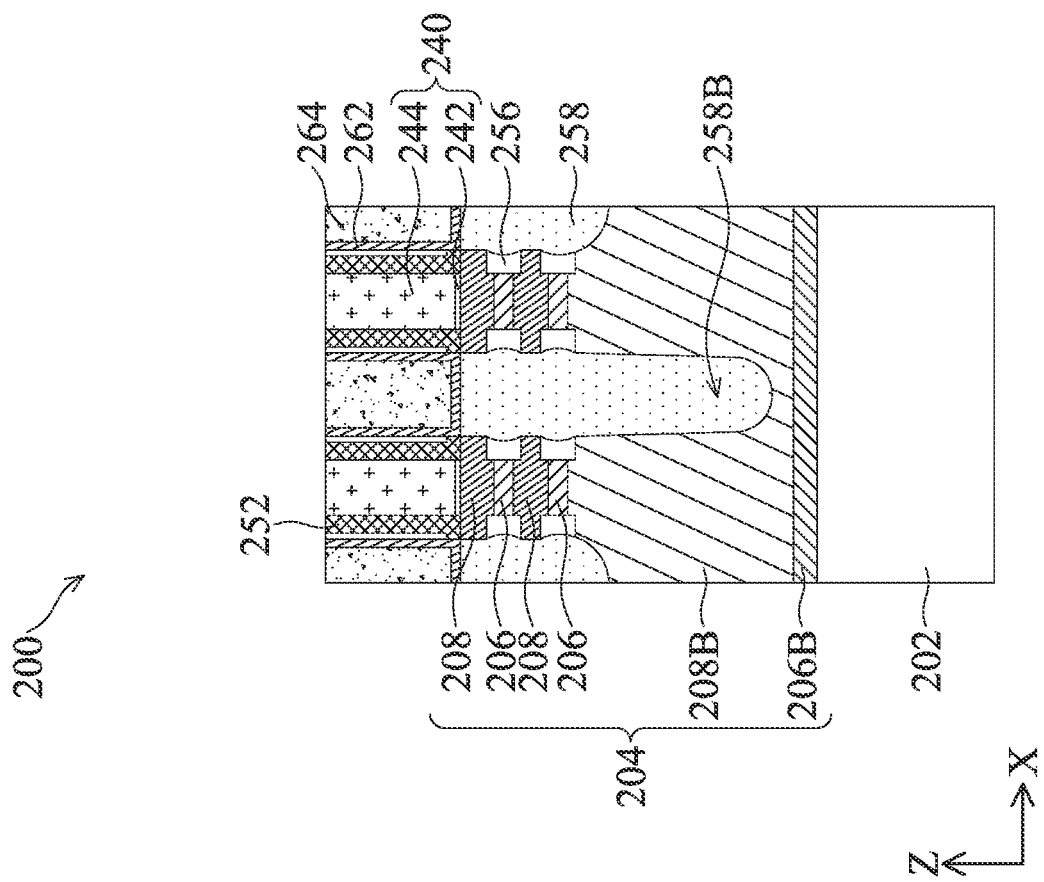

Referring to FIGS. 14A-14C, the method 100 includes a block 124 where source/drain features 258 are formed. The source/drain features 258 are selectively and epitaxially deposited on the exposed semiconductor surfaces of the channel layers 208 and the overlaying semiconductor layer 208B in the source/drain recesses 254 and the deep source/drain recess 254S. The source/drain features 258 may be deposited using an epitaxial process, such as vapor-phase epitaxy (VPE), ultra-high vacuum CVD (UHV-CVD), molecular beam epitaxy (MBE), and/or other suitable processes. Depending on the design of the workpiece 200, the source/drain features 258 may be n-type or p-type. When the source/drain features 258 are n-type, they may include silicon (Si) doped with an n-type dopant, such as phosphorus (P) or arsenic (As). When the source/drain features 258 are p-type, they may include silicon germanium (SiGe) doped with a p-type dopant, such as boron (B) or gallium (Ga). Doping of the source/drain features 258 may be performed either in situ with their deposition or ex situ using an implantation process, such as a junction implant process. The source/drain feature 258 formed in the deep source/drain recess 254S has an extended bottom portion 258B that extends deeper towards the backside of the workpiece 200 than other source/drain features 258 formed in the source/drain recesses 254. The extended bottom portion 258B reserves a space for forming a backside self-aligned source/drain contact in subsequent fabrication processes. As discussed above, in the illustrated embodiment as shown in FIG. 14A, the source/drain feature 258 with the extended bottom portion 258B is a source feature formed in a source region and the other two source/drain features 258 on its both sides are drain features formed in drain regions. Yet, alternatively the source/drain feature 258 with the extended bottom portion 258B may be a drain feature and the other two source/drain features 258 on its both sides may be source features. In the present disclosure, a source and a drain are interchangeably used. Also as shown in FIG. 14A, at the step region of the sidewalls of the source/drain recesses 254 and the deep source/drain recess 254S, facets of the source/drain features 258 may trap voids 260 between the source/drain features 258 and dielectric features, such as the second dielectric fins 224 and the isolation feature 216. As a comparison, due to the straight sidewalls of the source/drain recesses 254 and the deep source/drain recess 254S on the side of the first dielectric fin 218, voids 260 may not be formed on the straight sidewalls as shown in the illustrated embodiment.

Still referring to FIGS. 14A-14C, the method 100 includes a block 126 (FIG. 1A) where a contact etch stop layer (CESL) 262 and an interlayer dielectric (ILD) layer 264 are deposited on the frontside of the workpiece 200. In an example process, the CESL 262 is first conformally deposited over the workpiece 200 and then the ILD layer 264 is blanketly deposited over the CESL 262. The CESL 262 may include silicon nitride, silicon oxide, silicon oxynitride, and/or other materials known in the art. The CESL 262 may be deposited using ALD, plasma-enhanced chemical vapor deposition (PECVD) process and/or other suitable deposition or oxidation processes. In some embodiments, the ILD layer 264 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 264 may be deposited by spin-on coating, an FCVD process, or other suitable deposition technique. In some embodiments, after formation of the ILD layer 264, the workpiece 200 may be annealed to improve integrity of the ILD layer 264. To remove excess materials (including the gate top hard mask 246) and to expose top surfaces of the dummy electrode 244 of the dummy gate stacks 240, a planarization process (such as a CMP process) may be performed to the workpiece 200 to provide a planar top surface. Top surfaces of the dummy electrodes 244 are exposed on the planar top surface.

Figure 15C:
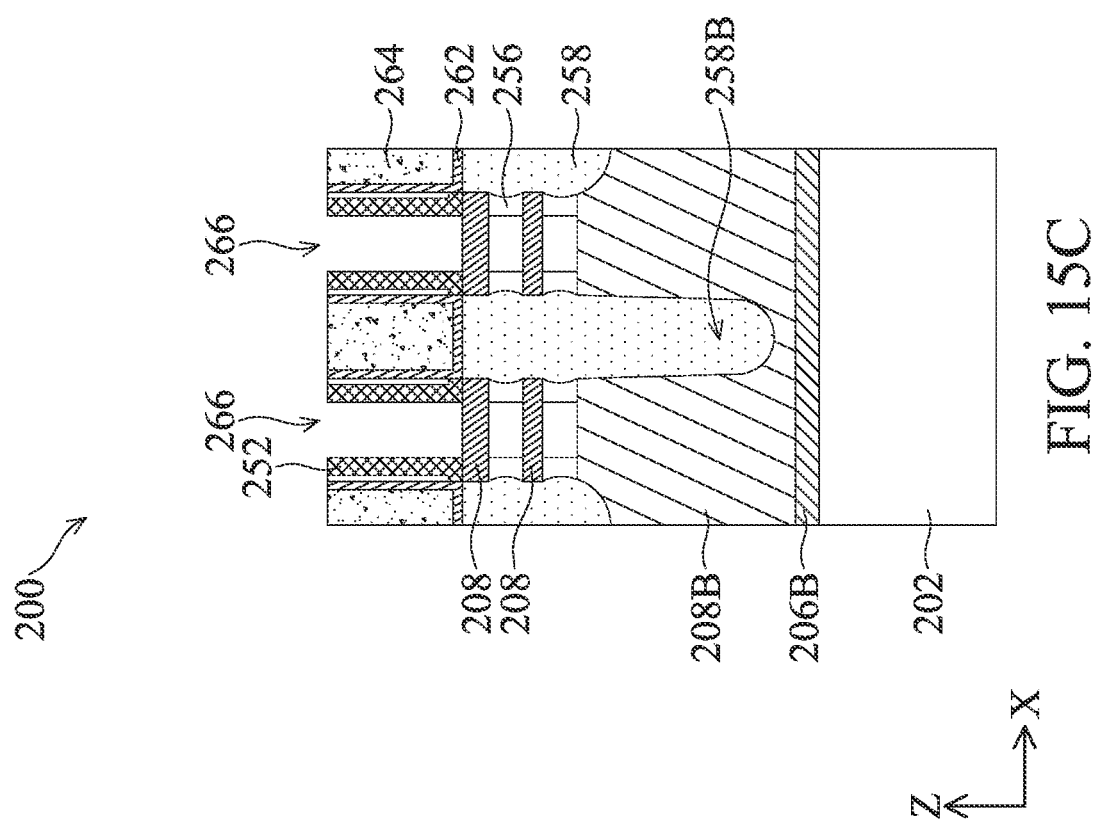

Referring to FIGS. 15A-15C, the method 100 includes a block 128 (FIG. 1A) where the dummy gate stacks 240 and the sacrificial layers 206 are selectively removed. The dummy gate stacks 240 exposed at the conclusion of the block 126 are removed from the workpiece 200 by a selective etching process. The selective etching process may be a selective wet etching process, a selective dry etching process, or a combination thereof. In the depicted embodiments, the selective etching process selectively removes the dummy dielectric layer 242 and the dummy electrode 244 without substantially damaging the channel layers 208 and the gate spacers 252. The removal of the dummy gate stacks 240 results in gate trenches 266 over the channel regions. After the removal of the dummy gate stacks 240, the channel layers 208, the sacrificial layers 206, and the cladding layer 226 in the channel regions are exposed in the gate trenches 266. Subsequently, operations at the block 128 selectively removes the sacrificial layers 206 and the cladding layer 226 from the gate trenches 266 to release the channel layers 208. The released channel layers 208 at the conclusion of the block 128 are also denoted as the channel members 208. In the depicted embodiments where the channel members 208 resemble a sheet or a nanosheet, the channel member release process may also be referred to as a sheet formation process. The channel members 208 are vertically stacked along the Z direction. All channel members 208 are spaced apart from the second dielectric fins 224, while some of the channel members 208 that are abutting the first dielectric fin 218 extend laterally from sidewalls of the first dielectric fin 218. The selective removal of the sacrificial layers 206 and the cladding layer 226 may be implemented by selective dry etching, selective wet etching, or other selective etching processes. In some embodiments, the selective wet etching includes ammonium hydroxide ($NH_4OH$), hydrogen fluoride (HF), hydrogen peroxide ($H_2O_2$), or a combination thereof (e.g. an APM etch that includes an ammonia hydroxide-hydrogen peroxide-water mixture). In some alternative embodiments, the selective removal includes silicon germanium oxidation followed by a silicon germanium oxide removal. For example, the oxidation may be provided by ozone clean and then silicon germanium oxide removed by an etchant such as $NH_4OH$. With the removal of the sacrificial layers 206 and the cladding layer 226 from the channel regions, the dielectric fins 218 and 224, the channel members 208, the top surface of the overlaying semiconductor layer 208B, the inner spacer features 258, and the isolation feature 216 are exposed in the gate trenches 266.

Figure 16C:
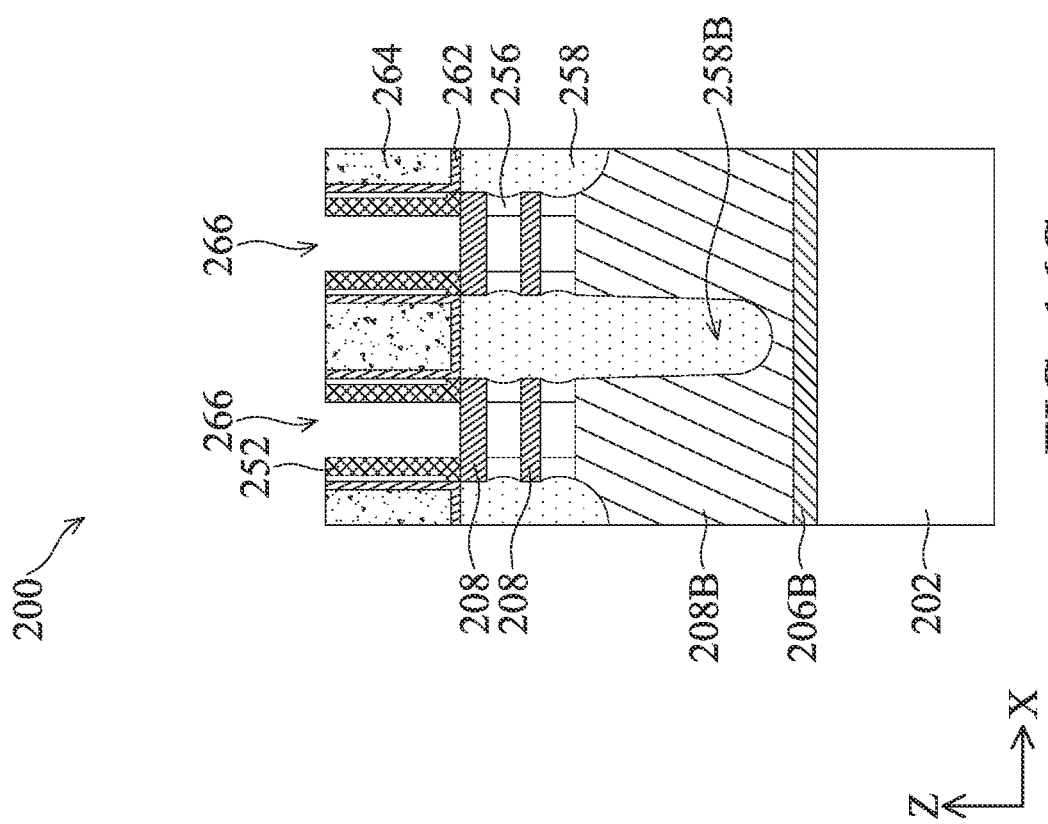

Referring to FIGS. 16A-16C, the method 100 includes a block 130 (FIG. 1A) where the first dielectric fin 218 and the second dielectric fins 224 are thinned down in width by selectively removing outer dielectric layers—the first dielectric layer 220 and the third dielectric layer 228. The thinning of the dielectric fins 218 and 224 provides a larger gate trench volume which in turn facilitates the deposition of various dielectric and metallic layers in the to-be-formed functional gate structures. The dielectric layers 220 and 228 exposed in the gate trenches 266 are removed from the channel regions by a selective etching process. The selective etching process may be a selective wet etching process, a selective dry etching process, or a combination thereof. In the depicted embodiments, the selective etching process selectively removes the dielectric layers 220 and 228 without substantially damaging the dielectric layers 222 and 230. As discussed above, the dielectric layers 220 and 228 may include the same or similar compositions, and the selective etching process may removes both dielectric layers in a single stage; alternatively, the dielectric layers 220 and 228 may include different compositions, and the selective etching process may include a first stage that is directed toward one of the dielectric layers 220 and 228 and a second stage that is directed toward another. As shown in FIG. 16B, some portions of the first dielectric layer 220 sandwiched between the channel members 208 and the second dielectric layer 222 and some portions of the first dielectric layer 220 stacked between the second dielectric layer 222 and the isolation feature 216 may remain due to their less exposed area for etchant(s) and accordingly smaller etching rate. Similarly, some portions of the third dielectric layer 228 stacked between the fourth dielectric layer 230 and the isolation feature 216 may remain. Further, the portions of the first dielectric layer 220 stacked between the second dielectric layer 222 and the isolation feature 216 may have a larger width than the second dielectric layer 222 and may fully covers the underneath isolation feature 216 due to the shielding of the above channel members 208 that are abutting the first dielectric fin 218. As a comparison, the portions of the third dielectric layer 228 stacked between the fourth dielectric layer 230 and the isolation feature 216 may have the same or smaller width than the fourth dielectric layer 230 and the underneath isolation feature 216 is exposed. Although not shown, in some alternative embodiments, the selective etching process may fully remove the dielectric layers 220 and 228 from the gate trenches 266, such that the channel members 208 are spaced apart from the both the first dielectric fin 218 and the second dielectric fins 224.

Figure 17B:
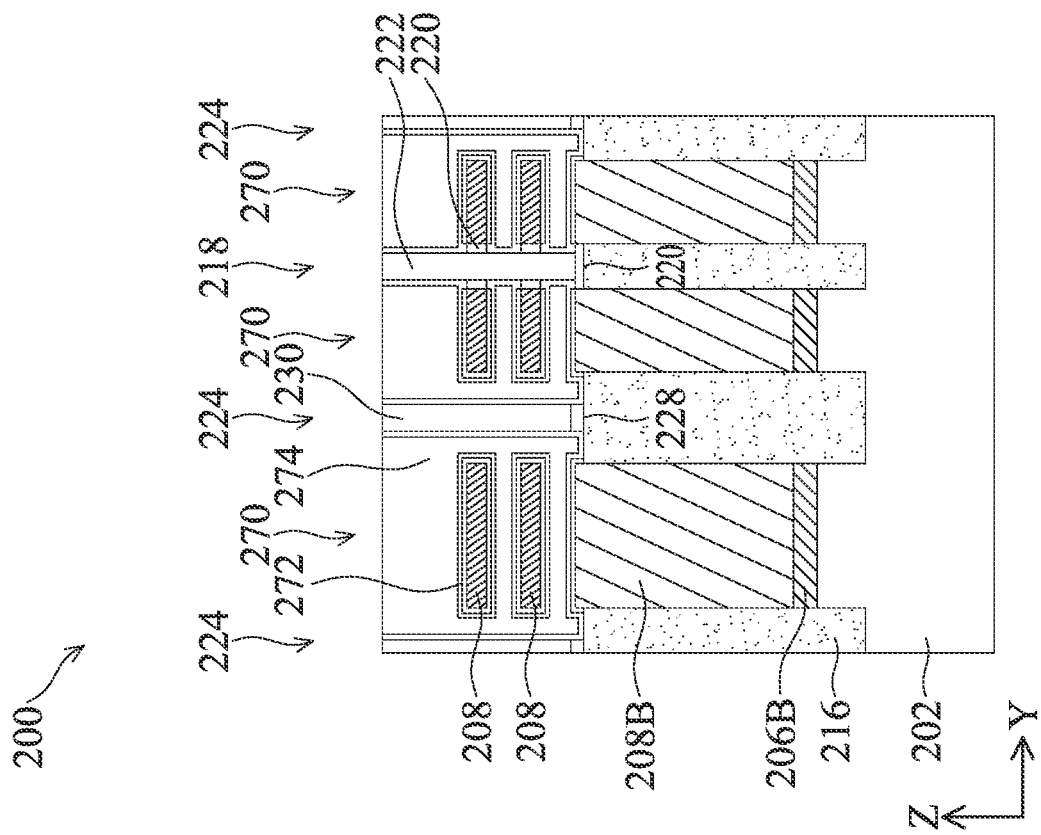
Figure 17A:
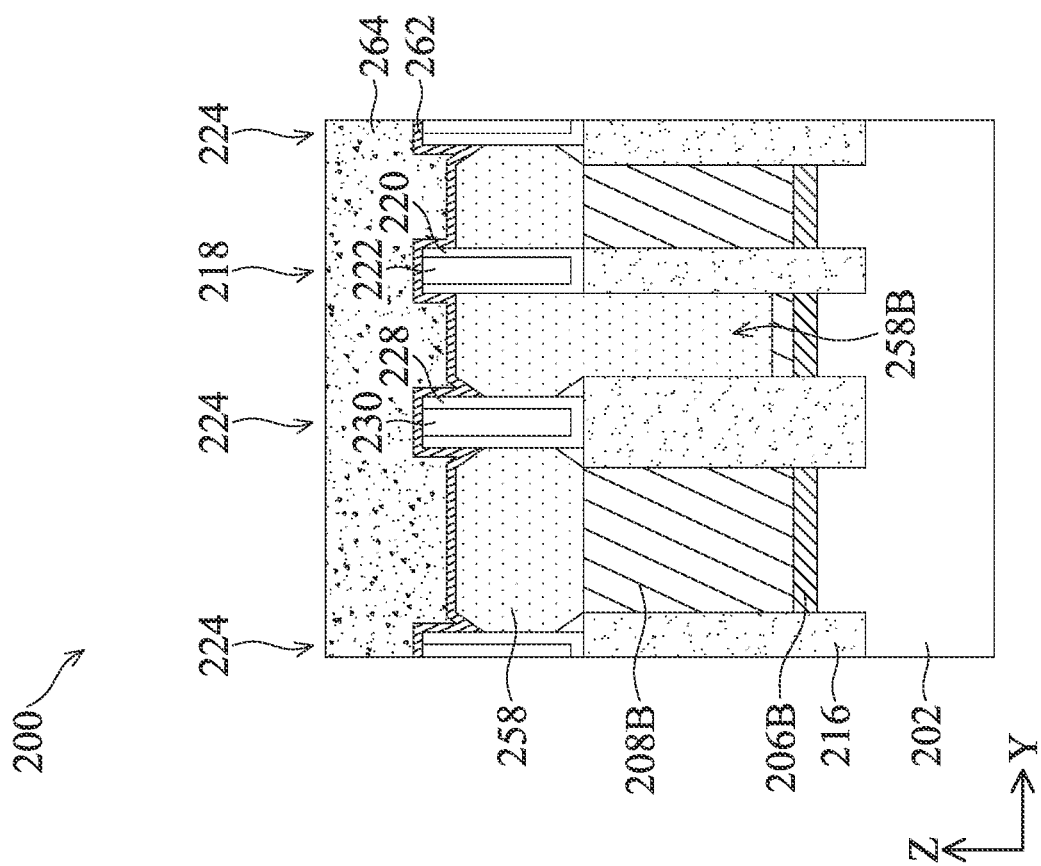
Figure 17C:
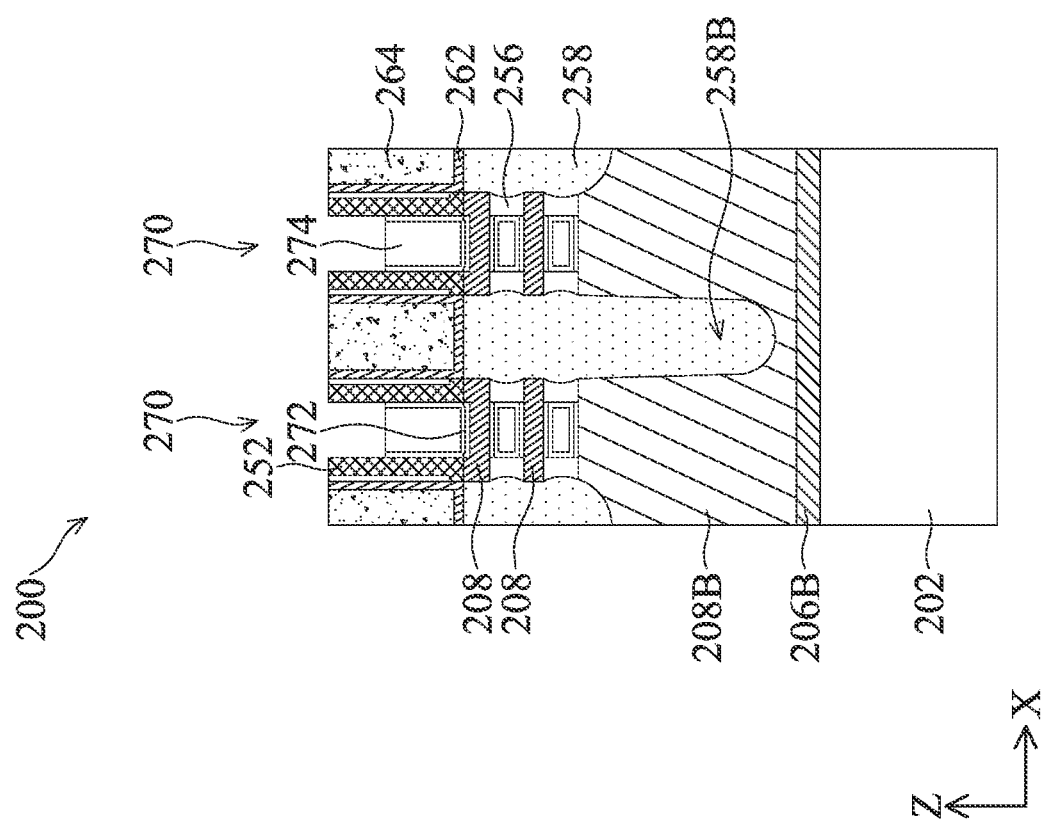

Referring to FIGS. 17A-17C, the method 100 includes a block 132 (FIG. 1B) where gate structures 270 (also known as functional gate structures 270 or metal gate structures 270) are formed in the gate trenches 266 to engage each of the channel members 208. Each of the gate structures 270 includes a gate dielectric layer 272 disposed on the channel members 208 and a gate electrode layer 274 over the gate dielectric layer 272. In some embodiments, the gate dielectric layer 272 includes an interfacial layer and a high-k dielectric layer. The interfacial layer may include silicon oxide and be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed surfaces of the channel members 208 to form the interfacial layer. The high-k dielectric layer is then deposited over the interfacial layer using ALD, CVD, and/or other suitable methods. The high-k dielectric layer includes high-K dielectric materials.

In one embodiment, the high-k dielectric layer may include hafnium oxide. Alternatively, the high-k dielectric layer may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. After the formation of the gate dielectric layer 272, the gate electrode layer 274 is deposited over the gate dielectric layer 272. The gate electrode layer 274 may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer 274 may be formed by ALD, PVD, CVD, e-beam evaporation, or other suitable process. Although not explicitly shown in the figures, the gate structures 270 are deposited as a joint gate structure and then etched back until the dielectric fins 218 and 224 separate the joint gate structure into the gate structures 270 that are separated apart from each other. The dielectric fins 218 and 224 also provide electrical isolation between neighboring gate structures 270. The etching back of the gate structures 270 may include a selective wet etching process that uses nitric acid, hydrochloric acid, sulfuric acid, ammonium hydroxide, hydrogen peroxide, or a combination thereof. As shown in FIG. 17B, the gate structures 270 do not extend between the first dielectric fin 218 and the abutting channel members 208 as the remaining first dielectric layer 220 fills the gaps therebetween. Alternatively, as discussed above in association with operations at the block 130, if the dielectric layers 220 and 228 are completely removed from the gate trenches 266 in some instances, each of the channel members 208 is thus wrapped around by a respective gate structure 270.

Figures 18A, 18B:
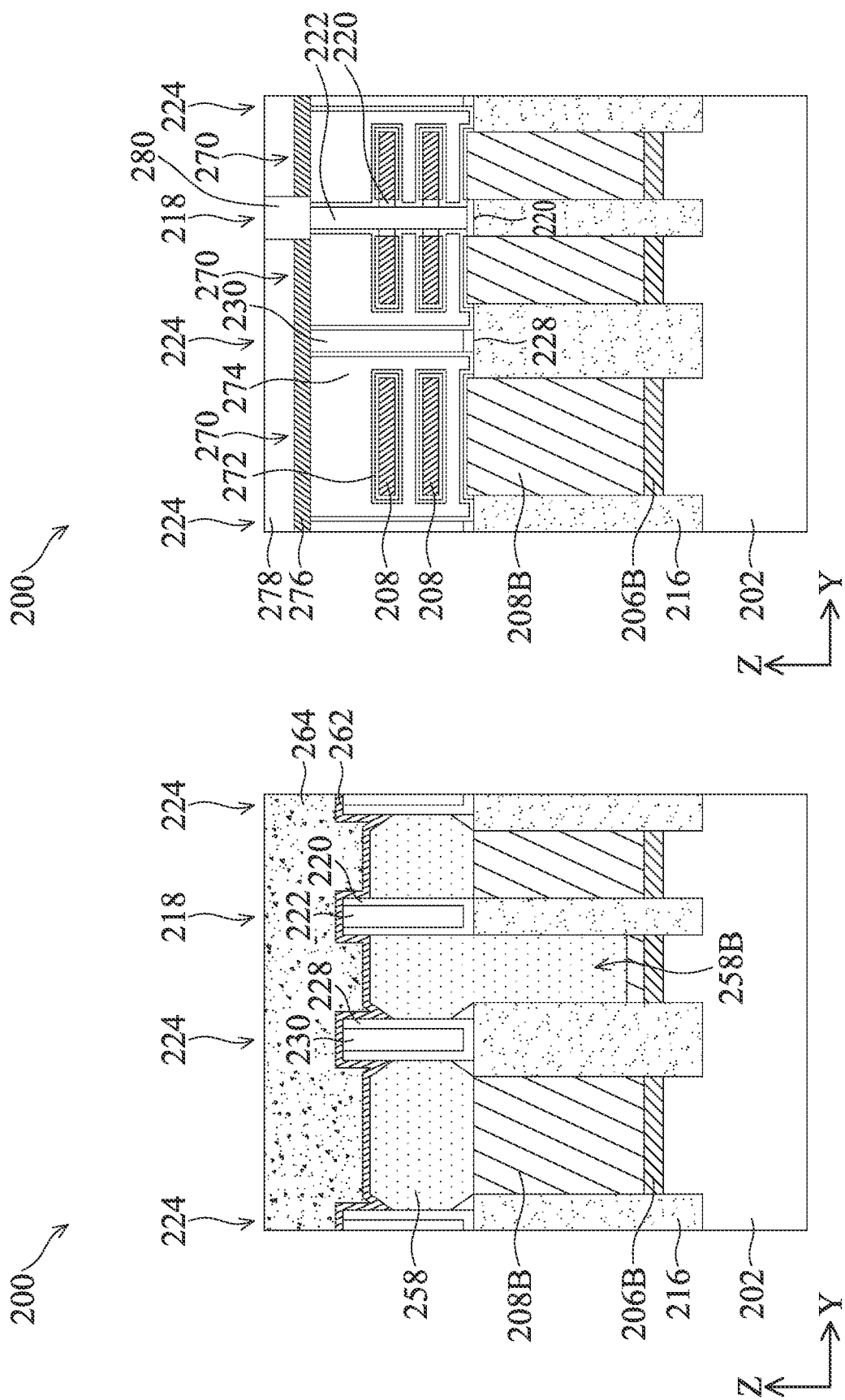
Figure 18C:
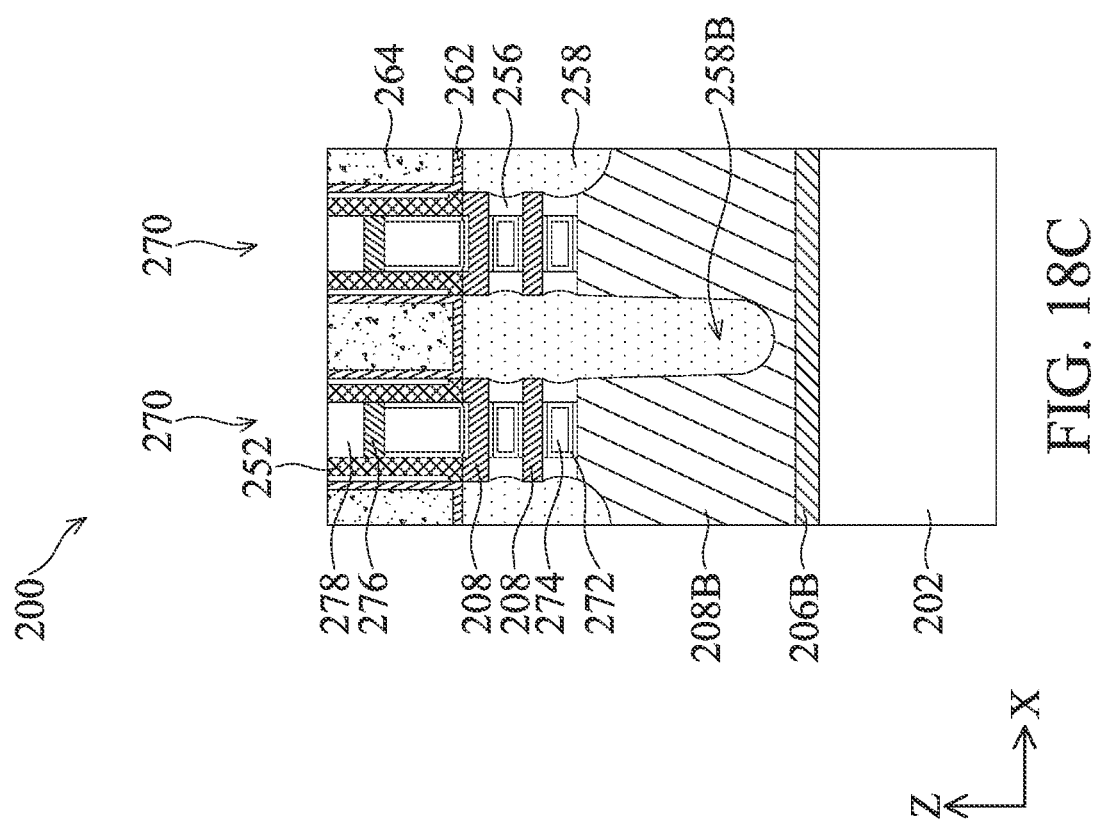

Referring to FIGS. 18A-18C, the method 100 includes a block 134 (FIG. 1B) where a metal cap layer 276, a self-aligned cap (SAC) layer 278, and a gate cut feature 280 are formed in the frontside of the workpiece 200. In some embodiments, the metal cap layer 276 may include titanium (Ti), titanium nitride (TiN), tantalum nitride (TaN), tungsten (W), ruthenium (Ru), cobalt (Co), or nickel (Ni) and may be deposited using PVD, CVD, or metal organic chemical vapor deposition (MOCVD). In one embodiment, the metal cap layer 276 includes tungsten (W), such as fluorine-free tungsten (FFW), and is deposited by PVD. In some alternative embodiments where the metal cap layer 276 is deposited by MOCVD, the deposition of the metal cap layer 276 may be selectively deposited on the gate structures 270. After the deposition of the metal cap layer 276, the SAC layer 278 is deposited over the workpiece 200 by CVD, PECVD, or a suitable deposition process. The SAC layer 278 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. Photolithography processes and etching processes are then performed to etch the deposited SAC layer 278 to form gate cut openings to expose the top surfaces of the dielectric fins, such as the first dielectric fin 218 in the illustrated embodiment. Thereafter, a dielectric material is deposited and planarized by a CMP process to form the gate cut features 280 in the gate cut openings. The dielectric material for the gate cut features 280 may be deposited using HDPCVD, CVD, ALD, or a suitable deposition technique. In some instances, the gate cut features 280 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. In some embodiments, the gate cut features 280 and the SAC layer 278 may have different compositions to introduce etch selectivity.

Figure 19B:
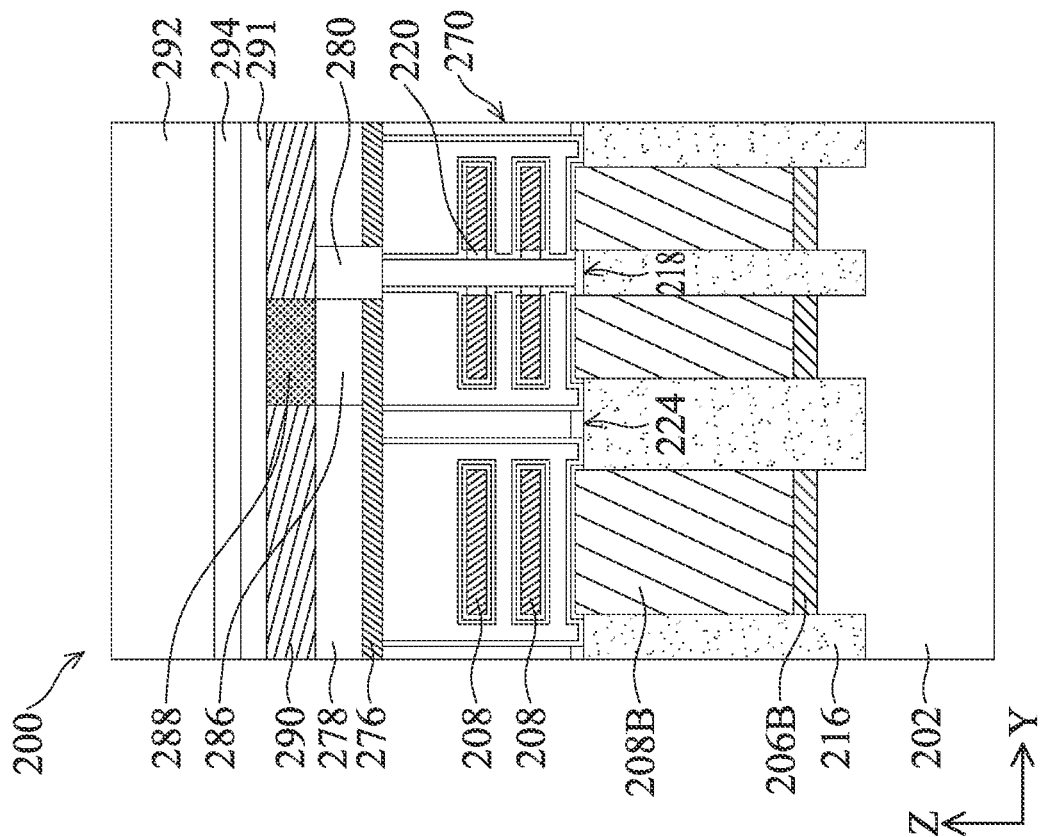
Figure 19A:
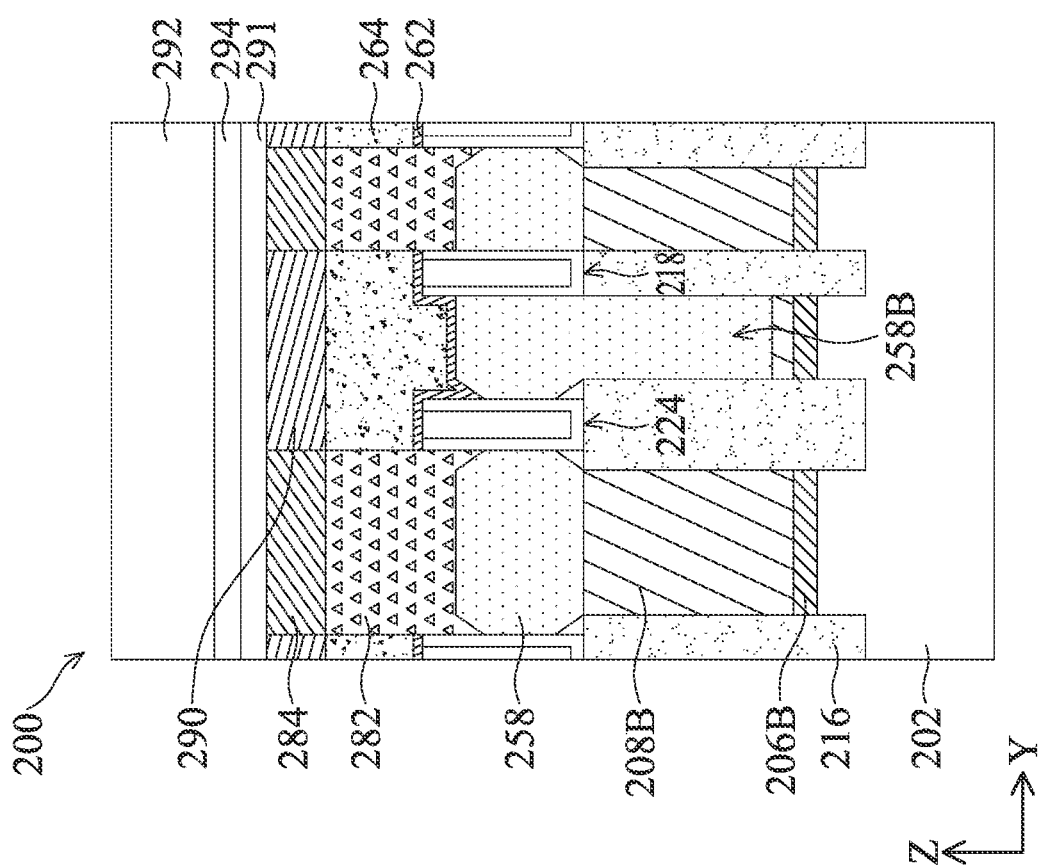

Referring to FIGS. 19A-19C, the method 100 includes a block 136 (FIG. 1B) where one or more frontside middle-end-of-line (MEOL) and frontside back-end-of-line (BEOL) processes are performed to form one or more interconnect layers with contacts, vias, and metal lines (also known as metal wiring layers) embedded in dielectric layers. In some embodiments, operations at the block 136 include forming source/drain contacts 282, source/drain contact vias 284, gate contacts 286, gate contact vias 288, additional ILD layer 290, intermetal dielectric (IMD) layers 291, metal lines in dielectric layers of the IMD layers 291, contact pads, etc. The workpiece 200 may further include passivation layers and/or other layers built on the frontside of the workpiece 200. These layers and the one or more interconnect layers connect gate, source, and drain electrodes of various transistors, as well as other circuits in the workpiece 200, to form an integrated circuit in part or in whole.

Still referring to FIGS. 19A-19C, the method 100 includes a block 138 (FIG. 1B) where a carrier 292 is attached to the frontside of the workpiece 200. The carrier 292 may be a silicon wafer in some embodiments. Operations at the block 138 may use any suitable attaching processes, such as direct bonding, hybrid bonding, using adhesive, or other bonding methods. In the illustrated embodiment, an adhesive layer 294 is formed on the frontside of the workpiece 200 and adjoins the carrier 292 to the frontside of the workpiece 200. Operations at the block 138 may further include alignment, annealing, and/or other processes. The attaching of the carrier 292 allows the workpiece 200 to be flipped upside down. This makes the workpiece 200 accessible from the backside of the workpiece 200 for further processing. It is noted that the workpiece 200 is flipped upside down in following figures, namely FIGS. 20A-32C.

Figure 20B:
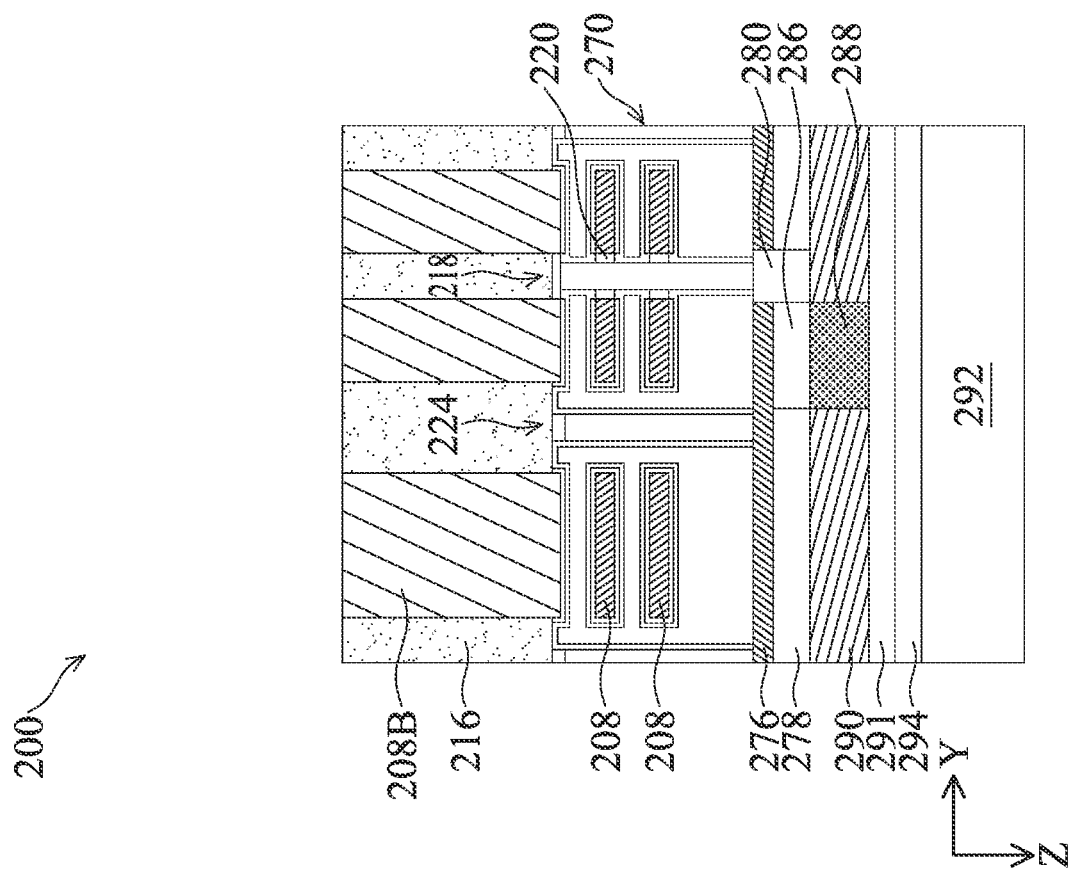
Figure 20A:
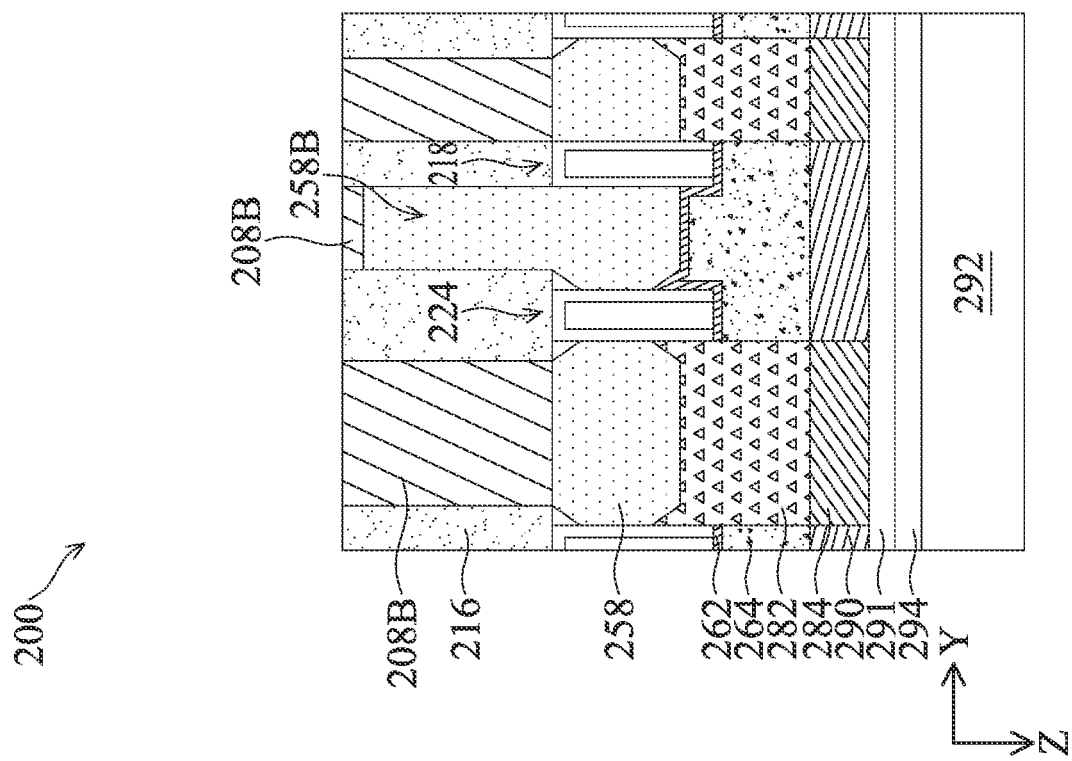
Figure 20C:
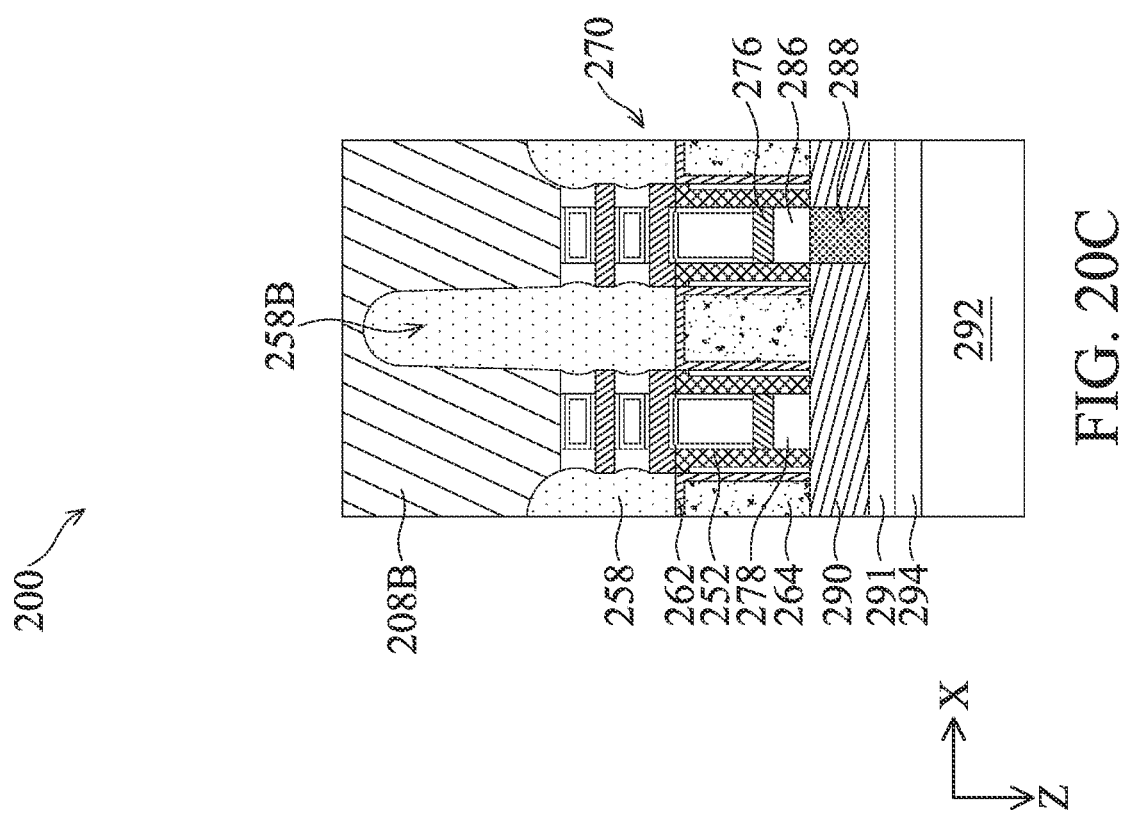

Referring to FIGS. 20A-20C, the method 100 includes a block 140 (FIG. 1B) where the workpiece 200 is thinned down from the backside of the workpiece 200 until the overlaying semiconductor layer 208B and the isolation feature 216 are exposed from the backside of the workpiece 200. An example thinning process may include removing the substrate 202 in a first stage and removing the bottom sacrificial layer 206B in a second stage. In some embodiments, the first stage of the thinning process includes a mechanical grinding process to fully remove the substrate 202, while the bottom sacrificial layer 206B functions as a mechanical grinding stop layer. In some embodiments, the first stage of the thinning process includes a mechanical grinding process and a chemical thinning process. A substantial amount of the substrate 202 may be removed during a mechanical grinding process. Afterwards, a chemical thinning process may apply an etching chemical to the backside of the workpiece to fully remove the substrate 202, while the bottom sacrificial layer 206B may function as an etch stop layer. Similarly, in some embodiments, the second stage of the thinning process includes a mechanical grinding process to fully remove the bottom sacrificial layer 206B, while the overlaying semiconductor layer 208B (and/or the isolation feature 216) functions as a mechanical grinding stop layer. In some embodiments, the second stage of the thinning process includes a mechanical grinding process and a chemical thinning process. A substantial amount of the bottom sacrificial layer 206B may be removed during a mechanical grinding process. Afterwards, a chemical thinning process may apply an etching chemical to the backside of the workpiece to fully remove the bottom sacrificial layer 206B, while the overlaying semiconductor layer 208B and the isolation feature 216 may function as an etch stop layer.

Figures 21A, 21B:
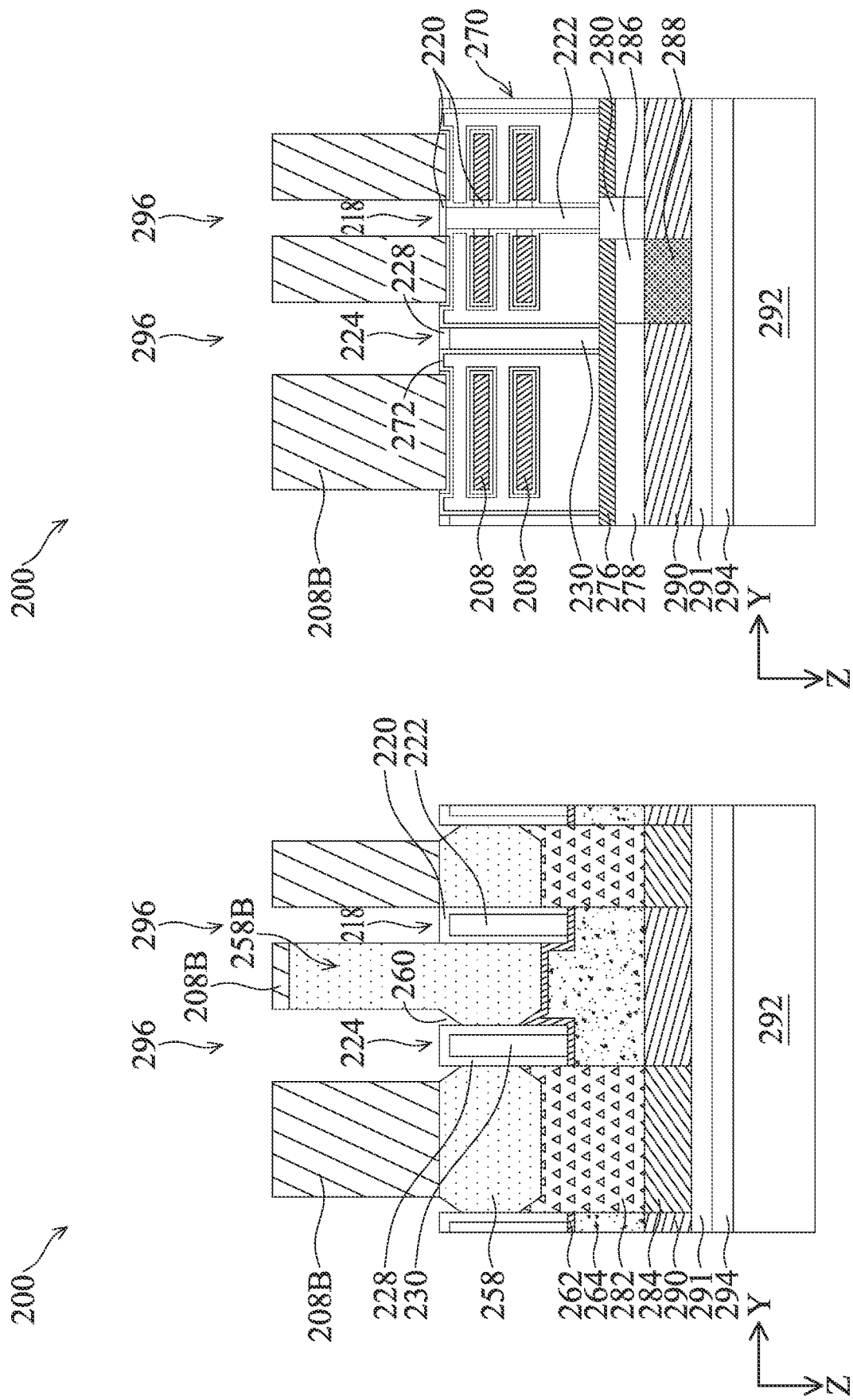
Figure 21C:
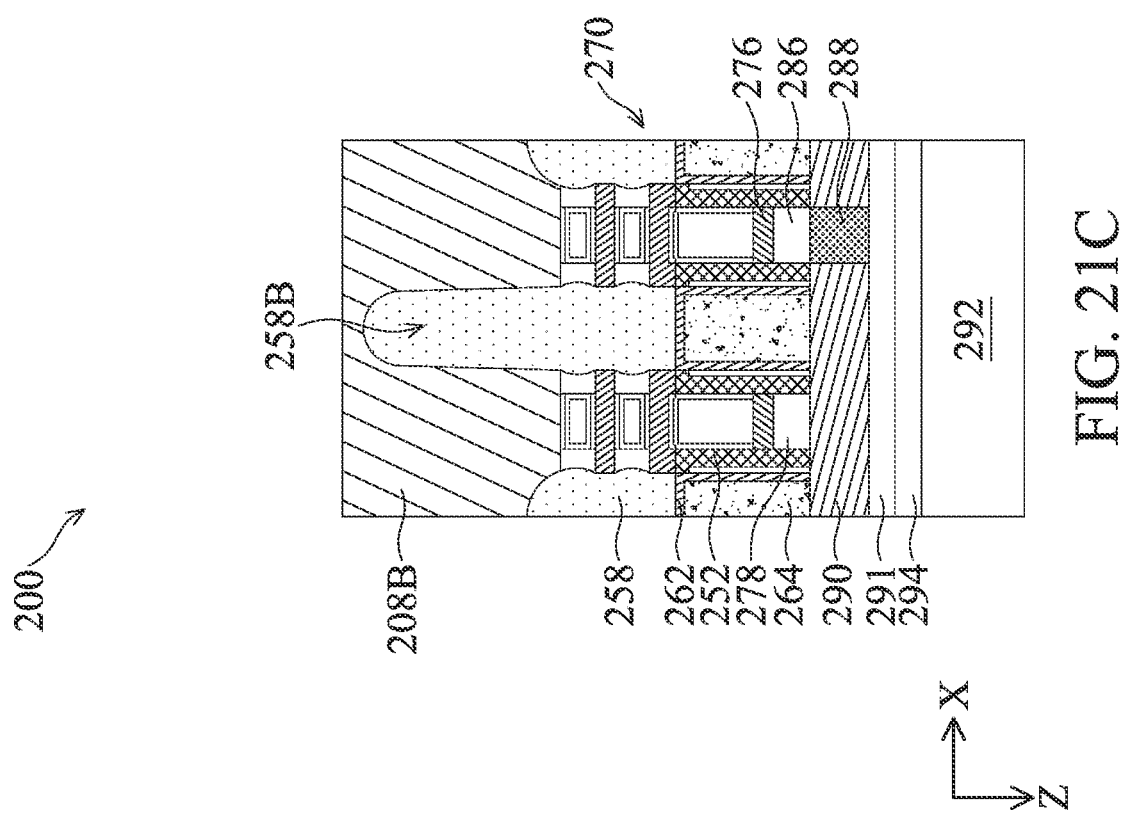

Referring to FIGS. 21A-21C, the method 100 includes a block 142 (FIG. 1B) where the isolation feature 216 is selectively etched to form trenches 296 over the backside of the workpiece 200. The trenches 296 expose the dielectric fins 218 and 224—particularly the first dielectric layer 220 and the third dielectric layer 228—and the facets of the source/drain features 258 that trap the voids 260 in the source/drain regions, and also expose the dielectric fins 218 and 224 and the gate dielectric layer 272 of the gate structures 270 in the channel regions. In some embodiments, operations at the block 142 applies an etching process that is tuned to be selective to the dielectric materials in the isolation feature 216 and with no (or minimal) etching to the overlaying semiconductor layer 208B, the source/drain features 258, the dielectric fins 218 and 224, and the gate dielectric layer 272. The selective etching process can be dry etching, wet etching, reactive ion etching, or other suitable etching methods.

Figure 22B:
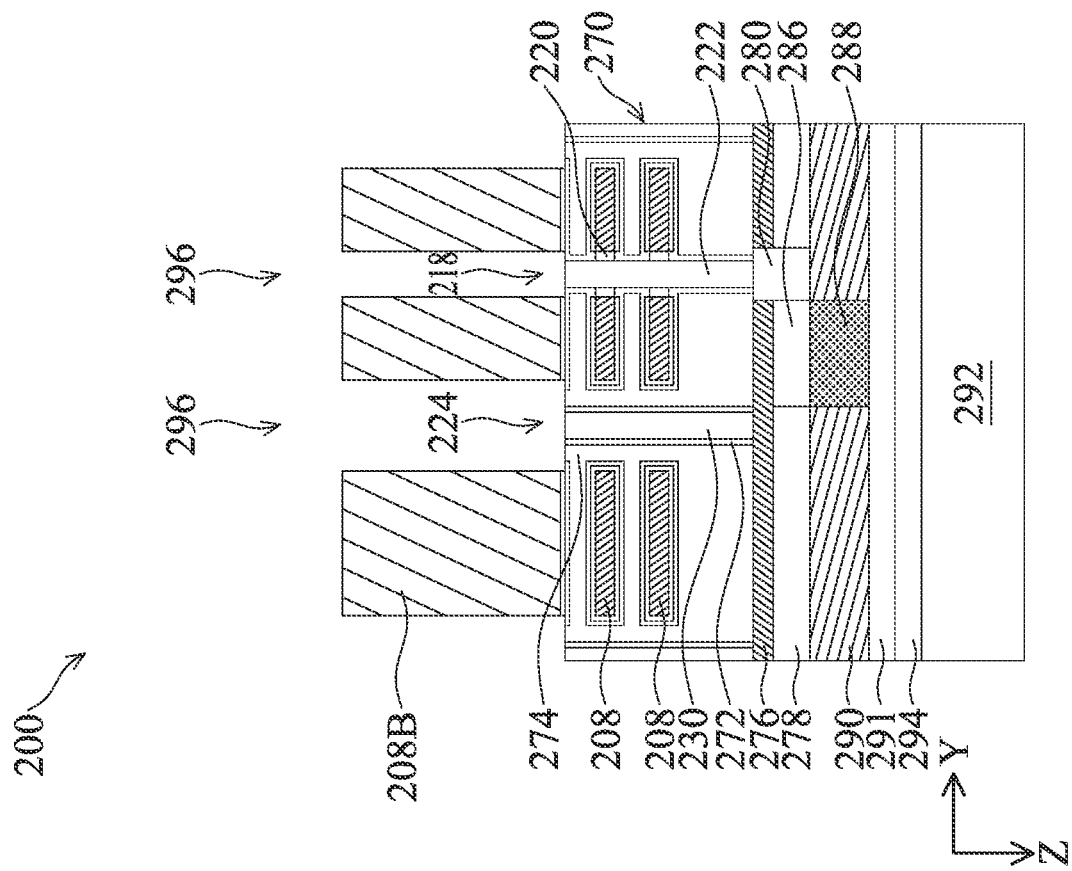
Figure 22A:
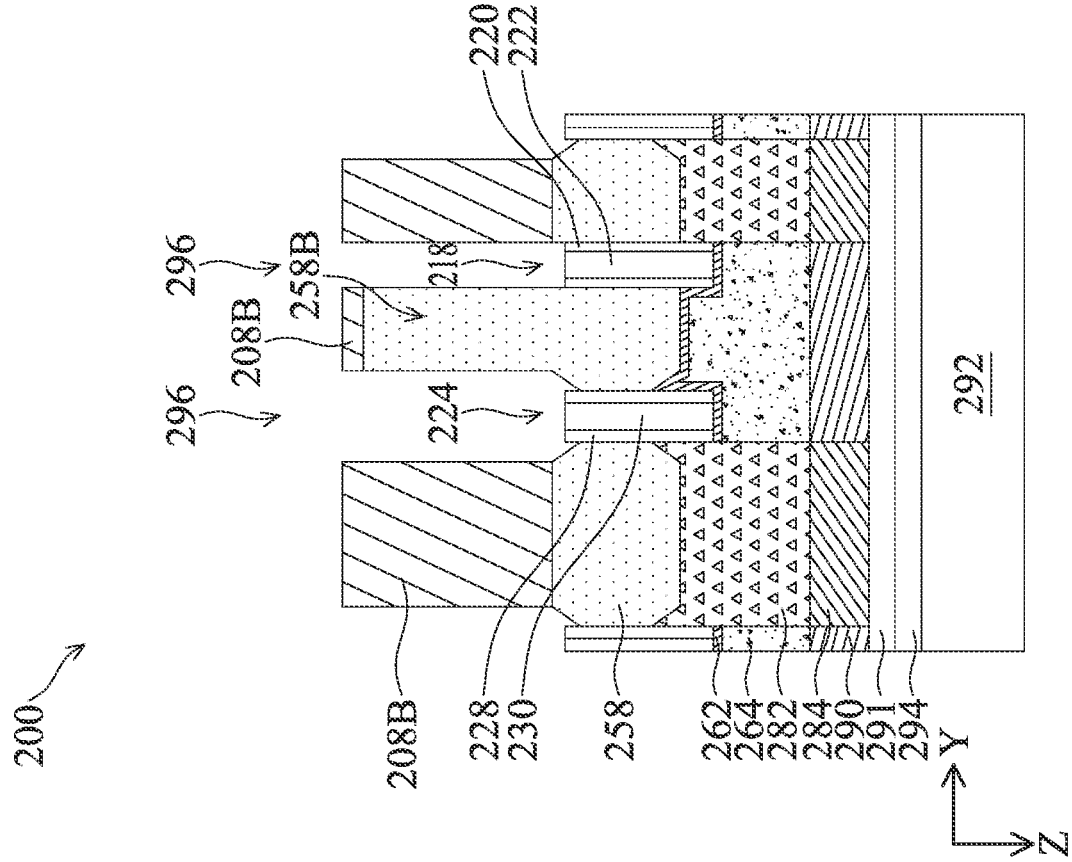
Figure 22C:
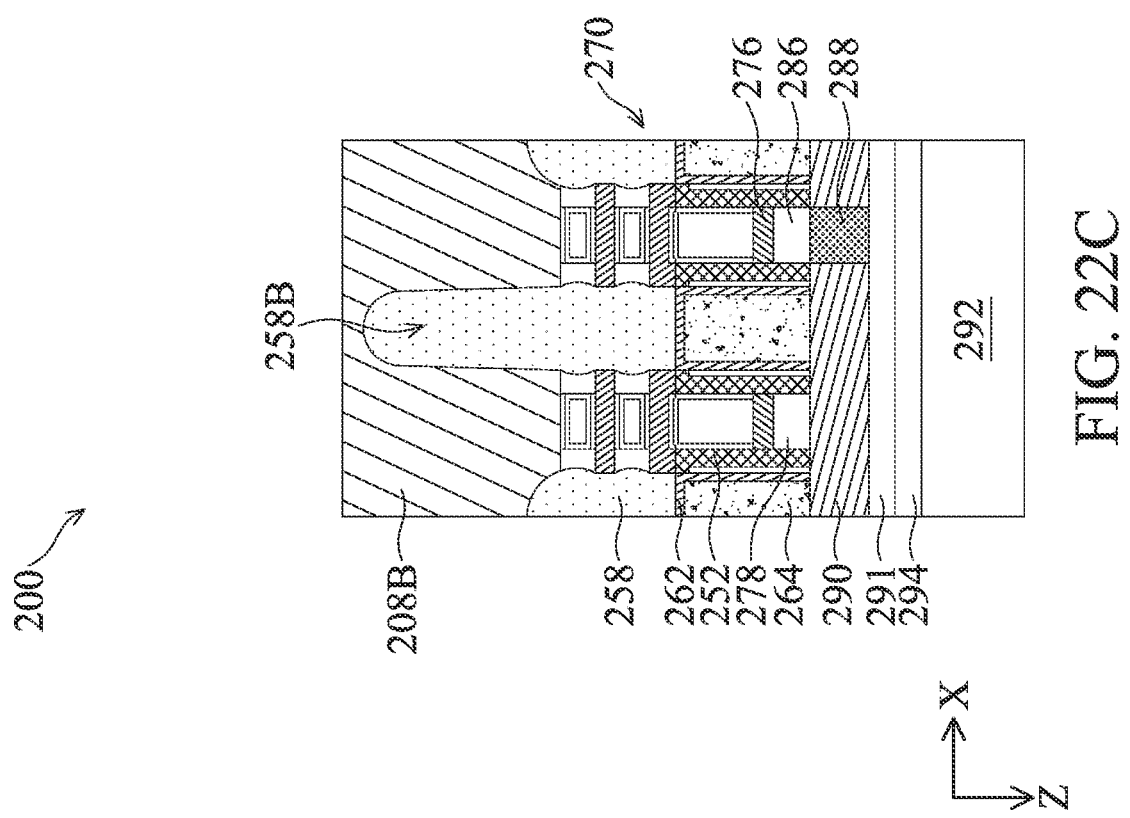

Referring to FIGS. 22A-22C, the method 100 includes a block 144 (FIG. 1B) where exposed portions of the first dielectric layer 220 and the third dielectric layer 228 are selectively etched from the trenches 296. As discussed above, the first dielectric layer 220 and the second dielectric layer 222, as well as the third dielectric layer 228 and the fourth dielectric layer 230, include different material compositions (such as high-k dielectric material(s) for dielectric layers 220 and 228, low-k dielectric material(s) for dielectric layers 222 and 230) to achieve etching selectivity. Operations at the block 144 apply an etching process that is tuned to be selective to the materials (e.g., high-k dielectric material(s)) of the first dielectric layer 220 and the third dielectric layer 228 and with no (or minimal) etching to the second dielectric layer 222 and the fourth dielectric layer 230. Further, in the illustrated embodiment, the common or similar compositions (such as high-k dielectric material(s)) allows selective and simultaneous removal of the exposed portions of the gate dielectric layer 272 together with the dielectric layers 220 and 228 from the trenches 296 in the same selective etching process. The selective etching process can be dry etching, wet etching, reactive ion etching, or other suitable etching methods. As shown in FIGS. 22A and 22B, the removal of the dielectric layers 220 and 228 from the trenches 296 exposes the second dielectric layer 222, the fourth dielectric layer 230, and the gate electrode layer 274.

Figure 23B:
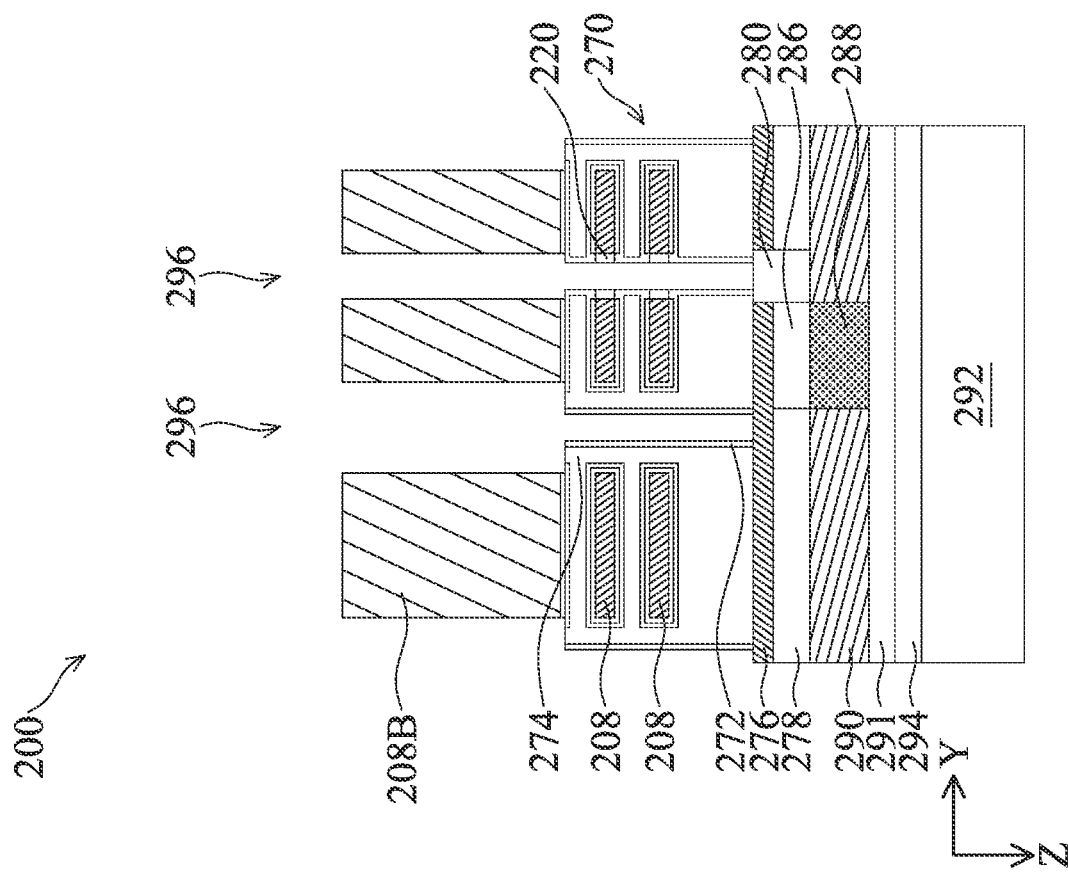
Figure 23A:
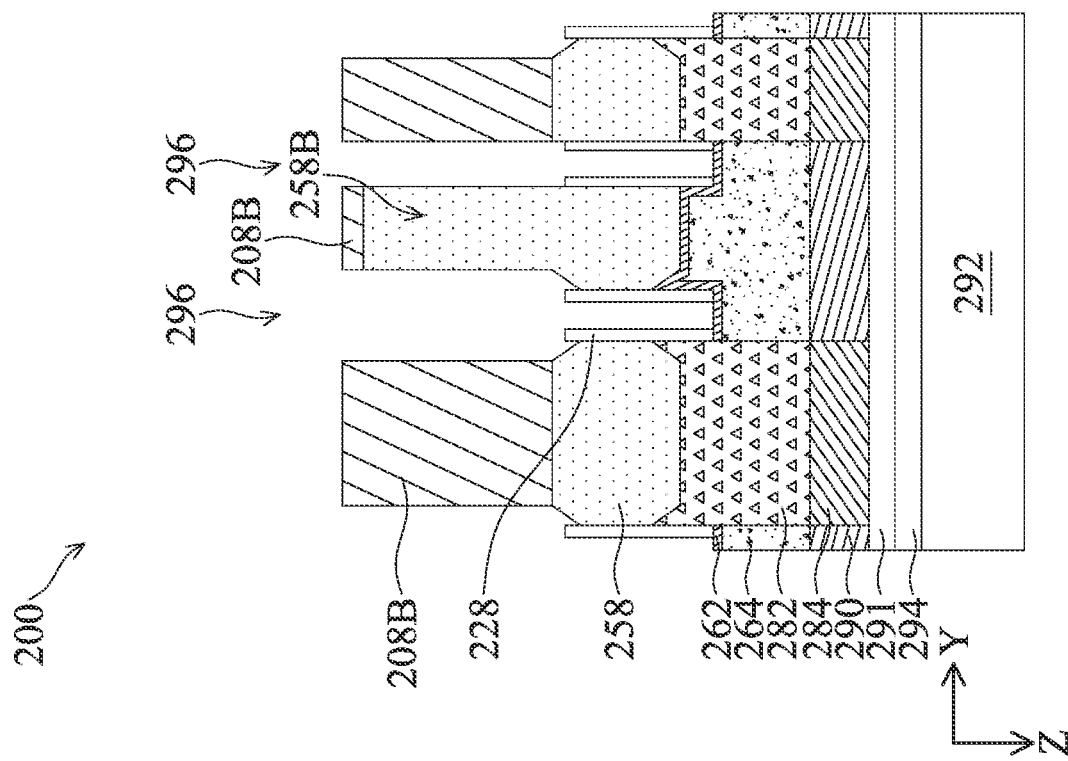
Figure 23C:
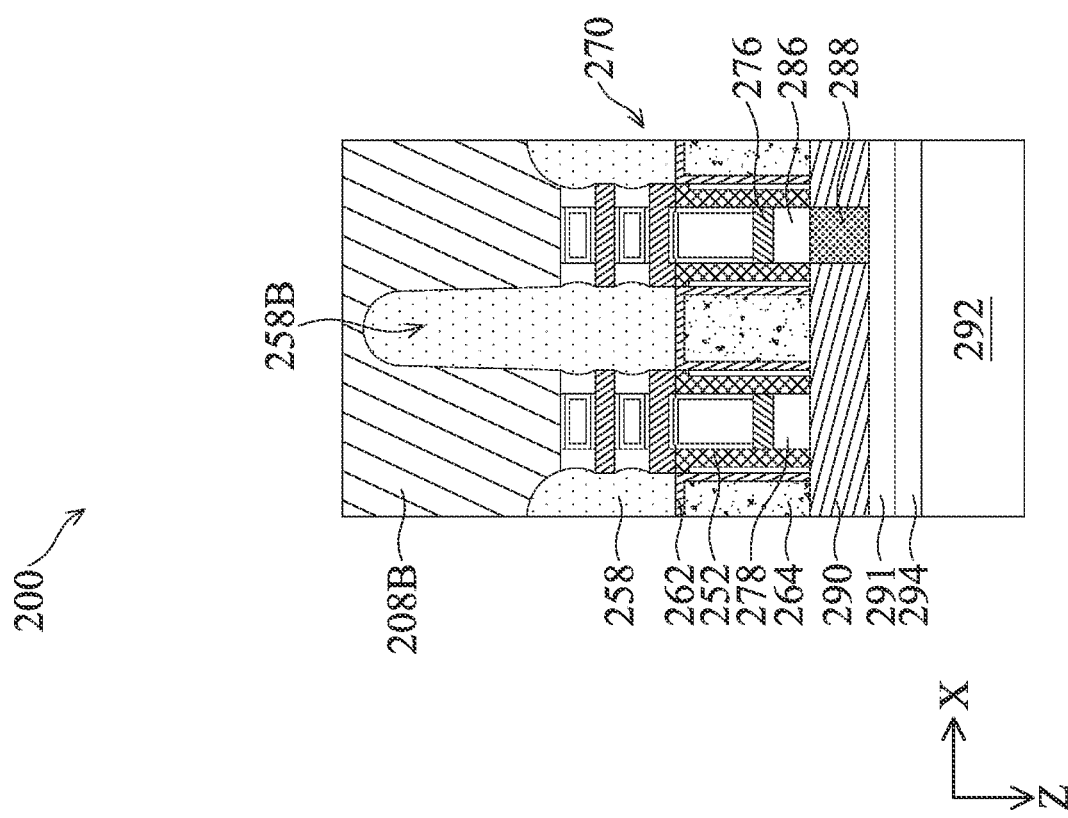

Referring to FIGS. 23A-23C, the method 100 includes a block 146 (FIG. 1B) where the trenches 296 are extended by selectively etching the second dielectric layer 222 and the fourth dielectric layer 230 from the trenches 296. The removal of the dielectric layers 222 and 230 from the trenches 296 exposes the third dielectric layer 228 and the CESL 262 in the source/drain regions and exposes the gate dielectric layer 272, the metal cap layer 276, and the gate cut feature 280 in the channel regions. Operations at the block 146 apply an etching process that is tuned to be selective to the materials (e.g., low-k dielectric material(s)) of the second dielectric layer 222 and the fourth dielectric layer 230 and with no (or minimal) etching to the third dielectric layer 228 and the gate dielectric layer 272. The selective etching process can be dry etching, wet etching, reactive ion etching, or other suitable etching methods. Yet in some alternative embodiments, the third dielectric layer 228 and the gate dielectric layer 272 may also be removed at the block 146 in an extra stage of selective etching process so as to further enlarge volume of the trenches 296.

Referring to FIGS. 24A-24C, the method 100 includes a block 148 (FIG. 1B) where a seal layer 298 is deposited over the backside of the workpiece 200 and caps air gaps 300 in the trenches 296. The deposition of the seal layer 298 is also referred to as a capping process. In some embodiments, the depositing material of the seal layer 298 includes SiN, SiOCN, SiOC, SiCN, combinations thereof, or other suitable material(s). The seal layer 298 may be deposited by CVD, PVD, PE-CVD, coating process, or other suitable deposition techniques. In an embodiment, the seal layer 298 is deposited by a PE-CVD process, which is easier to have depositing dielectric materials merge on top of a narrow opening. The parameters in the PE-CVD process (e.g., pressure, temperature, and gas viscosity) are tuned in a way such that the gap fill behavior of depositing dielectric materials maintains the air gaps 300 without entirely filling the trenches 296. In the present embodiment, the PE-CVD process employs a setting with pressure less than about 0.75 torr and temperature higher than about 75° C. Hence, the dielectric material of the seal layer 298 may enclose the openings of the trenches 296 without a significant amount being deposited in a lower portion of the trenches 296 and keep the air gaps 300. The air gaps 300 may extend continuously from a channel region to abutting source/drain regions, providing isolation between adjacent gate structures 270 and also between adjacent source/drain features 258. A gas, such as a gas(es) used during the deposition of the dielectric material of the seal layer 298 or any other species that can diffuse into the air gaps 300, may be in the air gaps 300. Operations at the block 148 may include performing a planarization process, such as a CMP process, to the seal layer 298 to remove excessive dielectric materials from the backside of the workpiece 200 and expose the overlaying semiconductor layer 208B. The air-gap-containing seal layer 298 collectively with the remaining portions of the first dielectric layer 220 (abutting lateral ends of some of the channel members 208) define an isolation structure stacked laterally between the adjacent gate structures 270 to provide isolation. The isolation structure may also be referred to as gate isolation structure or hybrid fins.

Figure 25B:
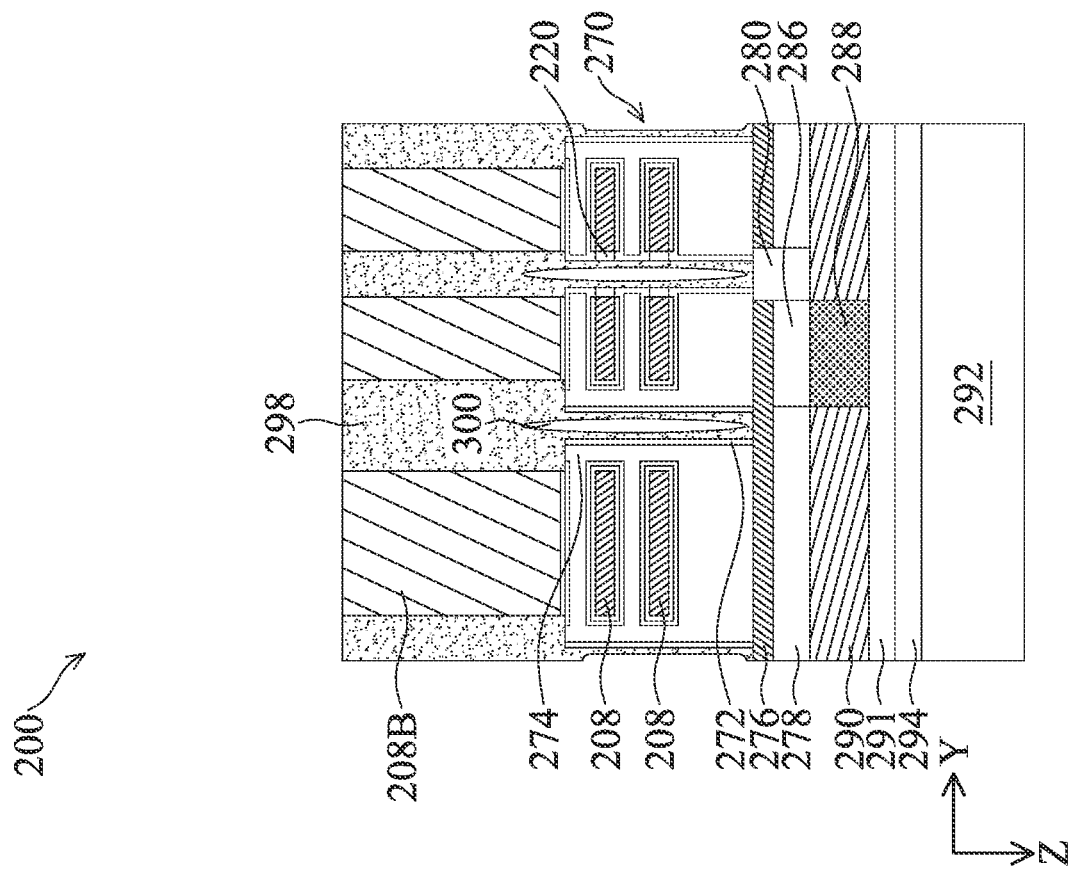
Figure 25A:
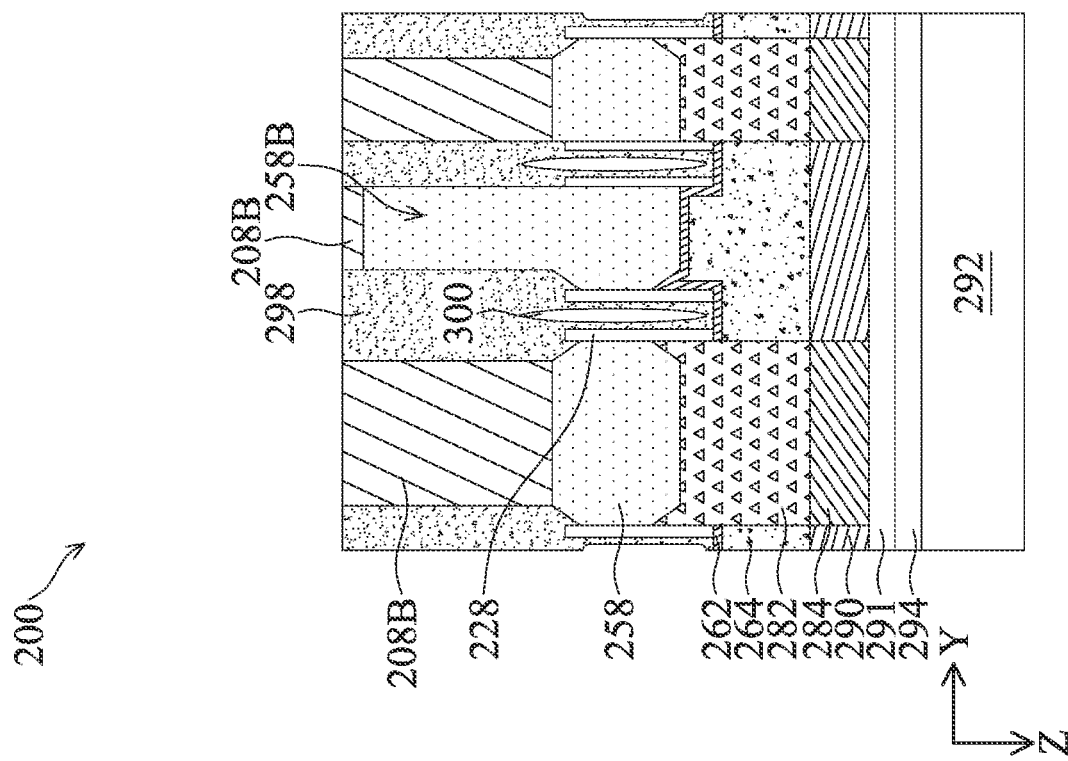
Figure 25C:
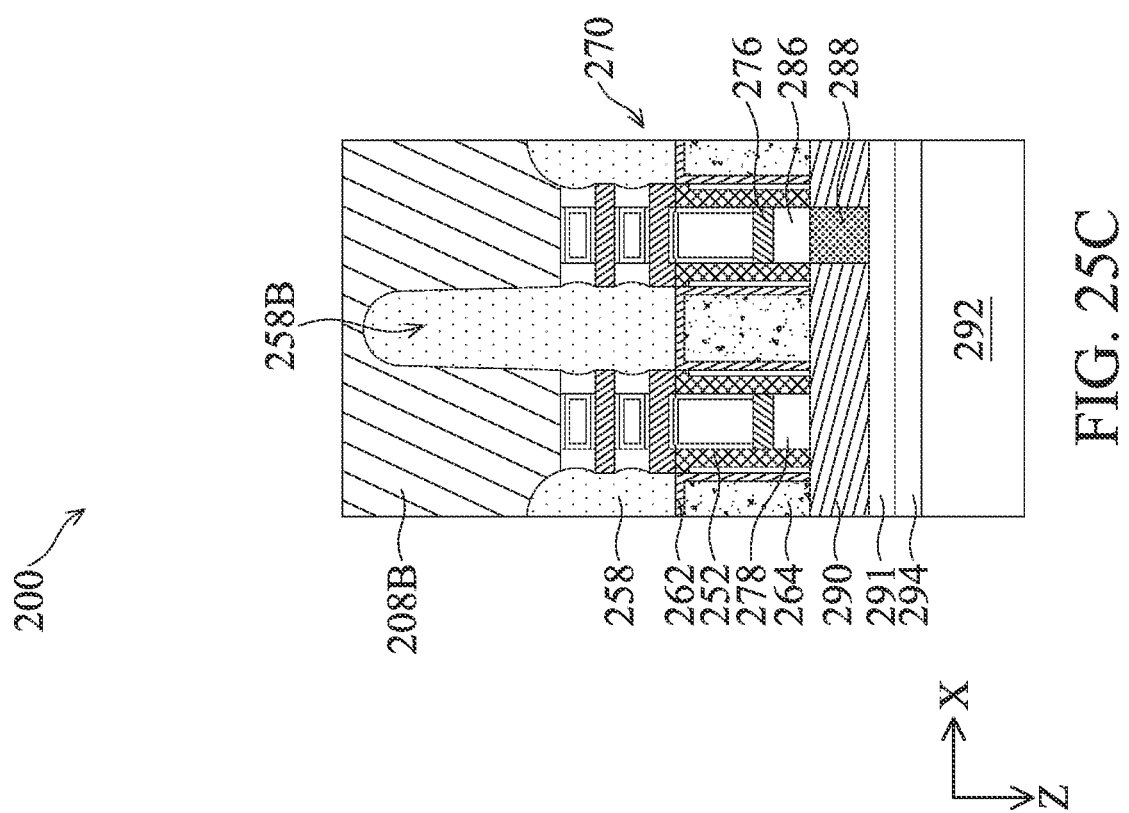
Figure 26B:
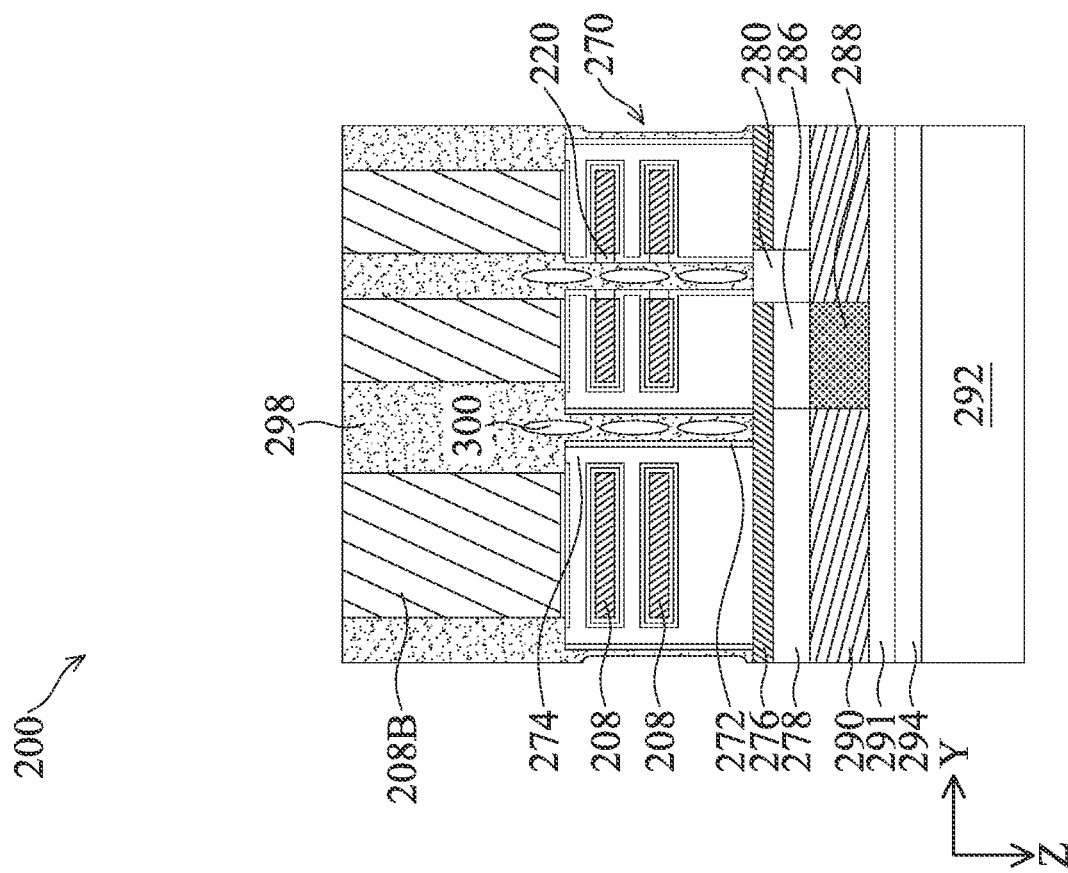
Figure 26A:
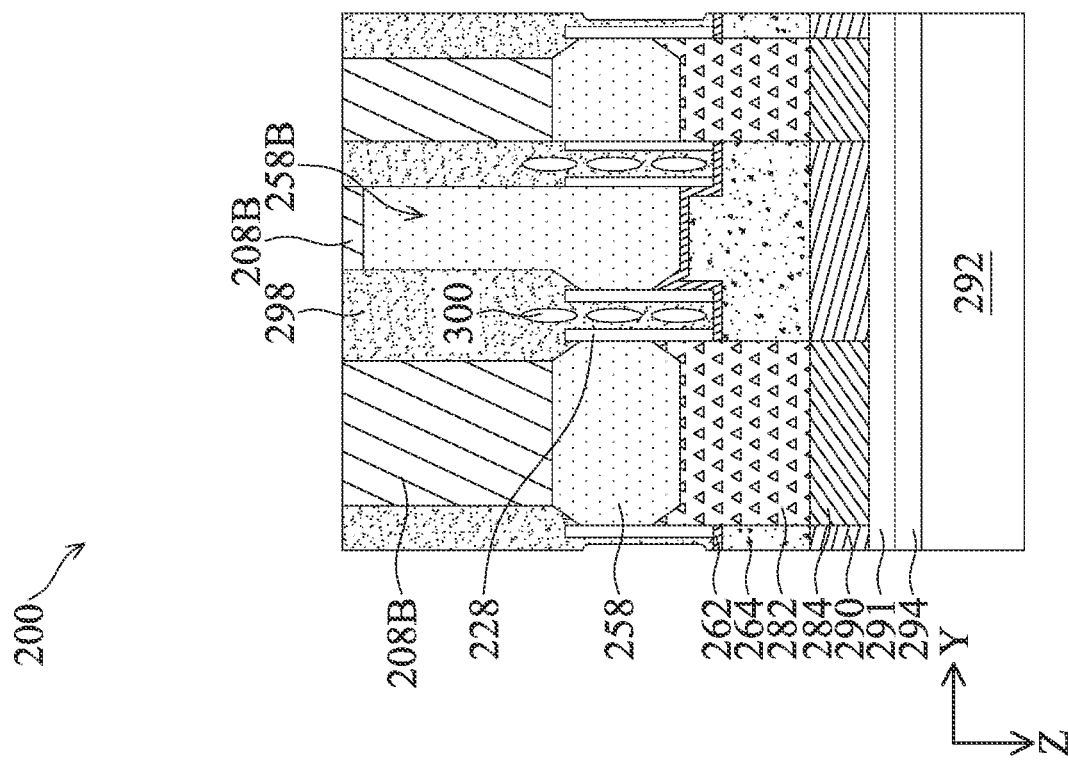

In one embodiment as shown in FIGS. 24A-24C, the air gaps 300 stay below the bottom surface (defined as the surface proximal to the backside of the workpiece 200) of the gate structures 270. In another embodiment as shown in FIGS. 25A-25C, the air gaps 300 may extend beyond the bottom surface of the gate structures 270. Extending the air gaps 300 beyond the bottom surface of the gate structures 270 helps improving the isolation between gate structures 270. In yet another embodiment as shown in FIGS. 26A-26C, instead of an elongated continuous air gap in one trench 296, the capping process at the block 148 may create a series of smaller air gaps 300 vertically stacked in one trench 296. The bottommost smaller air gap 300 may extend beyond the bottom surface of the gate structures 270. In yet another embodiment as shown in FIGS. 27A-27C, as discussed above in association with the block 146, the third dielectric layer 228 and the gate dielectric layer 272 may be removed from the trenches 296 prior to the deposition of the seal layer 298. By removing the third dielectric layer 228 and the gate dielectric layer 272, the seal layer 298 is deposited on the sidewalls of the source/drain features 258 in the source/drain regions and on the sidewalls of the gate electrode layer 274 in the channel regions. One benefit of removing the third dielectric layer 228 and the gate dielectric layer 272 is that the trenches 296 can be expanded along the Y direction, allowing formation of air gaps with larger volume which in turn further improves isolation and reduces parasitic capacitance.

Figure 28B:
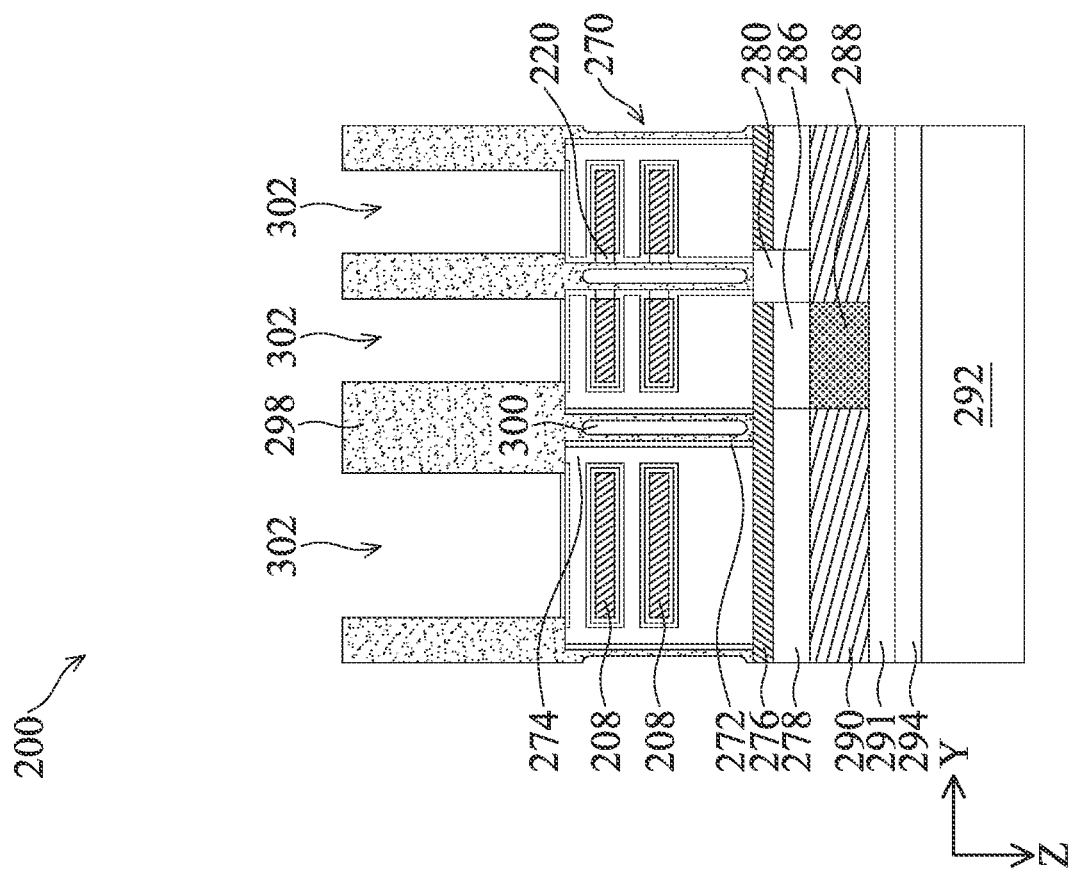
Figure 28A:
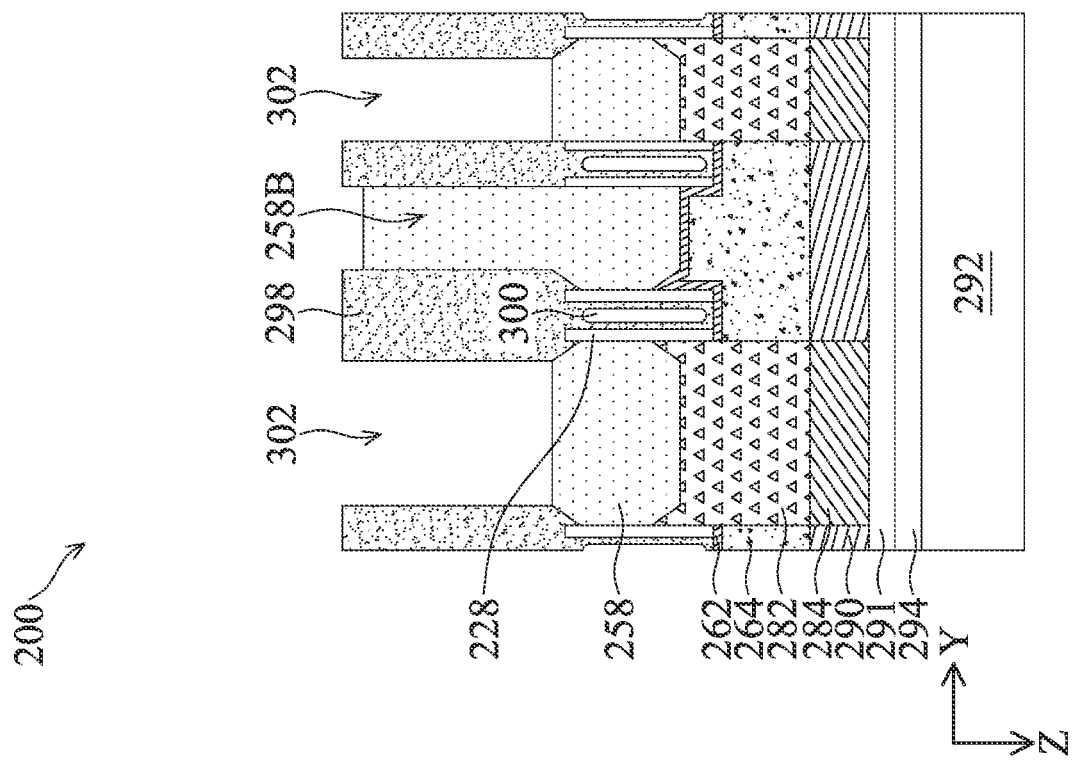
Figure 28C:
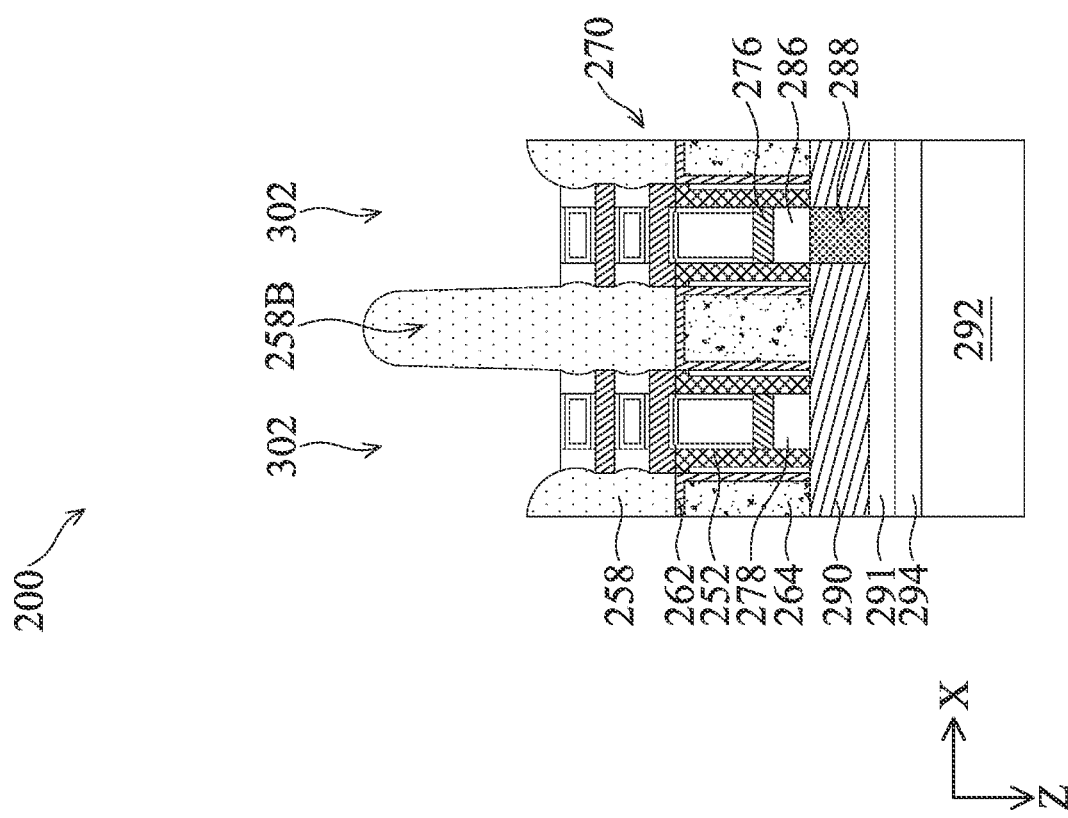

Referring to FIGS. 28A-28C, the method 100 includes a block 150 (FIG. 1B) where the overlaying semiconductor layer 208B is selectively etched to form trenches 302 over the backside of the gate structures 270 and the source/drain features 258. The trenches 302 expose surfaces of the source/drain features 258 from the backside of the workpiece 200. In one example process, operations at the block 150 applies an etching process that is tuned to be selective to the semiconductor material (e.g. silicon) in the overlaying semiconductor layer 208B and with no (or minimal) etching to the gate structures 270 and the source/drain features 258. The etching process can be dry etching, wet etching, reactive ion etching, or other etching methods.

Figure 29B:
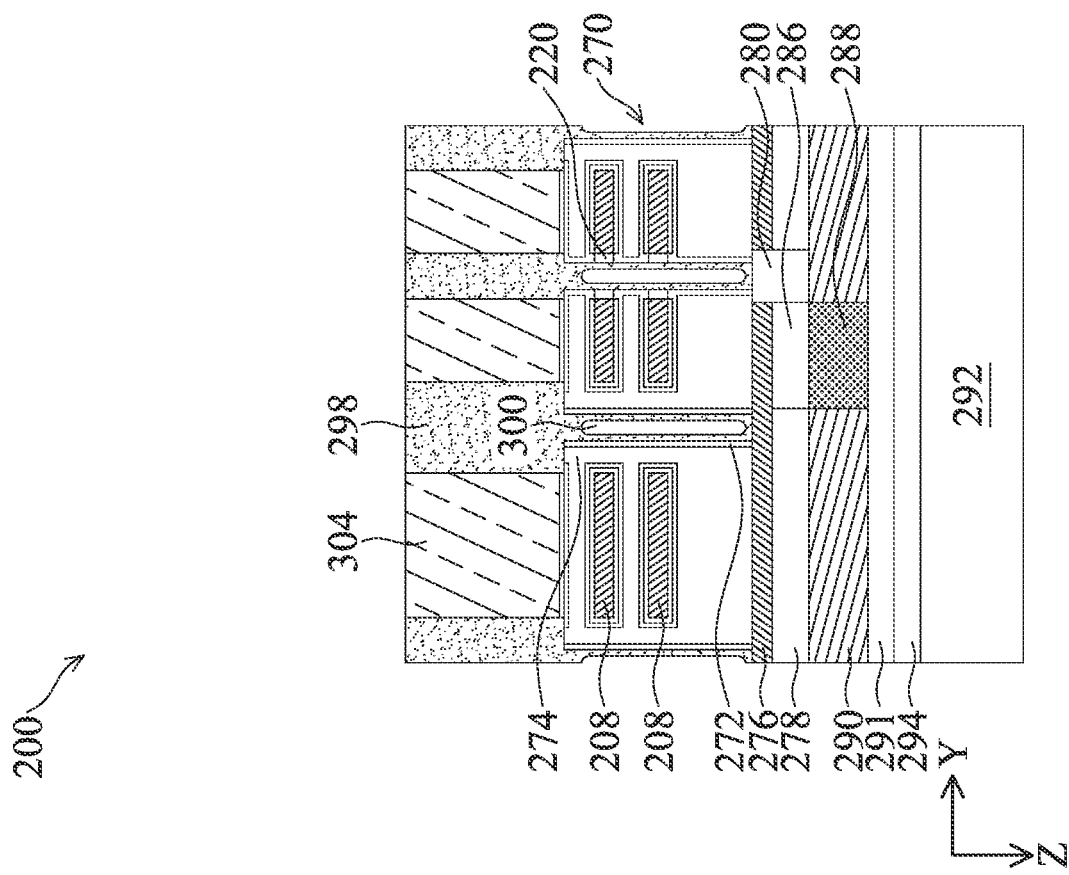
Figure 29A:
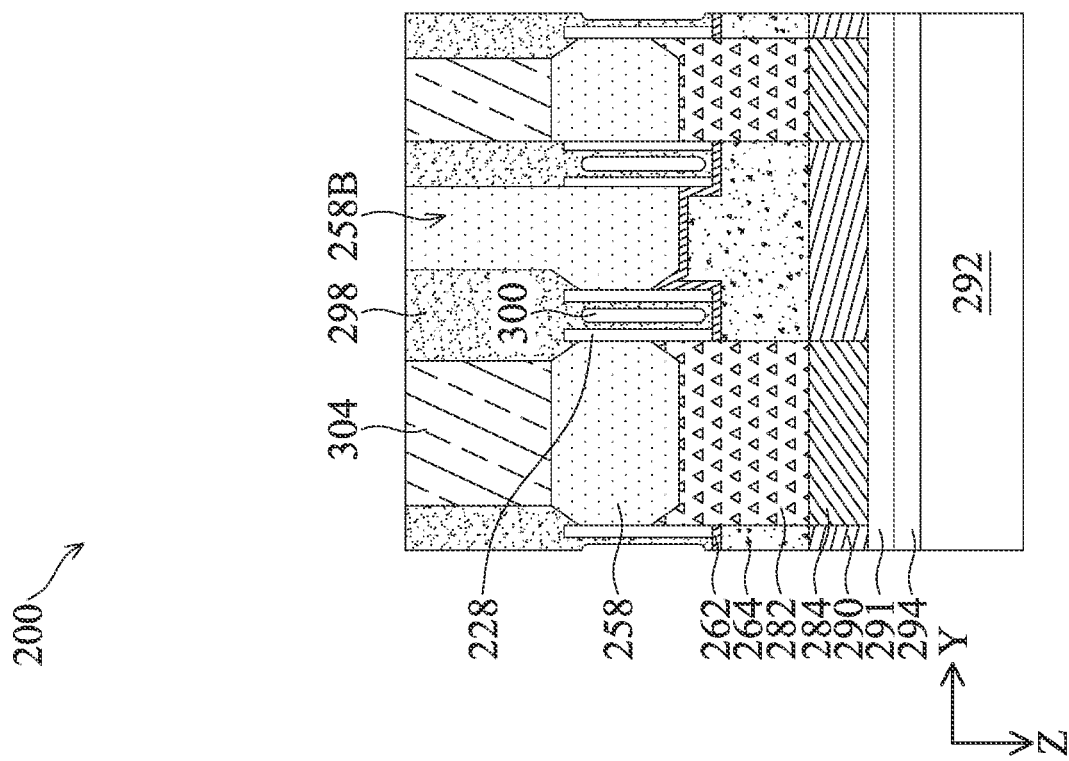
Figure 29C:
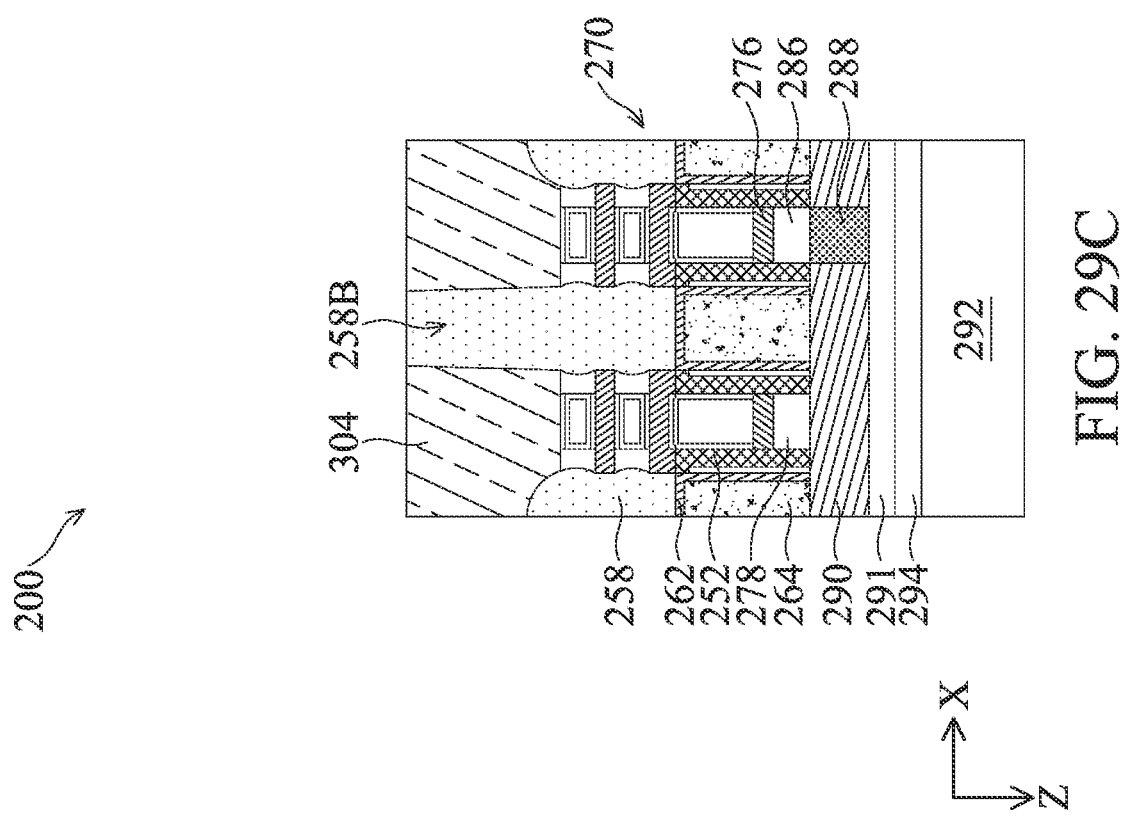

Referring to FIGS. 29A-29C, the method 100 includes a block 152 (FIG. 1B) where a dielectric layer 304 with one or more dielectric materials fill the trenches 302. In some embodiments, the dielectric layer 304 may include one or more of $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s), and may be formed by PE-CVD, F-CVD or other suitable methods. Operations at the block 152 also includes performing a planarization process, such as a CMP process, to the dielectric layer 304 to remove excessive dielectric materials from the backside of the workpiece 200 and expose the extended bottom portion 258B of the source feature 258.

Figure 30B:
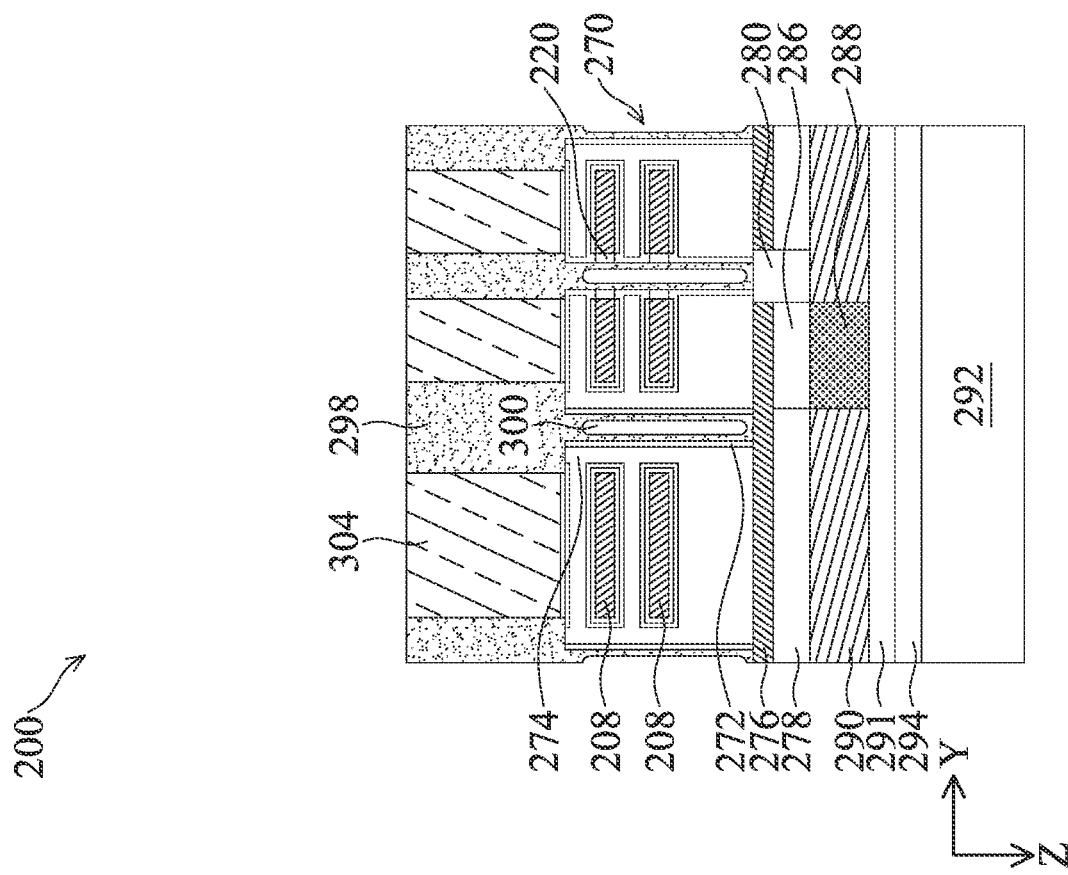
Figure 30A:
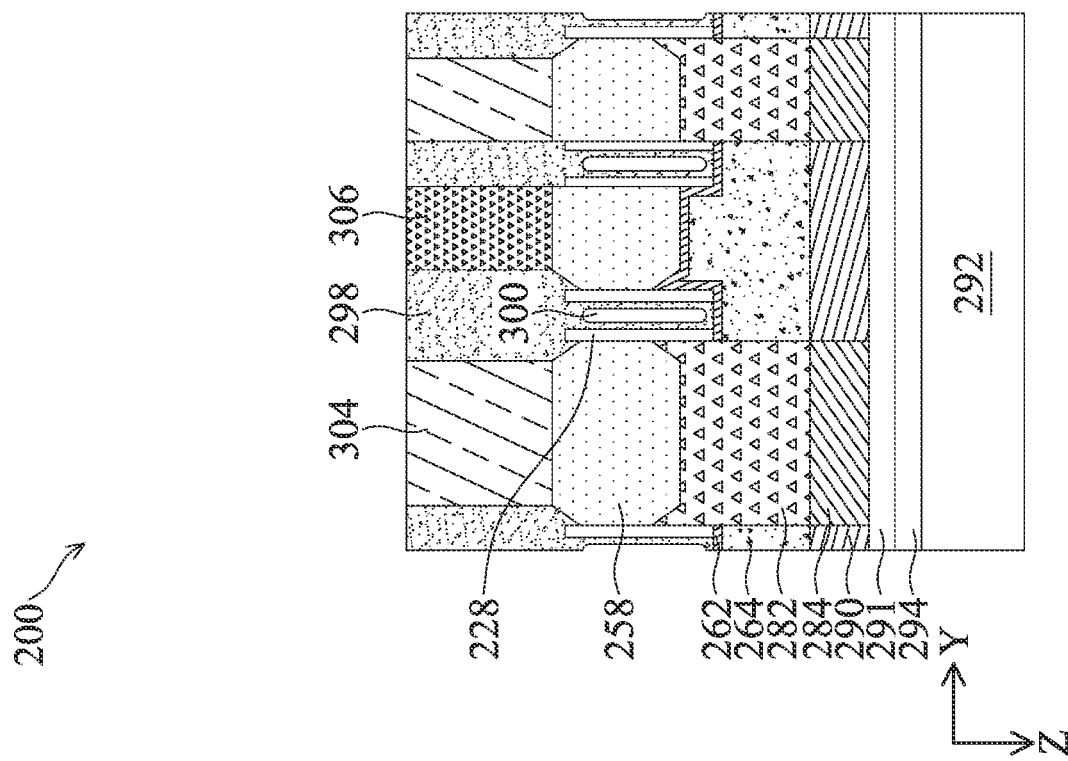
Figure 30C:
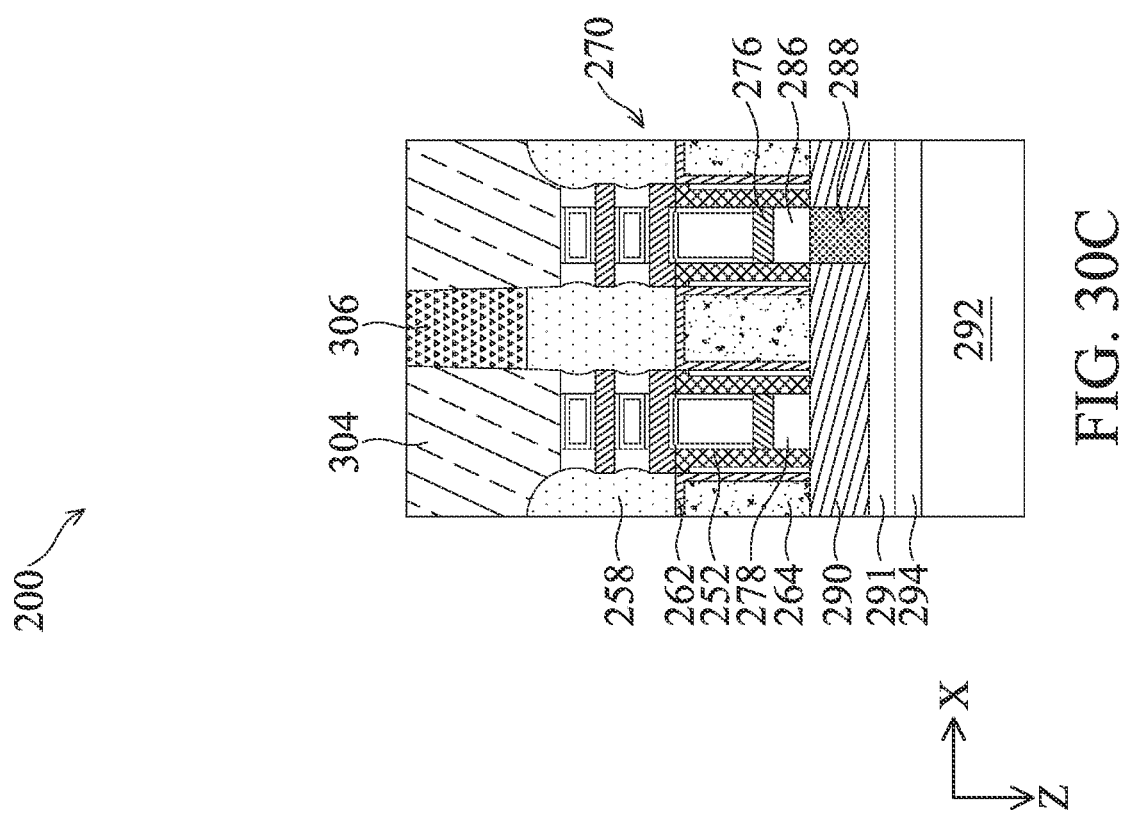

Referring to FIGS. 30A-30C, the method 100 includes a block 154 (FIG. 1B) where a backside self-aligned source/drain contact 306 is formed by replacing the extended bottom portion 258B of the source feature 258 with conductive compositions. An example process to form the backside self-aligned source/drain contact 306 includes recessing the extended bottom portion 258B in a selective etching process that is tuned to the epitaxial semiconductor material of the extended bottom portion 258B with no (or minimal) etching to the seal layer 298 and the dielectric layer 304, thereby forming a source/drain contact hole. The selective etching process can be dry etching, wet etching, reactive ion etching, or other suitable etching methods. The selective etching process may also recess the source feature 258 that is exposed in the source/drain contact hole to a level that is even with or below other source/drain features 258 covered by the dielectric layer 304 so as to make room for subsequent silicide formation. In an embodiment, operations at the block 154 forms a silicide feature (not shown) between the source feature 258 and the backside self-aligned source/drain contact 306 to further reduce contact resistance. In one example, one or more metals are deposited into the source/ drain contact hole followed by an annealing process to the workpiece 200 to cause reaction between the one or more metals and the source feature 258 to produce the silicide feature. The one or more metals may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD, PVD, ALD, or other suitable methods. The silicide feature may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), a combination thereof, or other suitable compounds. Alternatively, the silicide formation may be skipped and the backside self-aligned source/drain contact 306 directly contacts the source feature 258. The backside self-aligned source/drain contact 306 may include tungsten (W), cobalt (Co), molybdenum (Mo), ruthenium (Ru), copper (Cu), nickel (Ni), titanium (Ti), tantalum (Ta), titanium nitride (TiN), tantalum nitride (TaN), or other metals, and may be formed by CVD, PVD, ALD, plating, or other suitable processes. The backside self-aligned source/drain contact 306 is surrounded by the seal layer 298.

Figure 31B:
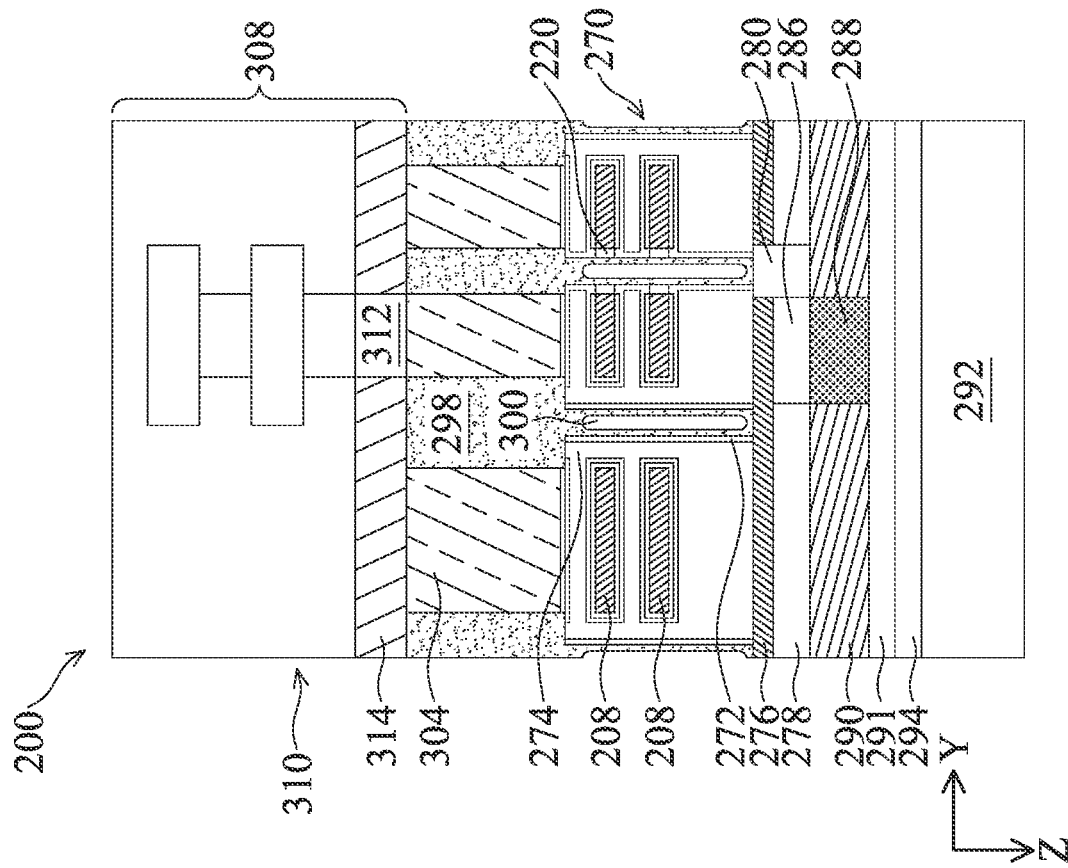
Figure 31A:
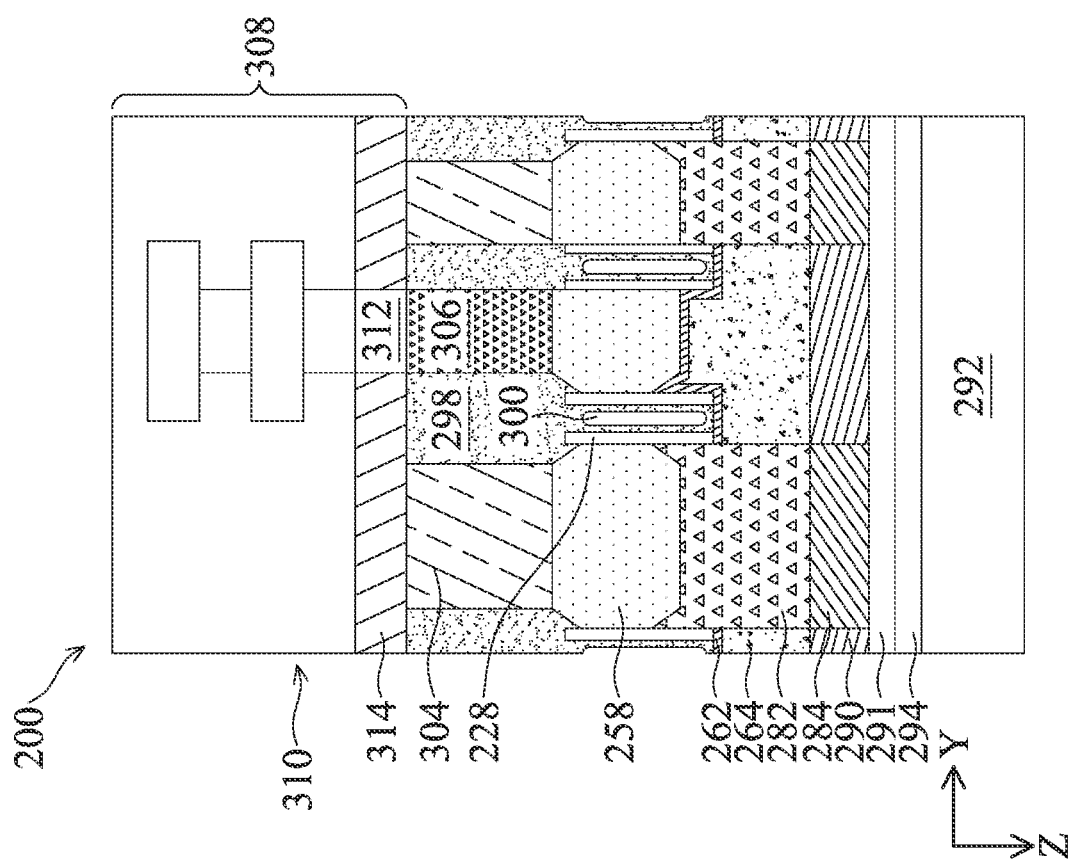
Figure 31C:
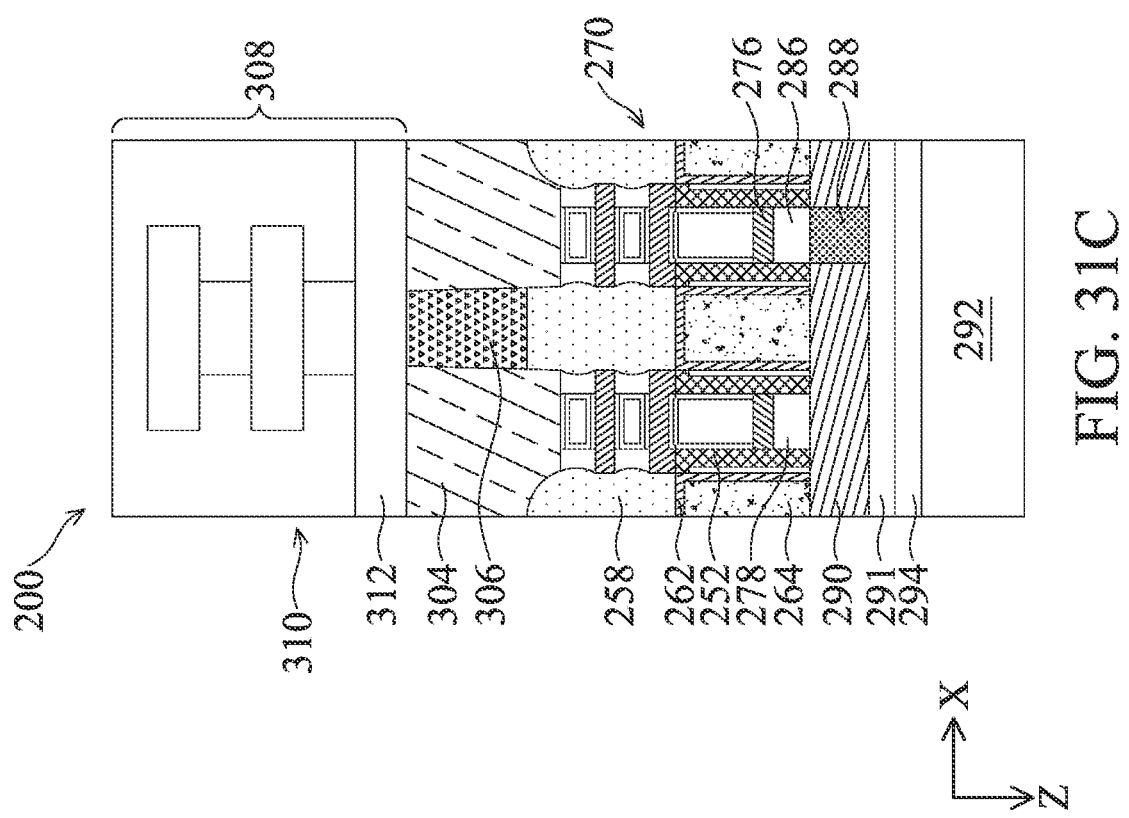

Referring to FIGS. 31A-31B, the method 100 includes a block 156 (FIG. 1B) where one or more backside middle-end-of-line (MEOL) and back-end-of-line (BEOL) processes are performed to form one or more interconnect layers with contacts, vias, and metal lines (also known as metal wiring layers) embedded in dielectric layers. In some embodiments, operations at the block 156 include forming one or more backside interconnect layers 308 with backside power rails 310 embedded in dielectric layers on the backside of the workpiece 200. The backside power rails 310 may include contacts, vias, metal lines, and/or other conductive features. In the illustrated embodiment, upper portions of the backside power rails 310 electrically connect to the backside self-aligned source/drain contact 306 through a backside metal line 312 that is part of a backside first level metal (MO) track 314. In an embodiment, the backside power rails 310 may be formed using a damascene process, a dual-damascene process, a metal patterning process, or other suitable processes. The backside power rails may include tungsten (W), cobalt (Co), molybdenum (Mo), ruthenium (Ru), copper (Cu), nickel (Ni), titanium (Ti), tantalum (Ta), titanium nitride (TiN), tantalum nitride (TaN), or other metals, and may be deposited by CVD, PVD, ALD, plating, or other suitable processes. Having backside power rails beneficially increases the number of metal tracks available in the workpiece 200 for directly connecting to source/drain contacts and vias, including the backside self-aligned source/drain contact 306. The backside power rails may have wider dimension than the frontside first level metal (MO) tracks on the frontside of the workpiece 200, which beneficially reduces the backside power rail resistance. To be noticed, although the resultant structure as shown in FIG. 31C does not show other drain contacts (or contact plugs) to electrically connect to the two drain features 258 on the two sides of the source feature 258, such conductive features may be formed on the frontside of the workpiece 200 in various other embodiments, such as the metal contact plugs 316 and the source/drain contact vias 318 shown in FIGS. 32A-32C, which provide electrical coupling to other source/drain features that are not biased by the backside power rails. As discussed above in association with the block 136, the metal contact plugs 316 and the source/drain contact vias 318 may be formed in one or more frontside MEOL or BEOL processes.

At block 158, the method 100 (FIG. 1B) performs further fabrication processes to the workpiece 200. For example, it may form more interconnect layers on the backside of the workpiece 200, form passivation layers on the backside of the workpiece 200, perform other BEOL processes, and remove the carrier 292.

Figure 32B:
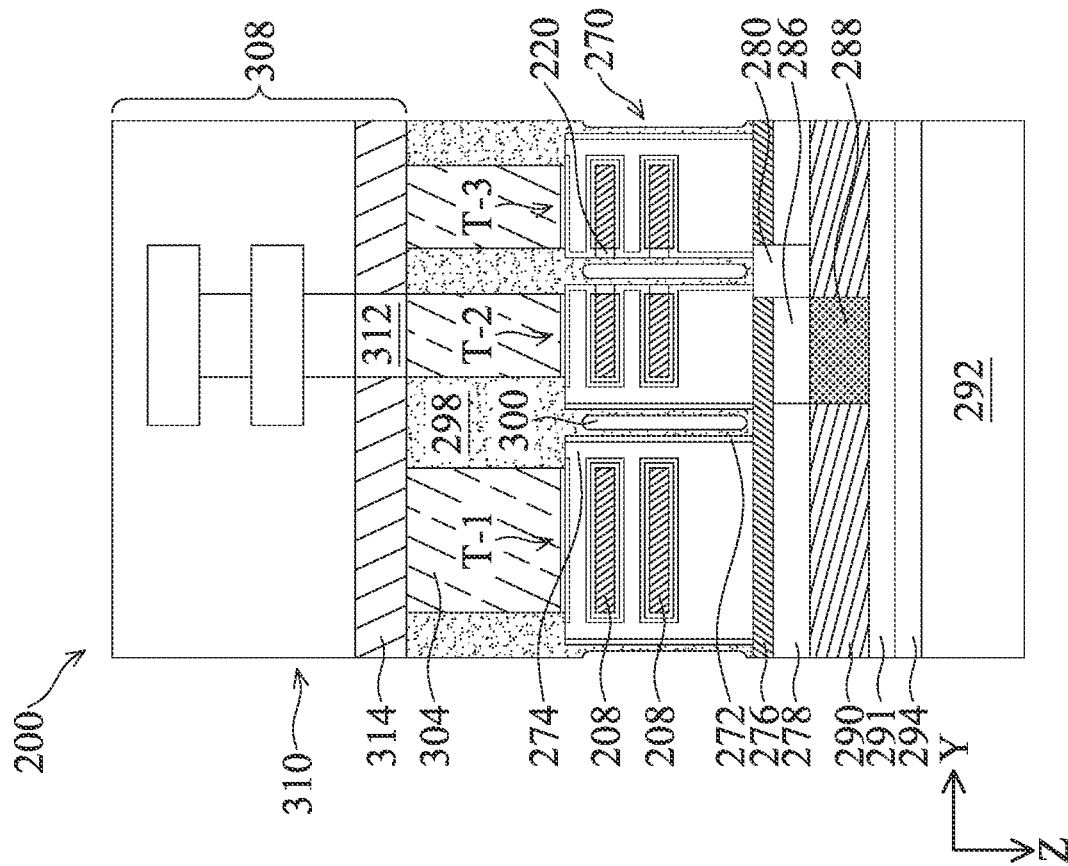
Figure 32A:
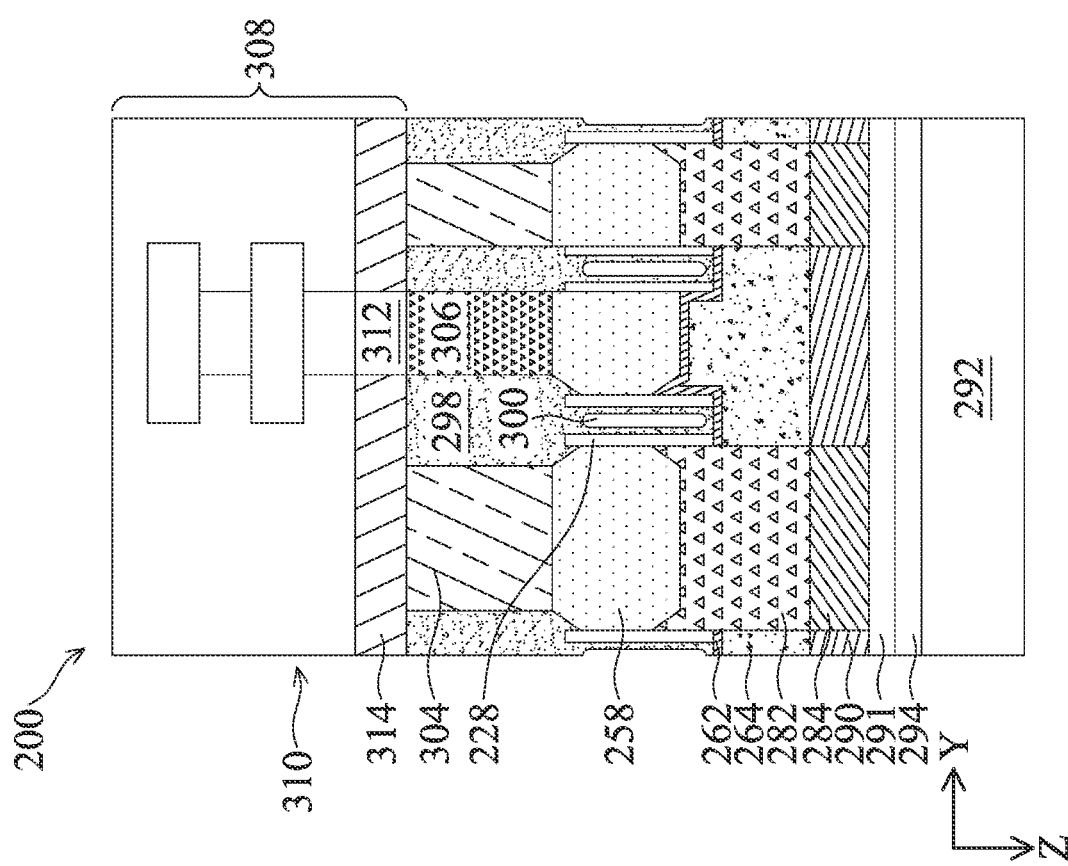
Figure 32C:
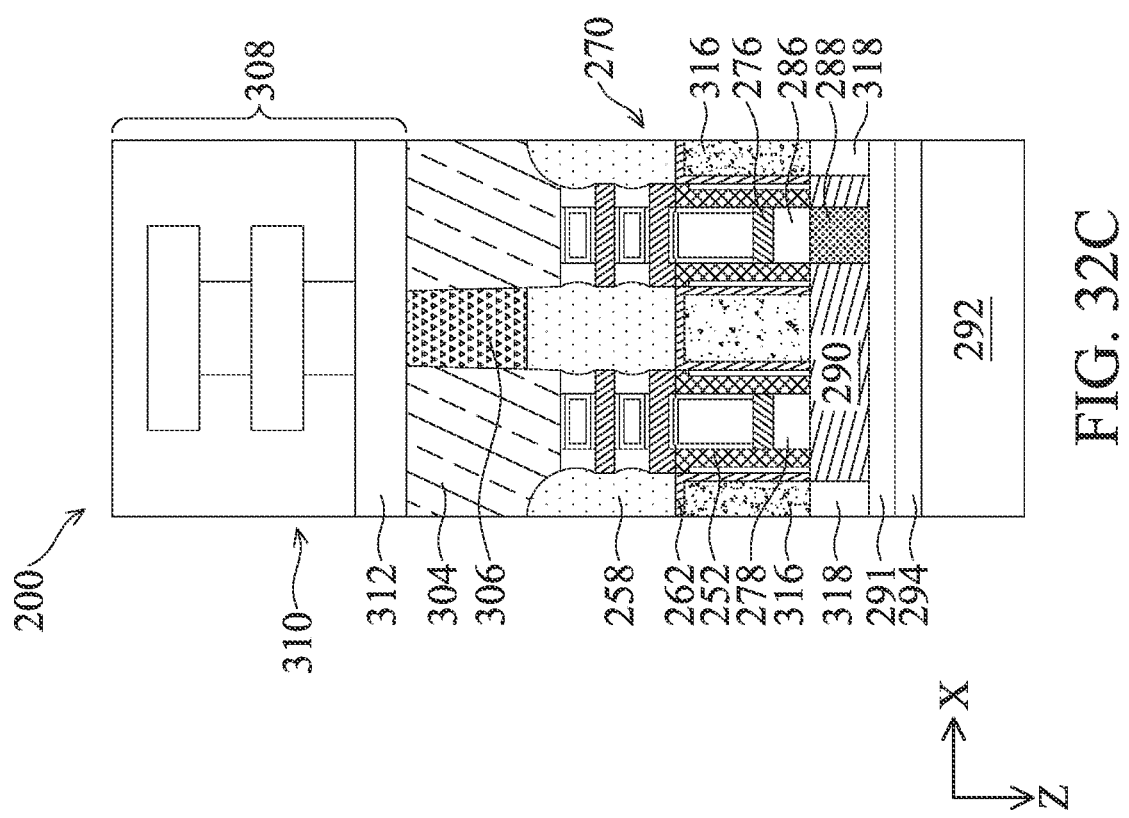

Reference is made to FIG. 32B. Upon conclusion of the method 100, in the illustrated cross-sectional view of Y-Z plane, three MBC transistors T-1, T-2, and T-3 separated by the air gaps 300 are formed. Each MBC transistor includes a gate structure 270 engaging one or more channel members 208. In the MBC transistor T-1, the gate structure 270 wraps around all four sides of each channel member 208. The MBC transistor T-1 may be referred to as a nanosheet transistor. As a comparison, since the channel members 208 in the MBC transistors T-2 and T-3 are in contact with and stem from sidewalls of a hybrid fin comprising the air-gap-containing seal layer 298, the gate structures 270 engage those channel members 208 from three other sides. The MBC transistors T-2 and T-3 may be referred to as fork-sheet transistors or fish-bone transistors. Alternatively, these MBC transistors may be referred to as MBC transistors with fish-bone/fork-sheet structures. Regardless of the fish-bone or fork-sheet structures, close proximity between the channel members leads to close proximity between the gate structures engaging these channel members, while leads to high parasitic capacitance between gate structures even with low-k dielectric material for isolation structures. By implementing air-gap-containing hybrid fins as isolation structures between adjacent gate structures, the overall effective dielectric constant of the isolation structures is further reduced, which in turn leads to less parasitic capacitance and better isolation. Further, in embodiments of the present disclosure, air gaps extend continuously from the channel regions into the abutting source/drain regions, providing isolation to the neighboring source/drain features as well.

In one exemplary aspect, the present disclosure is directed to a method. The method includes providing a workpiece including a frontside and a backside, the workpiece including a substrate, an isolation feature over the substrate, a first fin-shaped structure protruding from the substrate and through the isolation feature, and a second fin-shaped structure protruding from the substrate and through the isolation feature. The substrate is at the backside of the workpiece and the first and second fin-shaped structures are at the frontside of the workpiece. The method also includes forming a dielectric fin between the first and second fin-shaped structures, forming first and second gate structures over the first and second fin-shaped structures, respectively, etching the isolation feature from the backside of the workpiece to from a trench exposing the dielectric fin, etching the dielectric fin from the backside of the workpiece, thereby forming an extended trench, and depositing a seal layer over the extended trench, wherein the seal layer caps an air gap between the first and second gate structures. In some embodiments, the dielectric fin abuts the first and second fin-shaped structures. In some embodiments, the trench also exposes a portion of the first and second gate structures. In some embodiments, the extended trench exposes gate dielectric layers of the first and second gate structures. In some embodiments, the method further includes etching the gate dielectric layers to enlarge a volume of the extended trench. In some embodiments, the workpiece also includes a first source/drain feature abutting the first fin-shaped structure and a second source/drain feature abutting the second fin-shaped structure, and wherein the air gap extends continuously to a position sandwiched between the first and second source/drain features. In some embodiments, the forming of the dielectric fin includes depositing a first dielectric layer in a trench between the first and second fin-shaped structures, and depositing a second dielectric layer in the trench and surrounded by the first dielectric layer, wherein the first and second dielectric layers include different material compositions. In some embodiments, the method further includes prior to the forming of the first and second gate structures, partially removing the first dielectric layer. In some embodiments, the method further includes prior to the etching of the isolation feature, thinning the substrate from the backside of the workpiece to expose the isolation feature. In some embodiments, the method further includes forming a source/drain contact at the backside of the workpiece, wherein the source/drain contact is surrounded by the seal layer.

In another exemplary aspect, the present disclosure is directed to a method of forming a semiconductor device. The method includes forming a plurality of channel members over a substrate, the channel members being vertically stacked, forming a dielectric fin abutting lateral ends of the channel members, forming a gate structure engaging each of the channel members, removing the substrate, thereby exposing a bottom surface of the dielectric fin, removing the dielectric fin, thereby forming a trench exposing a sidewall of the gate structure, and depositing a dielectric layer over the trench, the dielectric layer trapping a void in the trench. In some embodiments, the method further includes prior to the forming of the gate structure, partially removing an outer layer of the dielectric fin, a portion of the outer layer stacked between the substrate and an inner layer of the dielectric fin remaining. In some embodiments, the outer layer includes a dielectric material of a higher dielectric constant than that of the inner layer. In some embodiments, the void extends beyond a bottom surface of the gate structure. In some embodiments, the gate structure includes a gate dielectric layer and a gate electrode layer, and the method further includes partially removing the gate dielectric layer from the trench, thereby exposing the gate electrode layer in the trench. In some embodiments, the method further includes forming a source/drain feature abutting the channel members, the source/drain feature including an extended portion surrounded by the dielectric layer, recessing the extended portion of the source/drain feature, thereby forming a source/drain contact hole surrounded by the dielectric layer, and depositing a conductive feature in the source/drain contact hole.

In another exemplary aspect, the present disclosure is directed to a semiconductor device. The semiconductor device includes a first plurality of channel members vertically stacked, a second plurality of channel members vertically stacked, a first gate structure engaging the first plurality of channel members, a second gate structure engaging the second plurality of channel members, a first metal wiring layer at a frontside of the semiconductor device, a second metal wiring layer at a backside of the semiconductor device, the first and second gate structures being stacked vertically between the first and second metal wiring layers, and an isolation structure stacked vertically between the first and second metal wiring layers, wherein the isolation structure includes an air gap stacked laterally between the first and second gate structures. In some embodiments, the semiconductor device further includes a first source/drain feature adjoining the first plurality of channel members, and a second source/drain feature adjoining the second plurality of channel members, the air gap extending continuously to a position stacked laterally between the first and second source/drain features. In some embodiments, the air gap extends beyond bottom surfaces of the first and second gate structures. In some embodiments, the isolation structure includes a first dielectric layer surrounding the air gap and a second dielectric layer abutting lateral ends of the first and second pluralities of channel members.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
providing a workpiece including a frontside and a backside, the workpiece including a substrate, an isolation feature over the substrate, a first fin-shaped structure protruding from the substrate and through the isolation feature, and a second fin-shaped structure protruding from the substrate and through the isolation feature, wherein the substrate is at the backside of the workpiece and the first and second fin-shaped structures are at the frontside of the workpiece;
forming a dielectric fin between the first and second fin-shaped structures;
forming first and second gate structures over the first and second fin-shaped structures, respectively;
etching the isolation feature from the backside of the workpiece to form a trench exposing the dielectric fin;
after the etching of the isolation feature, etching the dielectric fin from the backside of the workpiece, thereby forming an extended trench; and
depositing a seal layer over the extended trench, wherein the seal layer caps an air gap between the first and second gate structures.

2. The method of claim 1, wherein the dielectric fin abuts the first and second fin-shaped structures.

3. The method of claim 1, wherein the trench also exposes a portion of the first and second gate structures.

4. The method of claim 1, wherein the extended trench exposes gate dielectric layers of the first and second gate structures.

5. The method of claim 4, further comprising:
etching the gate dielectric layers to enlarge a volume of the extended trench.

6. The method of claim 1, wherein the workpiece also includes a first source/drain feature abutting the first fin-shaped structure and a second source/drain feature abutting the second fin-shaped structure, and wherein the air gap extends continuously to a position sandwiched between the first and second source/drain features.

7. The method of claim 1, wherein the forming of the dielectric fin includes:
depositing a first dielectric layer in a trench between the first and second fin-shaped structures, and depositing a second dielectric layer in the trench and surrounded by the first dielectric layer, wherein the first and second dielectric layers include different material compositions.

8. The method of claim 7, further comprising:
prior to the forming of the first and second gate structures, partially removing the first dielectric layer.

9. The method of claim 1, further comprising:
prior to the etching of the isolation feature, thinning the substrate from the backside of the workpiece to expose the isolation feature.

10. The method of claim 1, further comprising:
forming a source/drain contact at the backside of the workpiece, wherein the source/drain contact is surrounded by the seal layer.

11. A method of forming a semiconductor device, comprising:
forming a plurality of channel members over a substrate, the channel members being vertically stacked;
forming a dielectric fin abutting lateral ends of the channel members;
forming a gate structure engaging each of the channel members;
removing the substrate, thereby exposing a bottom surface of the dielectric fin;
removing the dielectric fin, thereby forming a trench exposing a sidewall of the gate structure; and
depositing a dielectric layer over the trench, the dielectric layer trapping a void in the trench.

12. The method of claim 11, further comprising:
prior to the forming of the gate structure, partially removing an outer layer of the dielectric fin, wherein a portion of the outer layer stacked between the substrate and an inner layer of the dielectric fin remains.

13. The method of claim 12, wherein the outer layer includes a dielectric material of a higher dielectric constant than that of the inner layer.

14. The method of claim 11, wherein the void extends beyond a bottom surface of the gate structure.

15. The method of claim 11, wherein the gate structure includes a gate dielectric layer and a gate electrode layer, further comprising:
partially removing the gate dielectric layer from the trench, thereby exposing the gate electrode layer in the trench.

16. The method of claim 11, further comprising:
forming a source/drain feature abutting the channel members, wherein the source/drain feature includes an extended portion surrounded by the dielectric layer;
recessing the extended portion of the source/drain feature, thereby forming a source/drain contact hole surrounded by the dielectric layer; and
depositing a conductive feature in the source/drain contact hole.

17. A method, comprising:
providing a workpiece including a frontside and a backside, the workpiece including a substrate, a first fin-shaped structure protruding from the substrate, and a second fin-shaped structure protruding from the substrate, wherein the substrate is at the backside of the workpiece and the first and second fin-shaped structures are at the frontside of the workpiece;
forming a dielectric feature laterally disposed between the first and second fin-shaped structures;
recessing a first region of the first fin-shaped structure to form a first trench;
recessing a second region of the second fin-shaped structure to form a second trench, wherein the first trench is deeper than the second trench;
forming a first epitaxial feature in the first trench and a second epitaxial feature in the second trench;
forming a first gate structure engaging the first fin-shaped structure and a second gate structure engaging the second fin-shaped structure, wherein the dielectric feature is laterally disposed between the first and second gate structures;
etching the dielectric feature from the backside of the workpiece to form a third trench;
depositing a seal layer over the backside of the workpiece to seal the third trench; and
exposing the first epitaxial feature from the backside of the workpiece.

18. The method of claim 17, further comprising:
forming a backside contact physically landing on a bottom surface of the first epitaxial feature.

19. The method of claim 17, wherein the third trench exposes a first sidewall of the first gate structure and a second sidewall of the second gate structure.

20. The method of claim 17, wherein the seal layer seals an air gap in the third trench.

* * * * *